US012660697B2

(12) United States Patent
Wang et al.

(10) Patent No.: US 12,660,697 B2
(45) Date of Patent: Jun. 16, 2026

(54) SEMICONDUCTOR STRUCTURE WITH VERTICAL CONNECTION STRUCTURE AND MANUFACTURING METHOD THEREOF

(71) Applicant: Taiwan Semiconductor Manufacturing Company, Ltd., Hsinchu (TW)

(72) Inventors: Chuei-Tang Wang, Taichung City (TW); Tso-Jung Chang, Taoyuan City (TW); Jeng-Shien Hsieh, Kaohsiung (TW); Shih-Ping Lin, Taichung City (TW); Chih-Peng Lin, Hsinchu County (TW); Chieh-Yen Chen, Taipei City (TW); Chen-Hua Yu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 605 days.

(21) Appl. No.: 18/152,740

(22) Filed: Jan. 10, 2023

(65) Prior Publication Data

US 2024/0079392 A1 Mar. 7, 2024

Related U.S. Application Data

(60) Provisional application No. 63/404,177, filed on Sep. 6, 2022.

(51) Int. Cl.
*H01L 25/10* (2006.01)
*H01L 21/56* (2006.01)
(Continued)

(52) U.S. Cl.
CPC .......... *H01L 25/105* (2013.01); *H01L 21/561* (2013.01); *H01L 21/568* (2013.01);
(Continued)

(58) Field of Classification Search
CPC ..................... H01L 24/20; H01L 24/24; H01L 2224/05018; H01L 2224/05027;
(Continued)

(56) References Cited

U.S. PATENT DOCUMENTS 8,889,484 B2 * 11/2014 Chen ........................ H01L 24/19
438/109
8,993,380 B2 3/2015 Hou et al.
(Continued)

*Primary Examiner* — Mamadou L Diallo
(74) *Attorney, Agent, or Firm* — JCIPRNET

(57) ABSTRACT

A semiconductor structure includes a first tier, a redistribution circuit structure, and a second tier. The first tier includes at least one first die. The redistribution circuit structure is disposed on the first tier and electrically coupled to the at least one first die, where the redistribution circuit structure has a multi-layer structure and includes a vertical connection structure continuously extending from a first side of the redistribution circuit structure to a second side of the redistribution circuit structure, and the first side is opposite to the second side along a stacking direction of the first tier and the redistribution circuit structure. The second tier includes a plurality of second dies, and is disposed on and electrically coupled to the redistribution circuit structure. The redistribution circuit structure is disposed between the first tier and the second tier, where the at least one first die is electrically connected to and electrically communicated with the plurality of second dies through the redistribution circuit structure, and the plurality of second dies are electrically connected to and electrically communicated with each other through the redistribution circuit structure.

20 Claims, 27 Drawing Sheets

10A

(51) Int. Cl.
   *H01L 23/00* (2006.01)
   *H01L 23/538* (2006.01)
   *H01L 25/00* (2006.01)
   *H10B 80/00* (2026.01)

(52) U.S. Cl.
   CPC .......... *H01L 23/5383* (2013.01); *H01L 24/05* (2013.01); *H01L 24/08* (2013.01); *H01L 24/13* (2013.01); *H01L 24/16* (2013.01); *H01L 24/20* (2013.01); *H01L 24/24* (2013.01); *H01L 24/80* (2013.01); *H01L 25/50* (2013.01); *H10B 80/00* (2023.02); *H01L 24/09* (2013.01); *H01L 2224/05018* (2013.01); *H01L 2224/05027* (2013.01); *H01L 2224/05124* (2013.01); *H01L 2224/05147* (2013.01); *H01L 2224/05562* (2013.01); *H01L 2224/05571* (2013.01); *H01L 2224/05624* (2013.01); *H01L 2224/05644* (2013.01); *H01L 2224/05647* (2013.01); *H01L 2224/08235* (2013.01); *H01L 2224/08237* (2013.01); *H01L 2224/09181* (2013.01); *H01L 2224/13111* (2013.01); *H01L 2224/13139* (2013.01); *H01L 2224/13147* (2013.01); *H01L 2224/16227* (2013.01); *H01L 2224/214* (2013.01); *H01L 2224/215* (2013.01); *H01L 2224/24137* (2013.01); *H01L 2224/244* (2013.01); *H01L 2224/245* (2013.01); *H01L 2224/80357* (2013.01); *H01L 2224/80895* (2013.01); *H01L 2224/80896* (2013.01); *H01L 2225/1023* (2013.01); *H01L 2225/107* (2013.01); *H01L 2924/01013* (2013.01); *H01L 2924/01028* (2013.01); *H01L 2924/01029* (2013.01); *H01L 2924/01047* (2013.01); *H01L 2924/01074* (2013.01); *H01L 2924/01079* (2013.01); *H01L 2924/014* (2013.01)

(58) Field of Classification Search
   CPC . H01L 2224/05562; H01L 2224/05571; H01L 2224/08235; H01L 2224/08237; H01L 2224/09181; H01L 2224/214; H01L 2224/244; H01L 2224/80357; H01L 2225/06541; H01L 25/105; H01L 23/5383; H01L 24/05; H01L 24/08; H01L 24/13; H01L 24/16; H01L 24/80; H01L 25/50; H01L 24/09; H10B 80/00
   See application file for complete search history.

(56) References Cited

U.S. PATENT DOCUMENTS

| | | | | |
|---|---|---|---|---|
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,299,649 | B2 | 3/2016 | Chiu et al. | |
| 9,368,460 | B2 | 6/2016 | Yu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 * | 11/2016 | Yu | H01L 22/20 |
| 9,666,502 | B2 | 5/2017 | Chen et al. | |
| 9,735,131 | B2 * | 8/2017 | Su | H01L 25/50 |
| 10,283,474 | B2 * | 5/2019 | Jeng | H01L 21/56 |
| 2021/0098381 | A1 * | 4/2021 | Yu | H01L 21/4857 |
| 2022/0302003 | A1 * | 9/2022 | Pan | H01L 23/5385 |
| 2022/0302081 | A1 * | 9/2022 | Hsu | H01L 24/14 |
| 2024/0395673 | A1 * | 11/2024 | Hoffman | H01L 25/0657 |

* cited by examiner

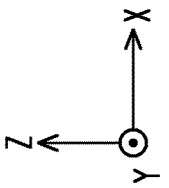
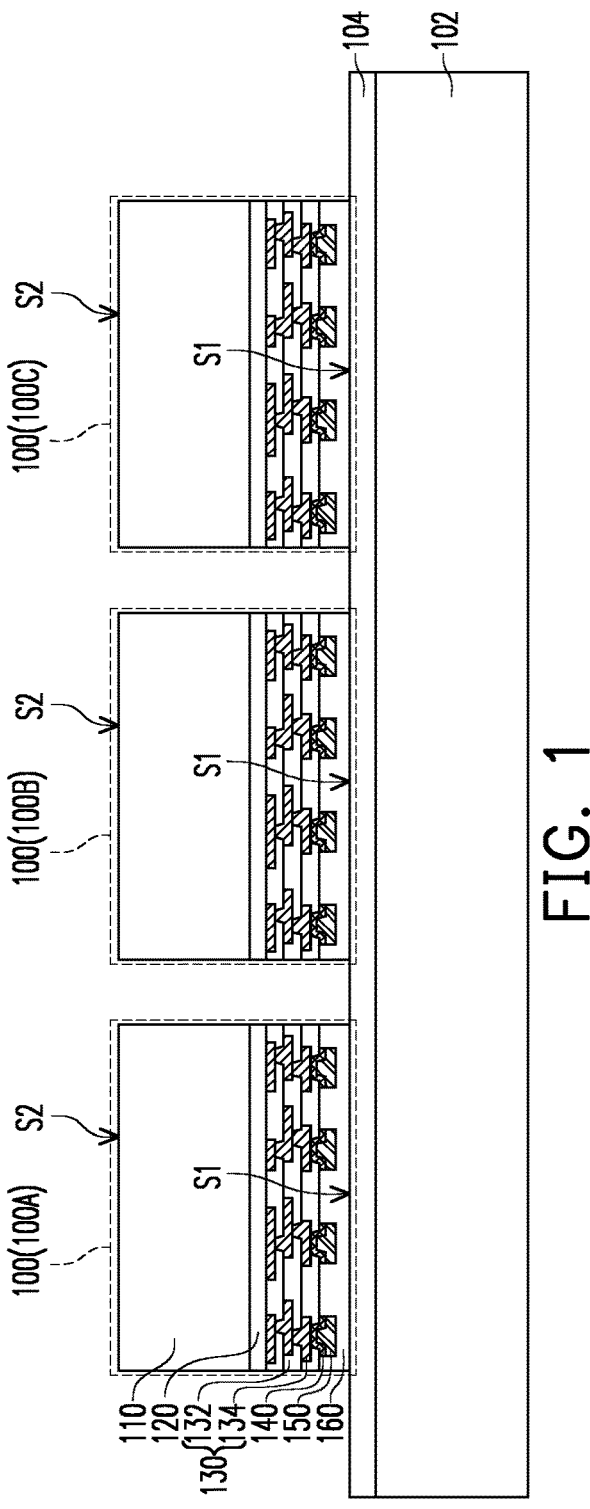
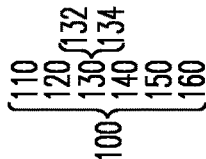
FIG. 1

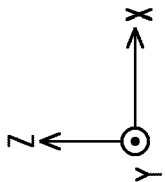
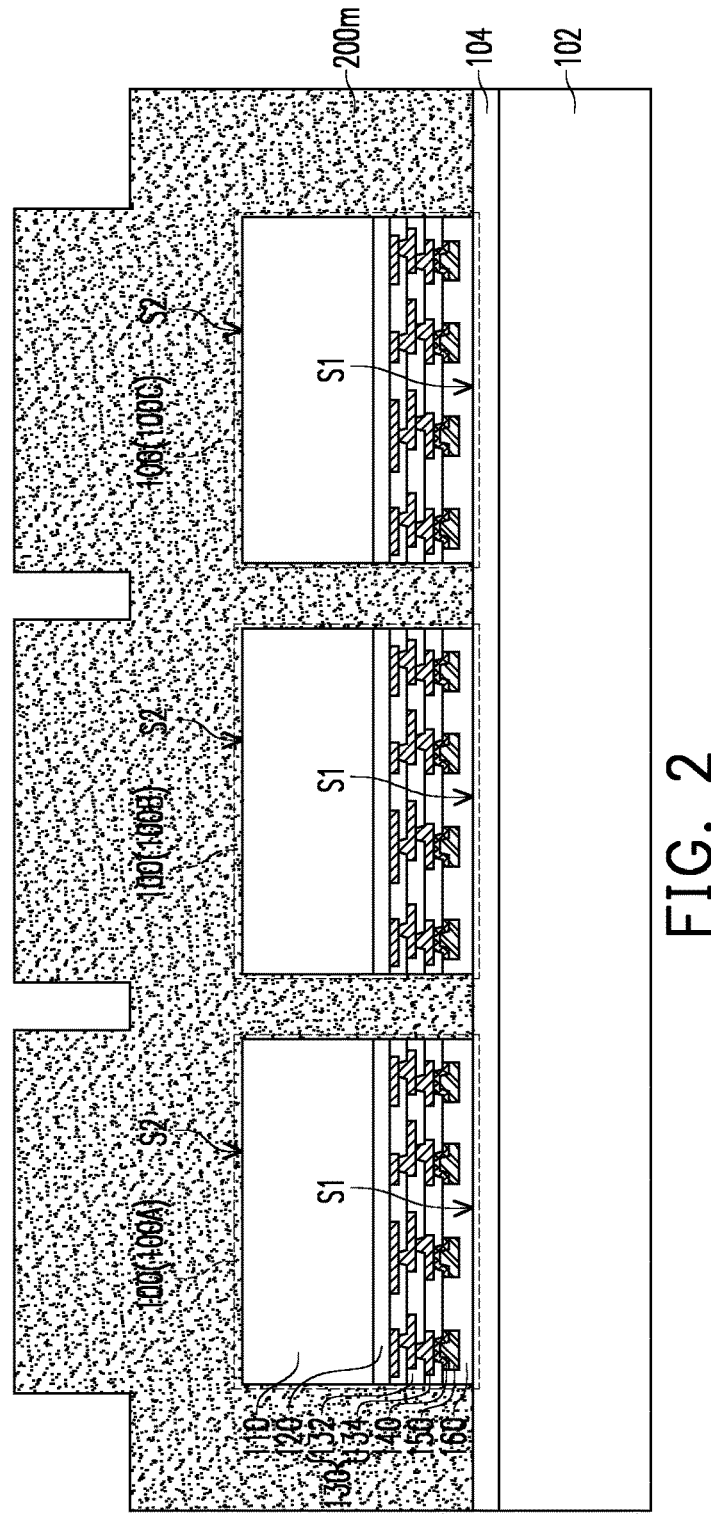
FIG. 2
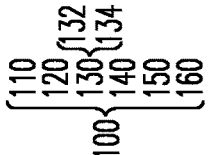

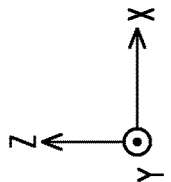
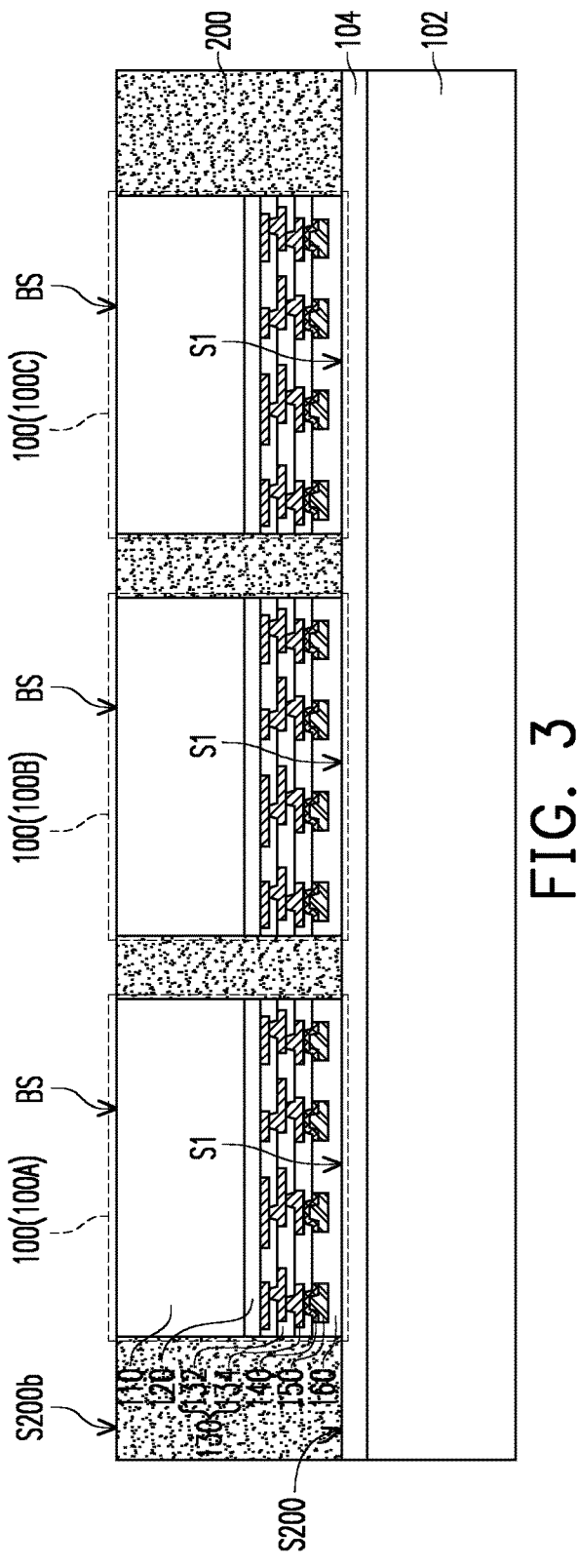
FIG. 3

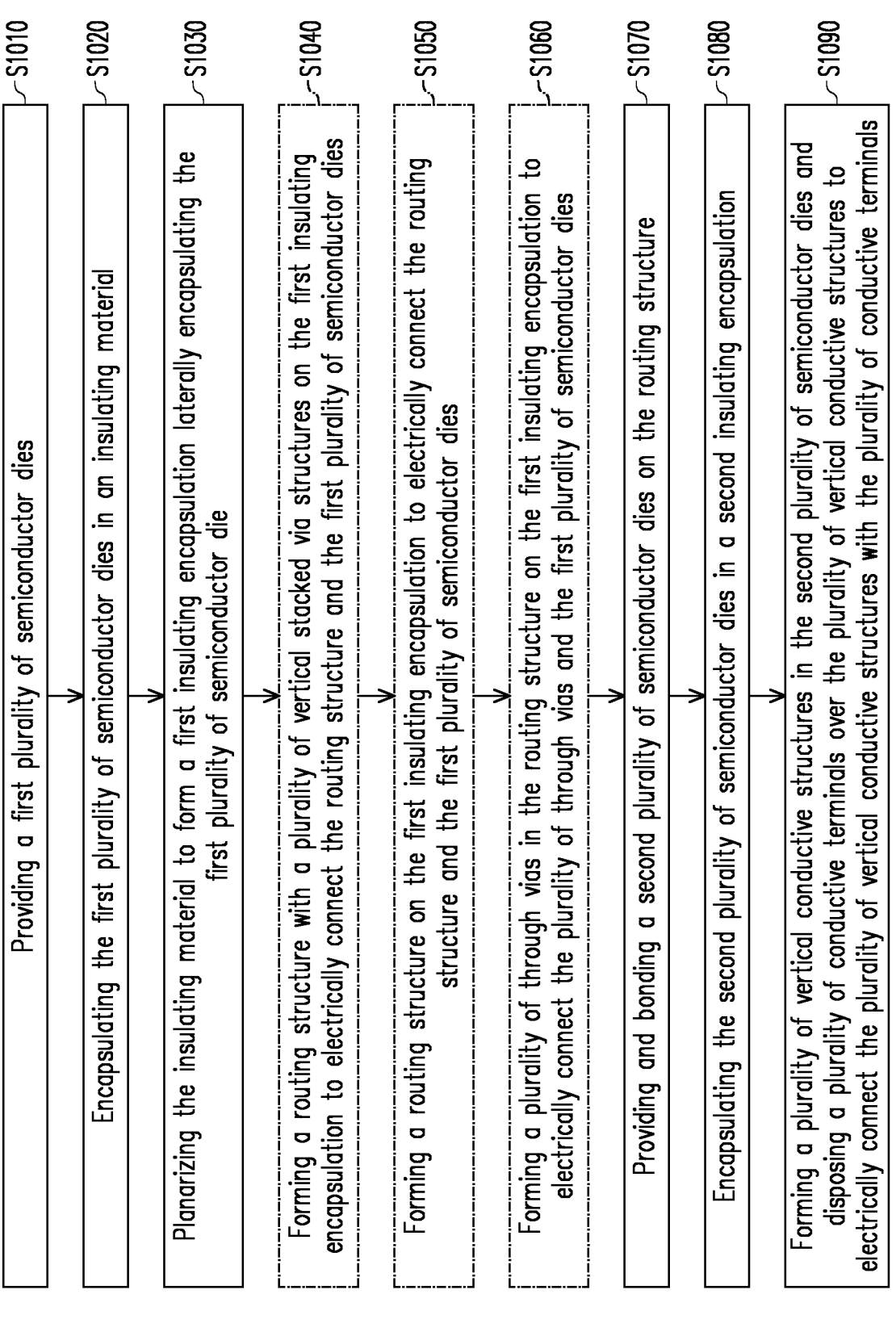

Providing a first plurality of semiconductor dies ⌐S1010

Encapsulating the first plurality of semiconductor dies in an insulating material ⌐S1020

Planarizing the insulating material to form a first insulating encapsulation laterally encapsulating the first plurality of semiconductor die ⌐S1030

Forming a routing structure with a plurality of vertical stacked via structures on the first insulating encapsulation to electrically connect the routing structure and the first plurality of semiconductor dies ⌐S1040

Forming a routing structure on the first insulating encapsulation to electrically connect the routing structure and the first plurality of semiconductor dies ⌐S1050

Forming a plurality of through vias in the routing structure on the first insulating encapsulation to electrically connect the plurality of through vias and the first plurality of semiconductor dies ⌐S1060

Providing and bonding a second plurality of semiconductor dies on the routing structure ⌐S1070

Encapsulating the second plurality of semiconductor dies in a second insulating encapsulation ⌐S1080

Forming a plurality of vertical conductive structures in the second plurality of semiconductor dies and disposing a plurality of conductive terminals over the plurality of vertical conductive structures to electrically connect the plurality of vertical conductive structures with the plurality of conductive terminals ⌐S1090

FIG. 12

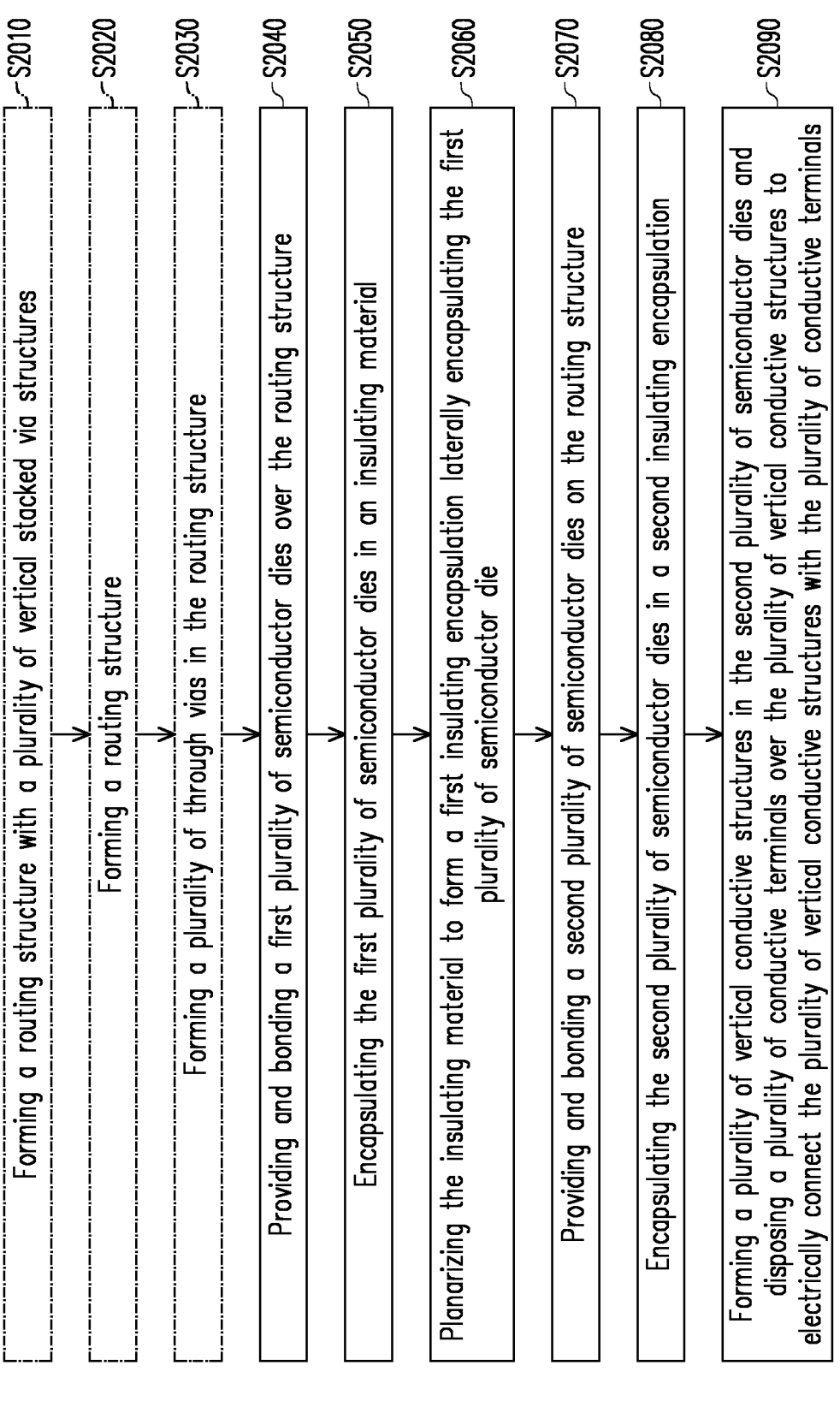

Forming a routing structure with a plurality of vertical stacked via structures ⸝S2010

Forming a routing structure ⸝S2020

Forming a plurality of through vias in the routing structure ⸝S2030

Providing and bonding a first plurality of semiconductor dies over the routing structure ⸝S2040

Encapsulating the first plurality of semiconductor dies in an insulating material ⸝S2050

Planarizing the insulating material to form a first insulating encapsulation laterally encapsulating the first plurality of semiconductor die ⸝S2060

Providing and bonding a second plurality of semiconductor dies on the routing structure ⸝S2070

Encapsulating the second plurality of semiconductor dies in a second insulating encapsulation ⸝S2080

Forming a plurality of vertical conductive structures in the second plurality of semiconductor dies and disposing a plurality of conductive terminals over the plurality of vertical conductive structures to electrically connect the plurality of vertical conductive structures with the plurality of conductive terminals ⸝S2090

FIG. 18

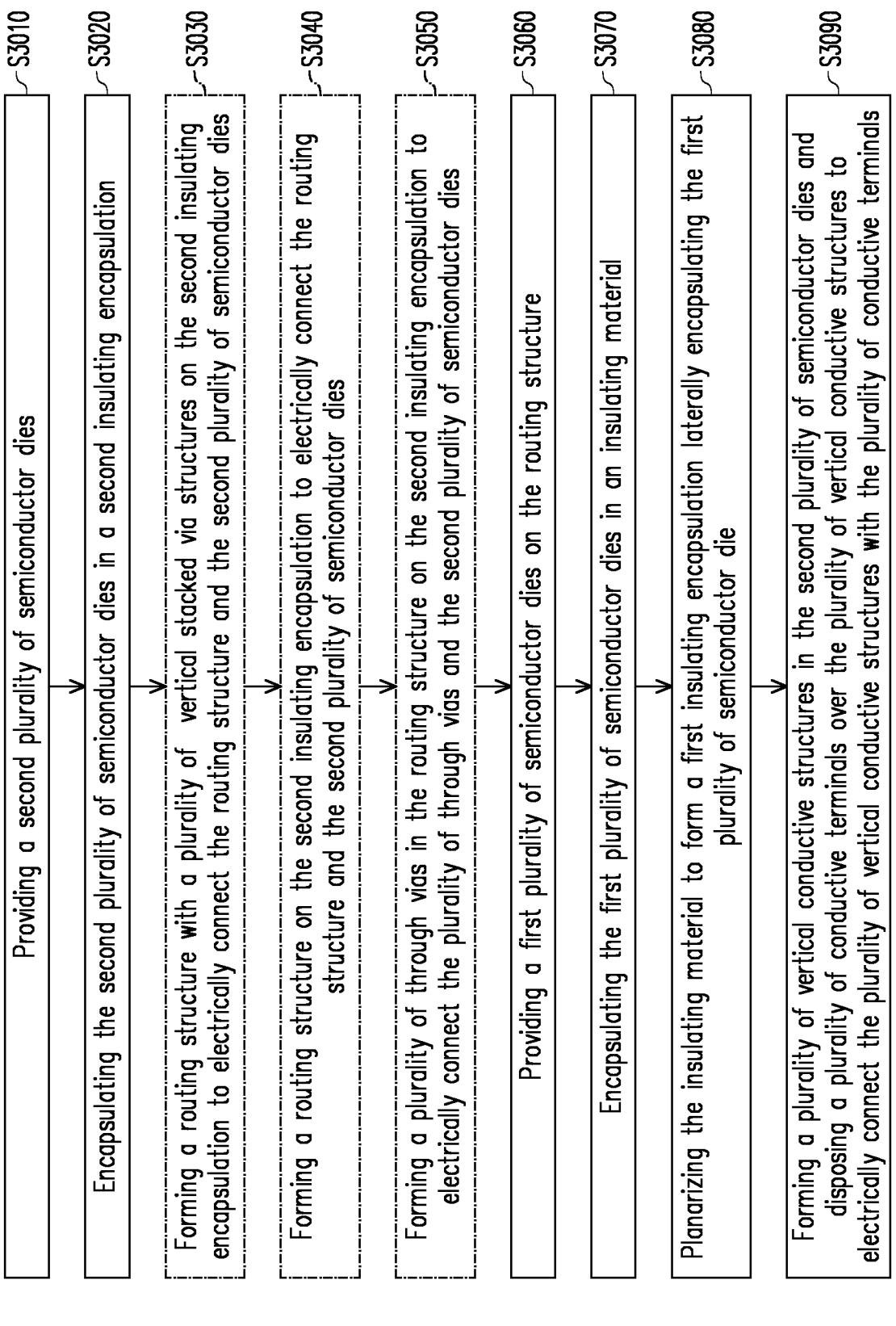

S3010 — Providing a second plurality of semiconductor dies

S3020 — Encapsulating the second plurality of semiconductor dies in a second insulating encapsulation S3030 — Forming a routing structure with a plurality of vertical stacked via structures on the second insulating encapsulation to electrically connect the routing structure and the second plurality of semiconductor dies S3040 — Forming a routing structure on the second insulating encapsulation to electrically connect the routing structure and the second plurality of semiconductor dies S3050 — Forming a plurality of through vias in the routing structure on the second insulating encapsulation to electrically connect the plurality of through vias and the second plurality of semiconductor dies S3060 — Providing a first plurality of semiconductor dies on the routing structure S3070 — Encapsulating the first plurality of semiconductor dies in an insulating material S3080 — Planarizing the insulating material to form a first insulating encapsulation laterally encapsulating the first plurality of semiconductor die S3090 — Forming a plurality of vertical conductive structures in the second plurality of semiconductor dies and disposing a plurality of conductive terminals over the plurality of vertical conductive structures to electrically connect the plurality of vertical conductive structures with the plurality of conductive terminals

FIG. 24

SEMICONDUCTOR STRUCTURE WITH VERTICAL CONNECTION STRUCTURE AND MANUFACTURING METHOD THEREOF

CROSS-REFERENCE TO RELATED APPLICATION

This application claims the priority benefit of U.S. provisional application Ser. No. 63/404,177, filed on Sep. 6, 2022. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size has decreased. This scaling down process generally provides benefits by increasing production efficiency and lowering associated costs.

As the demand for miniaturization, higher speed and greater bandwidth, as well as lower power consumption and latency has grown recently, there has grown a need for smaller and more creative packaging techniques of semiconductor dies. For example, System-on-Integrate-Chips (SoIC) has been developed to include a plurality of device dies such as processors and/or memory cubes in the same package. The SoIC can include device dies formed using different technologies and have different functions bonded to the same device die, thus forming a system. This may save manufacturing cost and optimize device performance.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 8 are schematic cross-sectional views of various stages in a manufacturing method of a semiconductor structure in accordance with some embodiments of the disclosure.

FIG. 12 is a flow chart illustrating a method for manufacturing a semiconductor structure in accordance with some embodiments of the disclosure.

FIG. 18 is a flow chart illustrating a method for manufacturing a semiconductor structure in accordance with some embodiments of the disclosure.

FIG. 24 is a flow chart illustrating a method for manufacturing a semiconductor structure in accordance with some embodiments of the disclosure.

DETAILED DESCRIPTION

Figure 4:
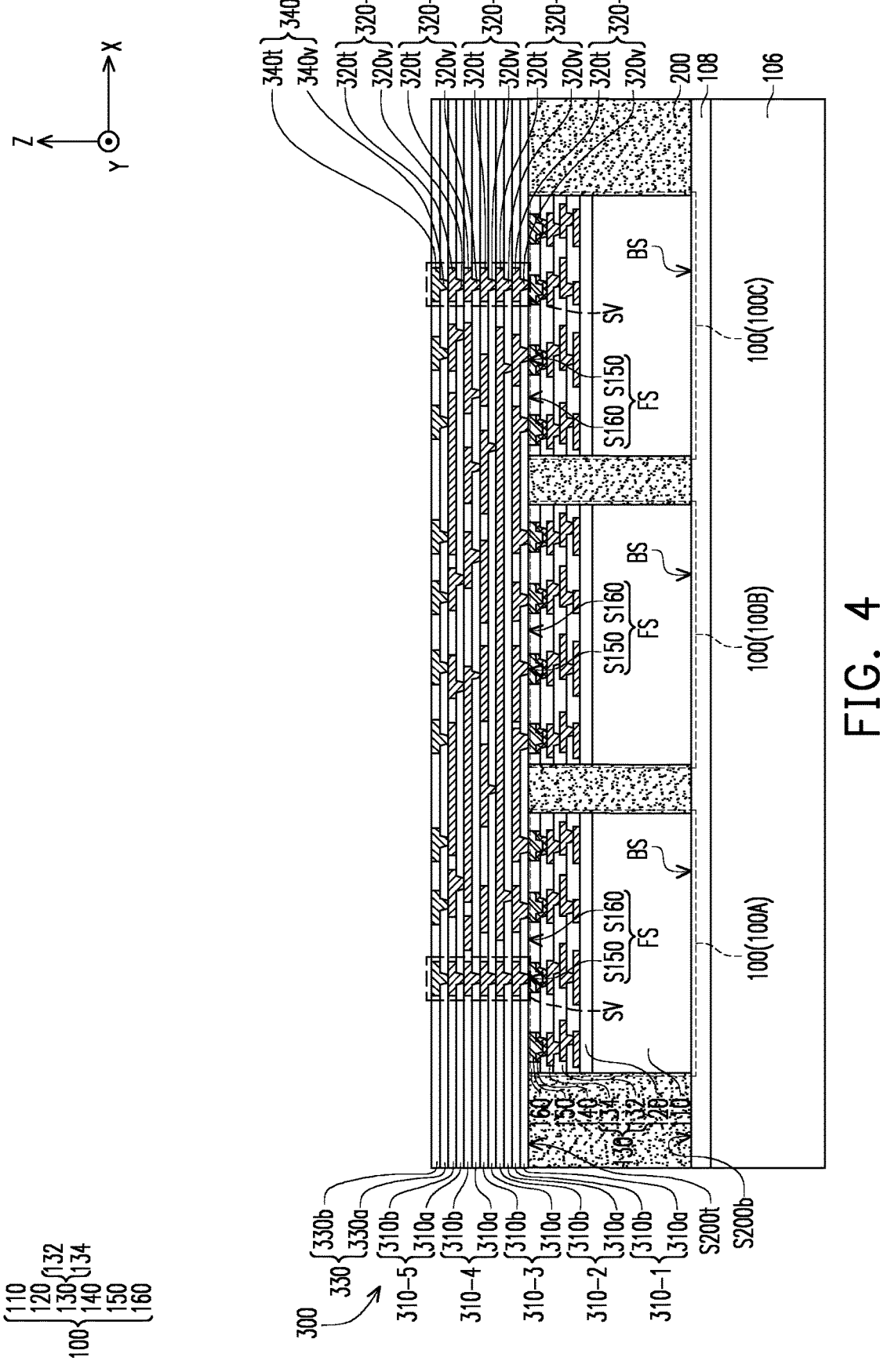

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

As used herein, "around," "about," "approximately," or "substantially" shall generally mean within 20 percent, or within 10 percent, or within 5 percent, or within 3 percent, or within 1 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease cost.

It should be appreciated that the following embodiment(s) of the disclosure provides applicable concepts that can be embodied in a wide variety of specific contexts. The specific embodiment(s) discussed herein is merely illustrative and is related to a semiconductor structure includes a plurality of die tiers bonding at two different sides of a routing structure, and is not intended to limit the scope of the disclosure. In accordance with some embodiments, the semiconductor structure includes a routing structure having vertical electrical structures and horizontal electrical structures, a first tier of dies disposed on a first side of the routing structure and electrically coupled thereto, and a second tier of dies disposed on a second side of the routing structure and electrically coupled thereto. In In the case, the first tier of the dies are electrically coupled and electrically communicated to each other through the routing structure, the second tier of the dies are electrically coupled and electrically communicated to each other through the routing structure, and the first tier of the dies are electrically coupled and electrically communicated to the second tier of the dies through the routing structure. In accordance with alternative embodiments, at least one of the first tier of dies and the second tier of dies is a wafer including a plurality of semiconductor dies interconnected thereto. At least one of the first tier of dies and the second tier of dies may be bonded to the routing structure through a SoIC bonding or a flip-chip (FC) bonding. With the routing structure, the performance of the semiconductor structure is improved, thereby enhancing the reliability of the semiconductor structure. In accordance with some embodiments, the first tier of dies and the second tier of dies are semiconductor dies encapsulated in an insulating encapsulation.

Figure 5:
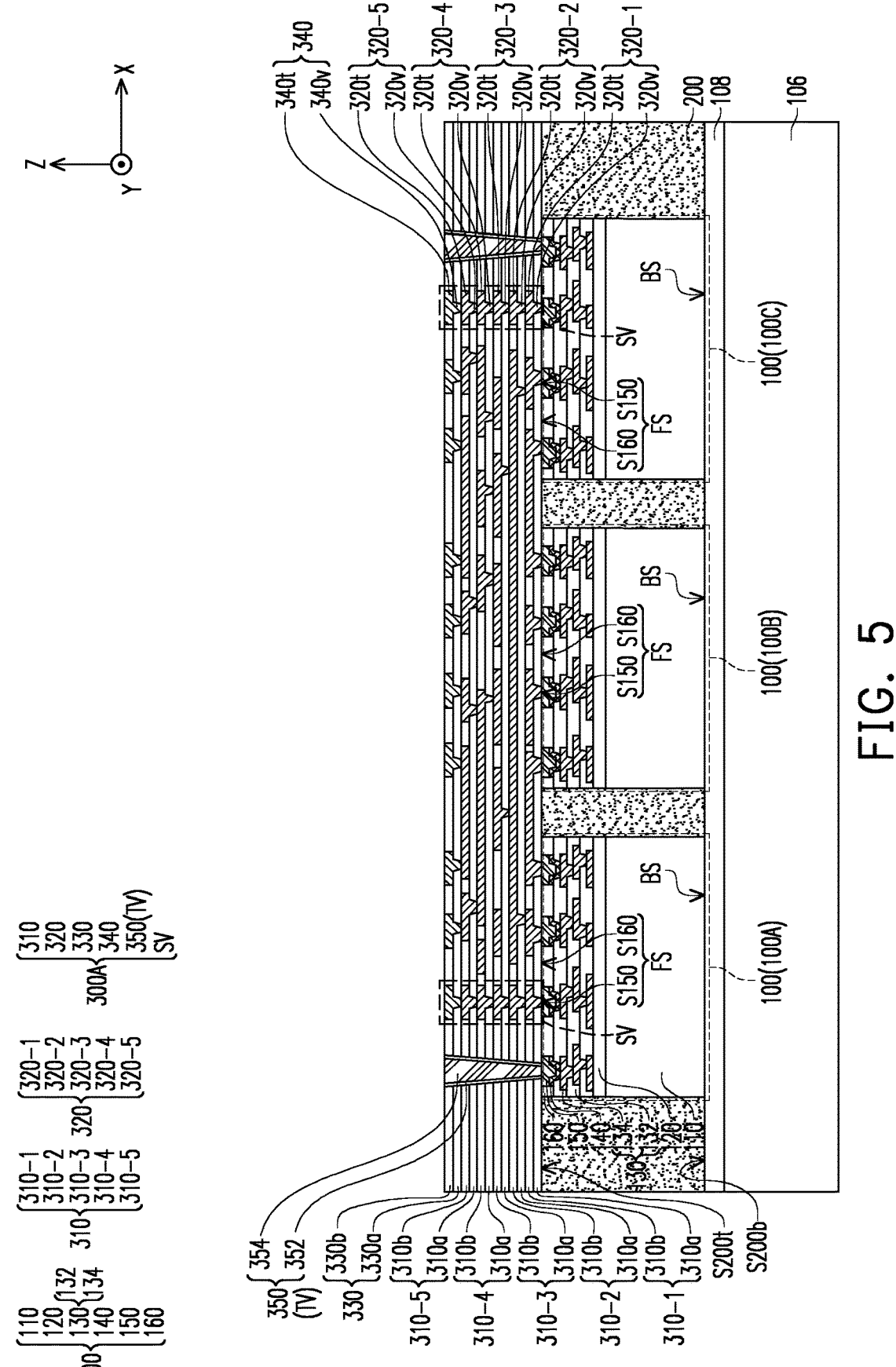
Figure 6:
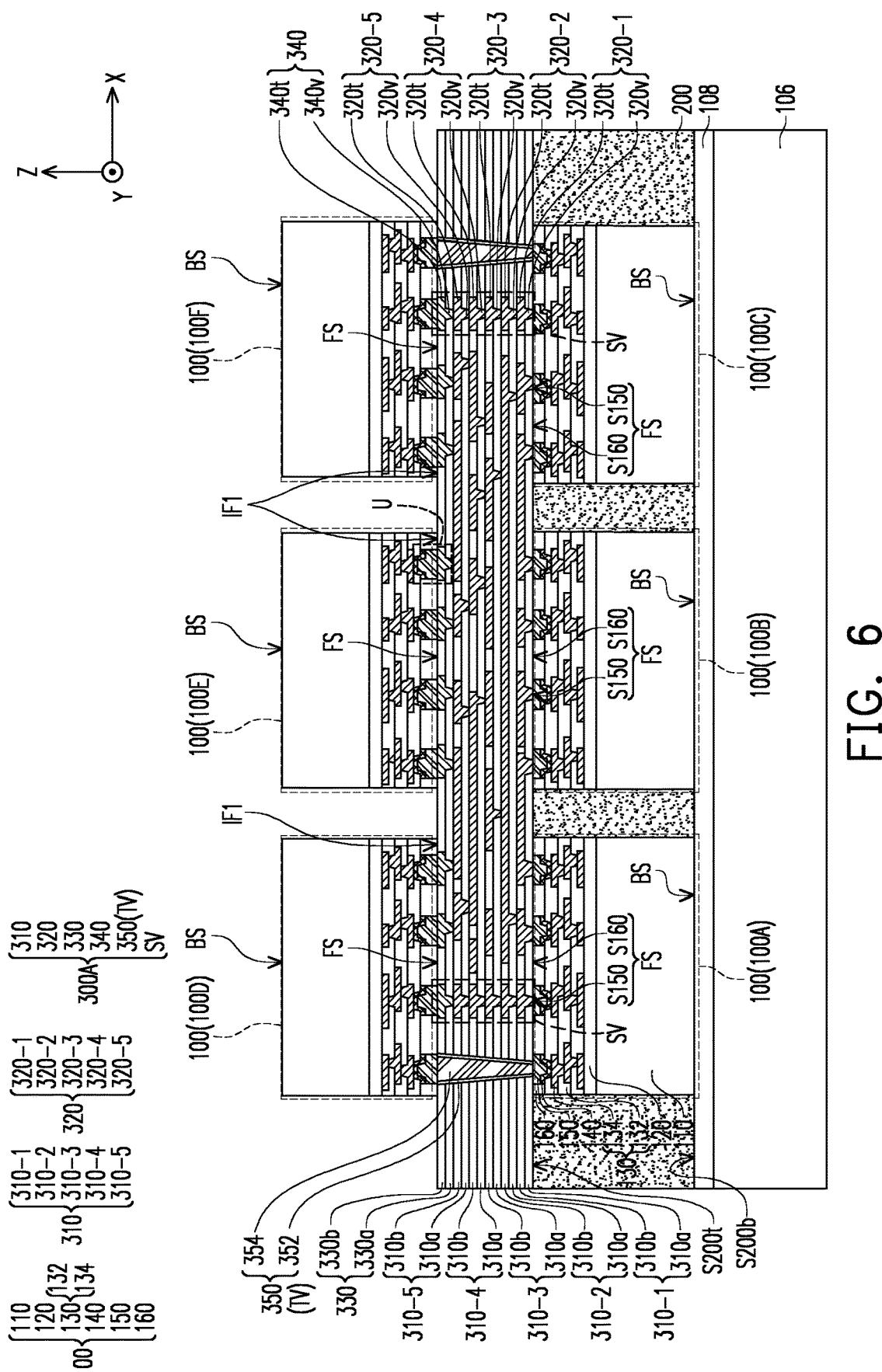
Figure 9:
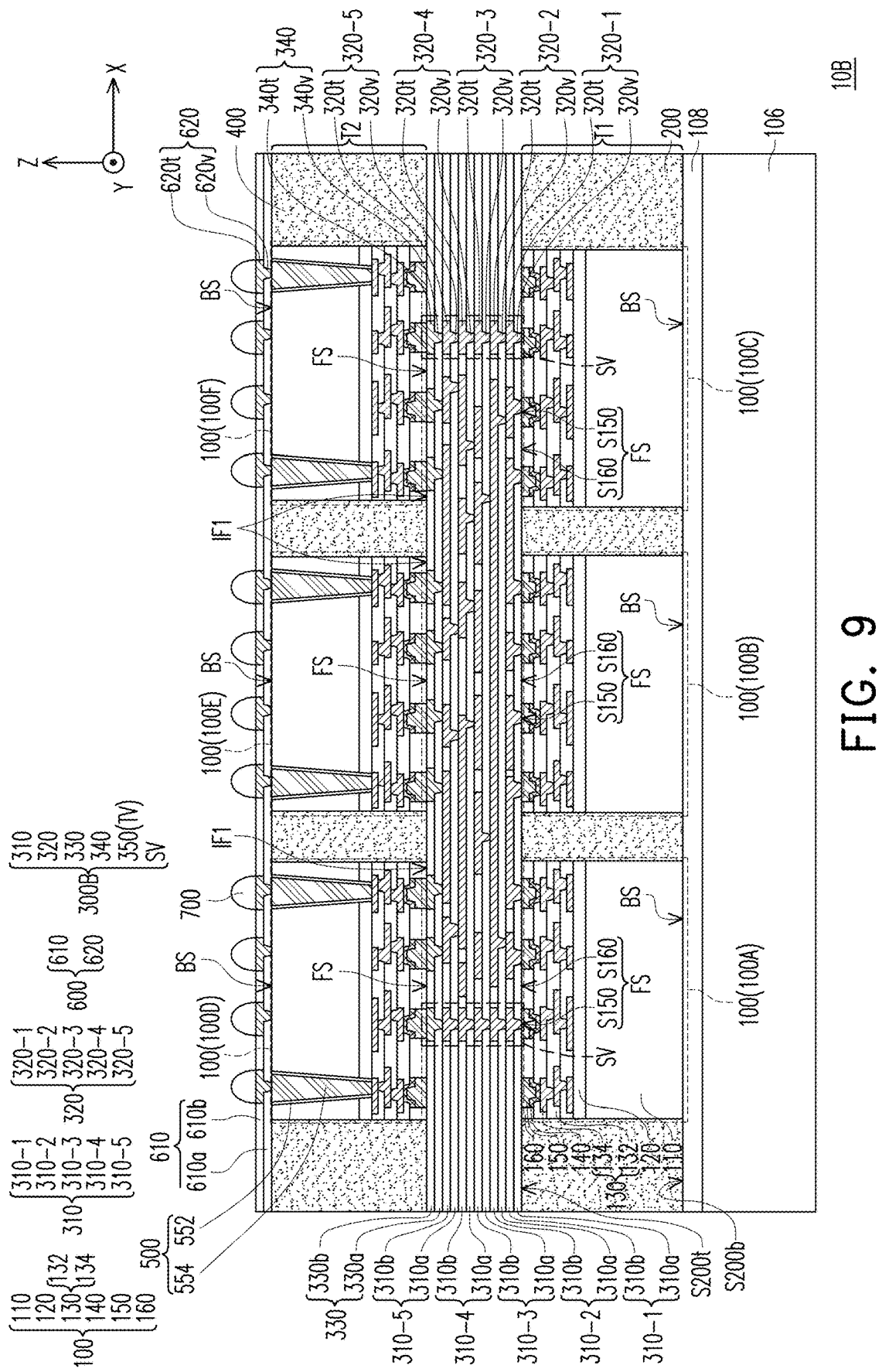
FIG. 9 is a schematic cross-sectional view of a semiconductor structure in accordance with alternative embodiments of the disclosure.
Figure 10:
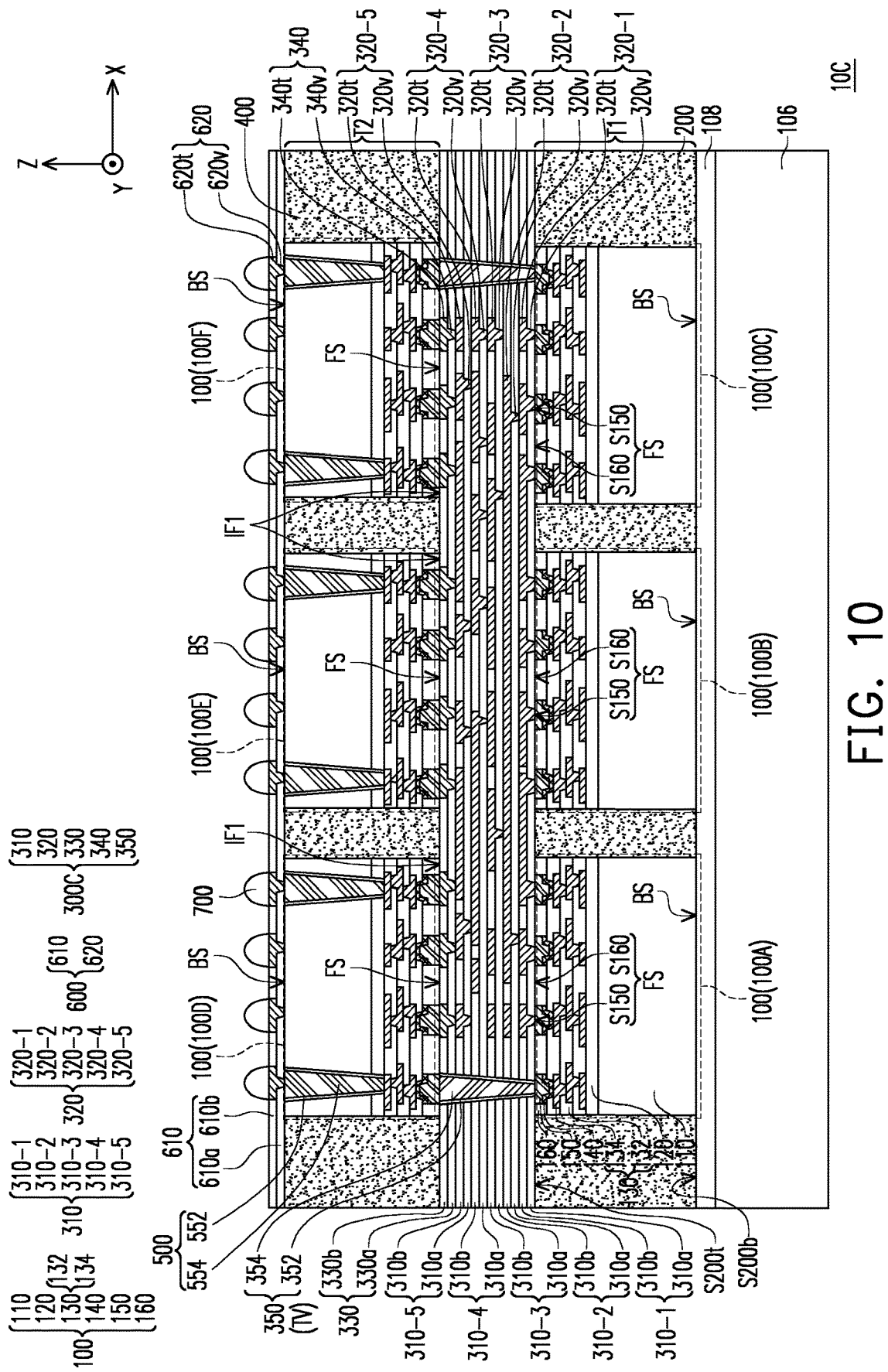
FIG. 10 is a schematic cross-sectional view of a semiconductor structure in accordance with alternative embodiments of the disclosure.
Figure 11:
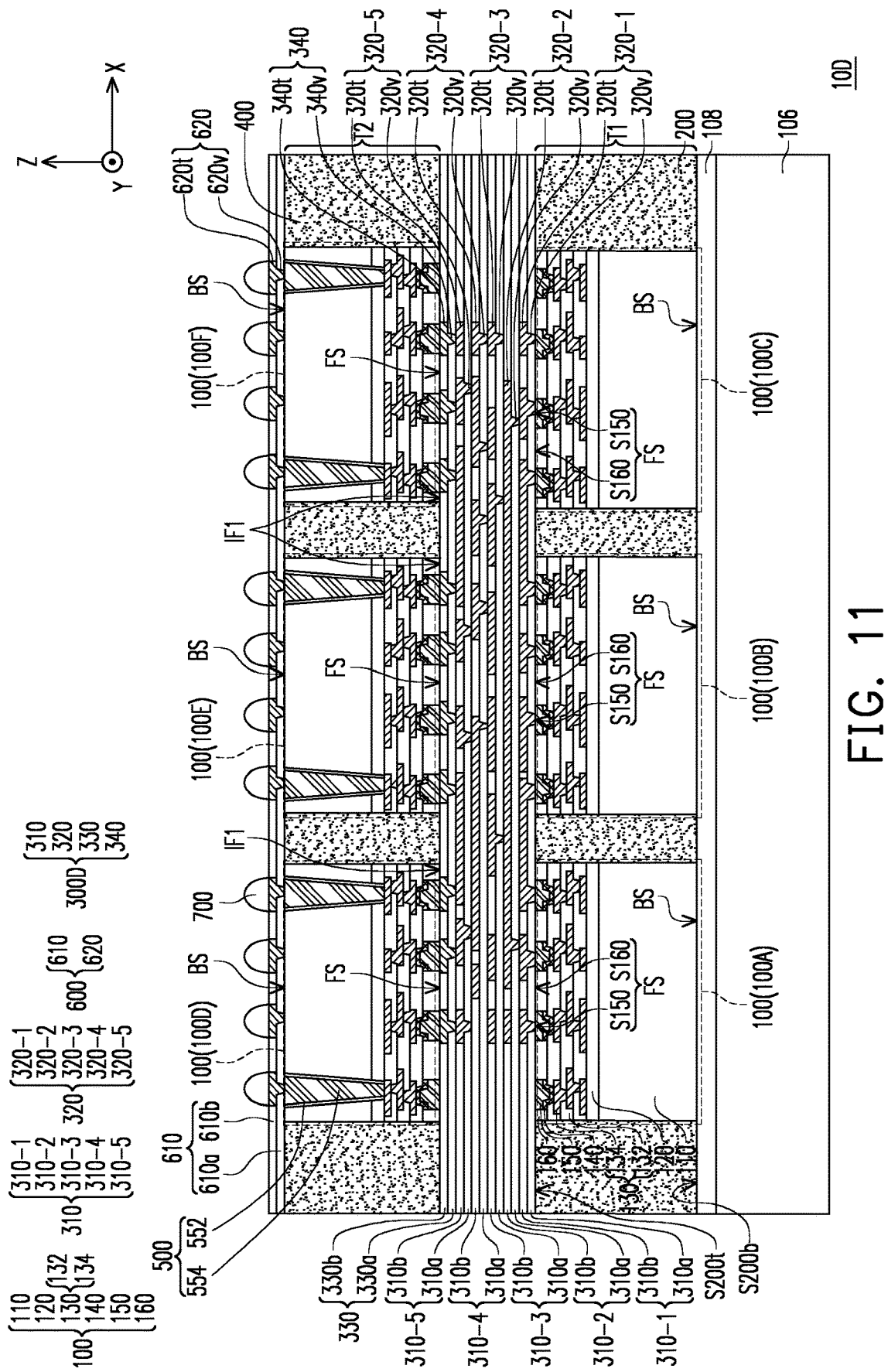
FIG. 11 is a schematic cross-sectional view of a semiconductor structure in accordance with alternative embodiments of the disclosure.
Figure 13B:
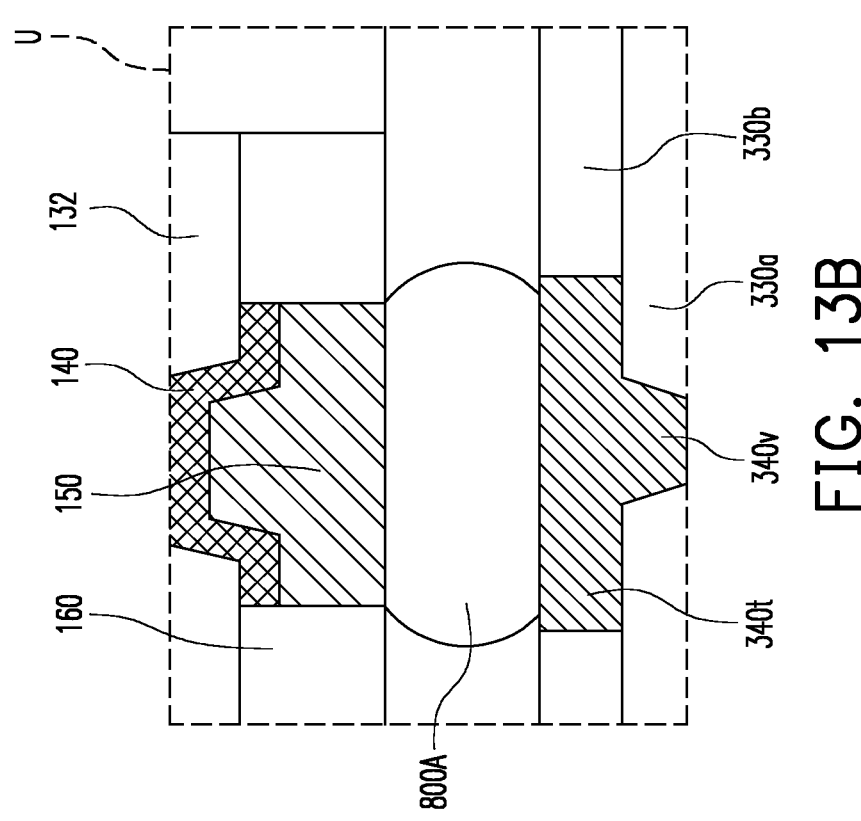
FIG. 13A and FIG. 13B are enlarged and schematic cross-sectional views showing various embodiments of a bonding interface between a semiconductor die and a routing structuring overlapping thereto in accordance with some embodiments of the disclosure.
Figure 13A:
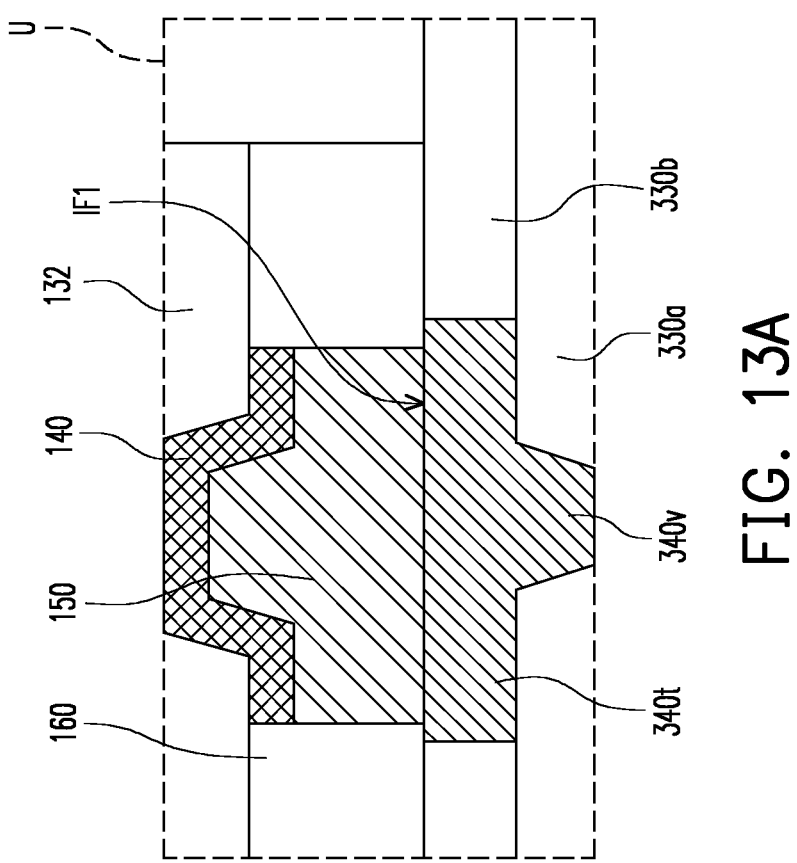

FIG. 1 through FIG. 8 are schematic cross-sectional views of various stages in a manufacturing method of a semiconductor structure 10A in accordance with some embodiments of the disclosure. FIG. 9 is a schematic cross-sectional view of a semiconductor structure 10B in accordance with alternative embodiments of the disclosure. FIG. 10 is a schematic cross-sectional view of a semiconductor structure 10C in accordance with alternative embodiments of the disclosure. FIG. 11 is a schematic cross-sectional view of a semiconductor structure 10D in accordance with alternative embodiments of the disclosure. FIG. 12 is a flow chart illustrating a method for manufacturing a semiconductor structure (such as 10A, 10B, 10C, or 10D) in accordance with some embodiments of the disclosure. FIG. 13A and FIG. 13B are enlarged and schematic cross-sectional views showing various embodiments of a bonding interface between a semiconductor die and a routing structuring overlapping thereto in accordance with some embodiments of the disclosure, where the enlarged and schematic cross-sectional views of FIG. 13A and FIG. 13B are outlined in a dashed box U as shown in FIG. 6. In embodiments, the manufacturing method is part of a wafer level packaging process. It is to be noted that the process steps described herein cover a portion of the manufacturing processes used to fabricate the semiconductor structure involving a plurality of semiconductor die (or chip) and a routing structure connected thereto, where the routing structures includes vertical electrical structures and horizontal electrical structures. The embodiments are intended to provide further explanations but are not used to limit the scope of the disclosure. Accordingly, it is understood that additional processes may be provided before, during, and after the illustrated method, and that some other processes may only be briefly described herein. In the disclosure, it should be appreciated that the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, the drawings are illustrated with orthogonal axes (X, Y and Z) of a Cartesian coordinate system according to which the views are oriented; however, the disclosure is not specifically limited thereto.

Referring to FIG. 1, in some embodiments, a carrier 102 is provide. In some embodiments, the carrier 102 may be a glass carrier, a ceramic carrier, or any suitable carrier for carrying a semiconductor wafer or a reconstituted wafer for the manufacturing method of the semiconductor structure. In alternative embodiments, the carrier 102 may be a reclaim wafer or a reconstituted wafer for the manufacturing method of the semiconductor structure. For a non-limiting example, as the material of the carrier 102 is a Si substrate, the carrier 102 may serve as a heat dissipating element for the semiconductor structure. In such embodiments, the carrier 102 may further be used for warpage control. For another non-limiting example, as the carrier 102 is a glass carrier, the carrier 102 may be then removed after the manufacture of the semiconductor structure. In one embodiment, the carrier 102 may be a temporary supporting structure, which may be removed during the manufacturing method of the semiconductor structure. Or, the carrier 102 may be a mechanical supporting structure, which may not be removed after the manufacturing method of the semiconductor structure.

In some embodiments, the carrier 102 is coated with a debond layer 104 (as shown in FIG. 1). The material of the debond layer 104 may be any material suitable for bonding and debonding the carrier 102 from the above layer(s) or any wafer(s) disposed thereon. In some embodiments, the debond layer 104 includes a dielectric material layer made of a dielectric material including any suitable polymer-based dielectric material (such as benzocyclobutene (BCB), poly-benzoxazole (PBO)). For a non-limiting example, the debond layer 104 includes a dielectric material layer made of an epoxy-based thermal-release material, which loses its adhesive property when heated, such as a light-to-heat-conversion (LTHC) release coating film. For another non-limiting example, the debond layer 104 includes a dielectric material layer made of an ultra-violet (UV) glue, which loses its adhesive property when exposed to UV lights. The debond layer 104 may be dispensed as a liquid and cured on the carrier 102, may be a laminate film laminated onto the carrier 102, or may be formed on the carrier 102 by any suitable method. For example, as shown in FIG. 1, an illustrated top surface of the debond layer 104, which is opposite to an illustrated bottom surface contacting the carrier 102, is leveled and has a high degree of coplanarity. In certain embodiments, the debond layer 104 is a LTHC layer with good chemical resistance, and such layer enables room temperature debonding from the carrier 102 by applying laser irradiation, however the disclosure is not limited thereto.

In an alternative embodiment, a buffer layer (not shown) is coated on the debond layer 104, where the debond layer 104 is sandwiched between the buffer layer and the carrier 102, and an top surface of the buffer layer may further provide a high degree of coplanarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SRF), or the like. In other words, the buffer layer is an optional dielectric layer, and may be omitted based on the demand; the disclosure is not limited thereto. For example, the buffer layer may be formed by a suitable fabrication technique such as spin-coating, lamination, deposition, or the like.

Continued on FIG. 1, in some embodiments, a first plurality of semiconductor dies are provided, in accordance with a step S1010 of the method in FIG. 12. As illustrated in FIG. 1, in some embodiments, a first plurality of semiconductor dies including a semiconductor die 100A, a semiconductor die 100B, and a semiconductor die 100C are provided. In the disclosure, the semiconductor dies 100A, 100B, 100C are referred to as semiconductor dies 100. As shown in FIG. 1, only three semiconductor dies 100 (e.g., the semiconductor dies 100A, 100B, 100C) are presented as the third plurality of semiconductor dies for illustrative purposes, however, it should be noted that the number of the semiconductor dies 100 used as the first plurality of semiconductor dies may be one, two, three, or more than three, the disclosure is not limited thereto.

In some embodiments, the semiconductor dies 100 are picked and placed over the carrier 102 and disposed on the debond layer 104. For example, as shown in FIG. 1, the semiconductor dies 100A, 100B, 100C are arranged aside to each other along a direction X, and the direction X is perpendicular to a stacking direction Z of the carrier 102 and the debond layer 104. In other embodiments, the semiconductor dies 100A, 100B, 100C are arranged aside to each other along a direction Y, and the direction Y is different from the direction X and the stacking direction Z, and is perpendicular to the stacking direction Z. Alternatively, the semiconductor dies 100A, 100B, 100C are arranged in the form of a matrix, such as a N×N array or a N×M array (N, M>0, N may or may not be equal to M) along the direction X and the direction Y.

The semiconductor dies 100 may be referred to as semiconductor dies or chips, independently, including a digital chip, an analog chip, or a mixed signal chip. In some embodiments, the semiconductor dies 100 are, independently, a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor dies 100 are, independently, a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, a wide I/O memory (WIO) a pre-stacked memory cube such as a hybrid memory cube (HMC) module, a high bandwidth memory (HBM) module; a combination thereof; or the like. In further alternative embodiments, the semiconductor dies 100 are, independently, an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoIC system, etc.; a combination thereof; or the like. In some other embodiments, the semiconductor dies 100 are, independently, an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The types of the semiconductor dies 100 may be selected and designated based on the demand and design requirement, and thus are specifically limited in the disclosure.

In accordance with some embodiments of the disclosure, the types of some of the semiconductor dies 100 are different from each other, while some of the semiconductor dies 100 are identical types. In alternative embodiments, the types of all of the semiconductor dies 100 are different. In further alternative embodiments, the types of all of the semiconductor dies 100 are identical. In accordance with some embodiments of the disclosure, the sizes of some of the semiconductor dies 100 are different from each other, while some of the semiconductor dies 100 are the same sizes. In alternative embodiments, the sizes of all of the semiconductor dies 100 are different. In further alternative embodiments, the sizes of all of the semiconductor dies 100 are the same. In accordance with some embodiments of the disclosure, the shapes of some of the semiconductor dies 100 are different from each other, while the shapes of some of the semiconductor dies 100 are identical. In alternative embodiments, the shapes of all of the semiconductor dies 100 are different. In further alternative embodiments, the shapes of all of the semiconductor dies 100 are identical. The types, sizes and shapes of each of the semiconductor dies 100 are independent from each other, and may be selected and designed based on the demand and design layout, the disclosure is not limited thereto.

In some embodiments, each of the semiconductor dies 100 includes a semiconductor substrate 110, a device layer 120 having semiconductor devices (not shown) formed thereon, an interconnect structure 130 formed on the device layer 120 and over the semiconductor substrate 110, a plurality of connecting pads 140 formed on the interconnect structure 130, a plurality of connecting vias 150 formed on the connecting pads 140, and a protection layer 160 covers the interconnect structure 130, the connecting pads 140 and the connecting vias 150. In some embodiments, the semiconductor substrate 110 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 110 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multi-layer compound semiconductor structure. The alloy SiGe may be formed over a silicon substrate. The SiGe substrate may be strained.

In some embodiments, the device layer 120 includes semiconductor devices formed on (and/or partially formed in) the semiconductor substrate 110, where the semiconductor devices include active devices (e.g., transistors, diodes, memory, etc.) and/or passive devices (e.g., capacitors, resistors, inductors, jumper, etc.), or other suitable electrical components. The device layer 120 may be disposed at an active surface of the semiconductor substrate 110 proximal to the interconnect structure 130, as shown in FIG. 1. In some embodiments, the semiconductor substrate 110 has the active surface and a bottom surface (denoted as S2) opposite to the active surface along the stacking direction Z of the interconnect structure 130, the device layer 120, and the semiconductor substrate 110. In some embodiments, the device layer 120 is interposed between the interconnect structure 130 and the active surface of the semiconductor substrate 110.

The device layer 120 may include circuitry (not shown) formed in a front-end-of-line (FEOL), and the interconnect structure 130 may be formed in a back-end-of-line (BEOL). In some embodiments, the interconnect structure 130 includes an inter-layer dielectric (ILD) layer formed over the device layer 120, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 130 including one or more dielectric layers 132 and one or more metallization layer 134 in alternation. The metallization layer 134 may be embedded in the dielectric layers 132. In some embodiments, the interconnect structure 130 is electrically coupled to the semiconductor devices of the device layer 120 to one another and to external components (e.g., test pads, bonding conductors, etc.) formed thereon. For example, the metallization layer 134 in the dielectric layers 132 route electrical signals between the semiconductor devices of the device layer 120. The semiconductor devices of the device layer 120 and the metallization layer 134 are interconnected to perform one or more functions including memory structures (e.g., a memory cell), processing structures (e.g., a logic cell), input/output (I/O) circuitry (e.g., an I/O cell), or the like. The uppermost layer of the interconnect structure 130 may be a passivation layer made of one or more suitable dielectric materials such as silicon oxide, silicon nitride, low-k dielectrics, polyimide (PI), combinations of these, or the like. In some embodiments, as shown in FIG. 1, the passivation layer (e.g., the uppermost layer of the dielectric layers 132) of the interconnect structure 130 has an opening exposing at least a portion of a topmost layer of the metallization layer 134 for further electrical connection.

The dielectric layers 132 may be PI, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 132 are formed by suitable fabrication techniques such as spin-on coating, chemical vapor deposition (CVD), plasma-enhanced chemical vapor deposition (PECVD) or the like.

The metallization layer 134 may be made of conductive materials formed by electroplating or deposition, such as copper, copper alloy, aluminum, aluminum alloy, or combinations thereof, which may be patterned using a photolithography and etching process. In some embodiments, the metallization layer 134 are patterned copper layers or other suitable patterned metal layers. For example, may be metal lines, metal vias, metal pads, metal traces, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The numbers of the dielectric layers 132 and the number of the metallization layers 134 are not limited in the disclosure, and may be selected and designated based on demand and design layout.

In some embodiments, as illustrated in FIG. 1, the connecting pads 140 are disposed over and electrically coupled to the topmost layer of the metallization layer 134 of the interconnect structure 130 exposed by the passivation layer (e.g., the uppermost layer of the dielectric layers 132) of the interconnect structure 130 for testing and/or further electrical connection. The connecting pads 140 may be made of aluminum, copper, or alloys thereof or the like, and may be formed by an electroplating process. The disclosure is not limited thereto. Some of the connecting pads 140 may be testing pads, and some of the connecting pads 140 may be conductive pads for further electrical connection. In alternative embodiments, the connecting pads 140 may be optional for simple structure and cost benefits. In such alternative embodiments, the connecting vias 150 may directly connect to the uppermost metallization layer 134.

In some embodiments, the connecting vias 150 are respectively disposed on and electrically connected to the connecting pads 140 for providing an external electrical connection to the circuitry and semiconductor devices of the device layer 120. In one embodiment, the connecting vias 150 may be formed of conductive materials such as copper, gold, aluminum, the like, or combinations thereof, and may be formed by an electroplating process or the like. The connecting vias 150 may be bond vias, bond pads or bond bumps, or combinations thereof. The disclosure is not limited thereto. The connecting vias 150 may serve as bonding conductors for further electrical connection and may be formed over the connecting pads 140 (serving as the conductive pads for further electrical connection). The connecting vias 150 may be electrically coupled to the semiconductor devices of the device layer 120 through the interconnect structure 130 and the connecting pads 140.

Alternatively, both of the connecting pads 140 and the connecting vias 150 may be formed on the interconnect structure 130. For example, the connecting vias 150 are disposed on and electrically connected to the topmost layer of the metallization layer 134 of the interconnect structure 130 exposed by the passivation layer (e.g., the uppermost layer of the dielectric layers 132) of the interconnect structure 130. That is, the connecting vias 150 and the connecting pads 140 may all be disposed on the topmost layer of the metallization layer 134 of the interconnect structure 130 exposed by the passivation layer in a manner of side-by-side. In such embodiments, the connecting pads 140 may be testing pads for testing while the connecting vias 150 may be the bonding conductors for further electrical connection. The connecting vias 150 may be electrically coupled to the semiconductor devices of the device layer 120 through the interconnect structure 130.

In some embodiments, the protection layer 160 is formed on the interconnect structure 130 to cover the interconnect structure 130, the connecting pads 140, and the connecting vias 150. That is to say, the protection layer 160 prevents any possible damage(s) occurring on the connecting pads 140 and the connecting vias 150 during the transfer of the semiconductor dies 100. In addition, in some embodiments, the protection layer 160 further acts as a passivation layer for providing better planarization and evenness. In some embodiments, top surfaces of the connecting vias 150 are not accessibly revealed by a top surface S1 of the protection layer 160, as shown in FIG. 1.

The protection layer 160 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, PI, silicon carbon, silicon carbon oxynitride, diamond like carbon (DLC), and the like, or a combination thereof. It should be appreciated that the protection layer 160 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the semiconductor dies 100 are faced down and placed onto the debond layer 104 over the carrier 102. As shown in FIG. 1, the surfaces S1 of the protection layers 160 of the semiconductor dies 100 are disposed on (e.g., in physical contact with) the illustrated top surface of the debond layer 104, for example. The bottom surfaces S2 of the semiconductor substrates 110 of the semiconductor dies 100 are facing upwards and accessibly revealed, in this case.

Referring to FIG. 2, in some embodiments, the first plurality of semiconductor dies are encapsulated in an insulating material, in accordance with a step S1020 of the method in FIG. 12. In some embodiments, an insulating encapsulation 200m is conformally formed on the semiconductor dies 100 and over the carrier 102, where the semiconductor dies 100 are completely covered by the insulating encapsulation 200m. The insulating encapsulation 200m may be made of a dielectric material (such as an oxide (e.g., silicon oxide), a nitride (e.g., silicon nitride), TEOS, or the like) or any suitable insulating materials for gap fill, and may be formed by deposition (such as a CVD process). As shown in FIG. 2, the bottom surfaces S2 of the semiconductor substrates 110 of the semiconductor dies 100 are not accessibly revealed by the insulating encapsulation 200m, for example.

Referring to FIG. 3, in some embodiments, the insulating material is planarized to form a first insulating encapsulation laterally encapsulating the first plurality of semiconductor die, in accordance with a step S1030 of the method in FIG. 12. In some embodiments, a planarizing process is performed on the insulating encapsulation 200m to form an insulating encapsulation 200 exposing the semiconductor dies 100. For example, a portion of the insulating encapsulation 200m is removed to form the insulating encapsulation 200 having a surface S200b, where the surface S200b is a flat and planar surface. In some embodiments, bottom surfaces BS of the semiconductor dies 100 are substantially leveled with the surface S200b of the insulating encapsulation 200. For example, the bottom surfaces BS of the semiconductor dies 100 are substantially coplanar to the surface S200b of the insulating encapsulation 200. The sidewalls (not labeled) of the semiconductor dies 100 and the debond layer 104 exposed by the semiconductor dies 100 are covered by the insulating encapsulation 200, in some embodiments. For example, a surface S200 of the insulating encapsulation 200 is substantially coplanar to the top surface S1 of the protection layer 160 of the semiconductor dies 100. As shown in FIG. 3, the semiconductor dies 100 (e.g., the bottom surfaces BS thereof) are accessibly revealed by the insulating encapsulation 200, for example.

During the planarizing process, the semiconductor substrate 110 of one or more than one of the semiconductor dies 100 may further be planarized. In some embodiments, the planarizing process may include a grinding process, a chemical mechanical polishing (CMP) process, an etching process, or combinations thereof. The etching process may include a dry etching, a wet etching, or a combination thereof. After the planarizing process, a cleaning process may be optionally performed, for example to clean and remove the residue generated from the planarizing process. However, the disclosure is not limited thereto, and the planarizing process may be performed through any other suitable method.

Referring to FIG. 3, and FIG. 4, in some embodiments, the whole structure depicted in FIG. 3 is flipped (turned upside down) and place onto a carrier 106 coated with the debond layer 108, and then the carrier 102 is debonded from the semiconductor dies 100 and the insulating encapsulation 200. For example, the bottom surfaces BS of the semiconductor dies 100 and the surface S200b of the insulating encapsulation 200 are disposed on (e.g., in physical contact with) an illustrated top surface of the debond layer 108 over the carrier 106. The debond layer 108 may be disposed between the semiconductor dies 100 and the carrier 106 and between the insulating encapsulation 200 and the carrier 106, as shown in FIG. 4. In some embodiments, the semiconductor dies 100 and the insulating encapsulation 200 are easily separated from the carrier 102 due to the debond layer 104, and the surfaces S1 of the semiconductor dies 100 and the surface S200 of the insulating encapsulation 200 are accessibly revealed. In some embodiments, the carrier 102 is detached from the semiconductor dies 100 and the insulating encapsulation 200 through a debonding process, and the carrier 102 and the debond layer 102 are removed. The debonding process may be a laser debonding process. The formation and material of the carrier 106 may be similar to the formation and material of the carrier 102 as described in FIG. 1, and the formation and material of the debond layer 108 may be similar to or substantially identical to the formation and material of the debond layer 104 as described in FIG. 1, and thus are not repeated herein. However, the disclosure is not limited thereto; alternatively, the carrier 106 may be different from the carrier 102, and/or the debond layer 108 may be different from the debond layer 104.

After debonding the carrier 102, an additional planarizing process is performed on the semiconductor dies 100 (from the surfaces S1) and the insulating encapsulation 200 (from the surface S200) to accessibly reveal the connecting vias 150 of the semiconductor dies 100, in some embodiments. For example, a portion of the insulating encapsulation 200 and a portion of the protection layer 160 of each of the semiconductor dies 100 are removed, and each of the semiconductor dies 100 has a front surface FS that is a flat and planar surface. In some embodiments, the front surfaces FS of the semiconductor dies 100 are substantially leveled with a surface S200t of the insulating encapsulation 200. For example, the front surfaces FS of the semiconductor dies 100 are substantially coplanar to the surface S200t of the insulating encapsulation 200. As shown in FIG. 4, the semiconductor dies 100 (e.g., the front surfaces FS thereof) are accessibly revealed by the insulating encapsulation 200, for example. During the planarizing process, the connecting vias 150 of one or more than one of the semiconductor dies 100 may also be planarized. In some embodiments, the planarizing process may include a grinding process, a CMP process, an etching process, or combinations thereof. The etching process may include a dry etching, a wet etching, or a combination thereof. After the planarizing process, a cleaning process may be optionally performed, for example to clean and remove the residue generated from the planarizing process. However, the disclosure is not limited thereto, and the planarizing process may be performed through any other suitable method. As illustrated in FIG. 4, the front surface FS of each of the semiconductor dies 100 may include surfaces S150 of the connecting vias 150 and a surface S160 of the protection layer 160. In the case, the surfaces S150 of the connecting vias 150 are substantially leveled with (e.g., substantially coplanar to) the surface S160 of the protection layer 160. Up to here, a first tier of dies included in the semiconductor structure 10A is manufactured, where the insulating encapsulation 200 and the semiconductor dies 100 (including the semiconductor dies 100A, 100B, and 100C) laterally encapsulated in the insulating encapsulation 200 are collectively considered as a first tier T1 (depicted in FIG. 8) of the semiconductor structure 10A. The first tier T1 may also referred to as a first tier of (semiconductor) dies, and the semiconductor dies 100 (including the semiconductor dies 100A, 100B, and 100C) of the first tier T1 may be referred to as a first plurality of semiconductor dies. In some embodiments, the first tier T1 includes the semiconductor dies 100A, 100B, 100C (each including 110, 120, 130, 140, 150, and 160) and the insulting encapsulation 200. Alternatively, the first tier T1 may include a wafer (not shown) including a plurality of semiconductor dies 100 (each including 110, 120, 130, 140, 150, 160) physically interconnected therebetween, instead of discrete and separated semiconductor dies 100 encapsulated in the insulating encapsulation 200; the disclosure is not limited.

Referring to FIG. 4, in some embodiments, a routing structure with a plurality of vertical stacked via structures on the first insulating encapsulation to electrically connect the routing structure and the first plurality of semiconductor dies is formed, in accordance with a step S1040 of the method in FIG. 12. In some embodiments, a redistribution circuit structure 300A is formed over the first tier T1 to provide a horizontal electrical communication among the semiconductor dies 100 (including 100A, 100B, and 100C) included in the first tier T1, a vertical electrical communication to the semiconductor dies 100 (including 100A, 100B, and 100C) included in the first tier T1 and later-formed components/devices (e.g., included in T2 in FIG. 8) overlying thereto, and a horizontal electrical communication among the later-formed components/devices (e.g., included in T2 in FIG. 8) overlying thereto. In some embodiments, the redistribution circuit structure 300A includes one or more than one dielectric layer 310 (e.g., a dielectric layer 310-1, a dielectric layer 310-2, a dielectric layer 310-3, a dielectric layer 310-4, and a dielectric layer 310-5) and one or more than one patterned conductive layer 320 (e.g., a patterned conductive layer 320-1, a patterned conductive layer 320-2, a patterned conductive layer 320-3, a patterned conductive layer 320-4, and a patterned conductive layer 320-5) arranged in alternation therewith, a passivation layer 330 disposed atop a stacked structure of the one or more than one dielectric layer 310 and the one or more than one patterned conductive layer 320, and a connecting layer 340 disposed in the passivation layer 330 and exposed therefrom. However, in the disclosure, the number of the dielectric layers 310 and the number of the patterned conductive layers 310 are not limited to FIG. 4. For example, the number of the dielectric layers 310 and the number of the patterned conductive layers 320 may be independently one or more than one based on the demand and the design layout.

In some embodiments, the dielectric layer 310-1 is formed, but not limit to, by: forming a first dielectric material blanket layer over the first tier T1; forming a second dielectric material blanket layer over the first dielectric material blanket layer; patterning the second dielectric material blanket layer to form a plurality of trench openings (not labeled) in the second dielectric material blanket layer and thereby forming the dielectric material 310b; and patterning the first dielectric material blanket layer to form a plurality of via openings (not labeled) in the first dielectric material blanket layer and thereby forming the dielectric material 310a. The trench openings in the dielectric material 310b may independently spatially communicated with one via opening (if any) underlying thereto and formed in the dielectric material 310a to form a dual damascene opening (not labeled). That is, the dual damascene openings each include a narrower via hole and a wider trench hole over the narrower via hole, for example. In some embodiments, the dielectric materials 310a and 310b may include silicon oxide, silicon nitride, polymer or a combination thereof, and are formed by depositing a dielectric material through a suitable process such as spin coating, CVD or the like, and then performing a planarization process on the dielectric material. In some embodiments, the function and material of the dielectric materials 310a and 310b may be the same or different from each other, the disclosure is not limited thereto.

In an alternative embodiment, an additional dielectric material (not shown) may be presented between the dielectric materials 310a and 310b, between the dielectric material 310a and the connecting vias 150/the protection layer 160, or a combination thereof. The material and formation of the additional dielectric material may be substantially the same or similar to the dielectric materials 310a and 310b, and thus are not repeated herein. The function and material of the dielectric materials 310a, 310b and the additional dielectric material may be the same or different from each other, the disclosure is not limited thereto. For example, the additional dielectric material is silicon nitride and used for an etching stop layer, while the dielectric materials 310a and 310b are silicon oxide and used for bonding. In the alternative embodiment of which the additional dielectric material (serving as the etching stop layer) is located between the dielectric materials 310a and 310b and between the dielectric material 310a and the connecting vias 150/the protection layer 160, the additional dielectric material between dielectric material 310a and 310b is also etched to form the trench holes exposing the dielectric material 310a by an etching process, and the additional dielectric material between dielectric material 310a and the connecting vias 150/the protection layer 160 is also etched to form the via holes exposing the connecting vias 150 by an etching process. During the etching processes of the additional dielectric materials, an etching selectivity of the additional dielectric materials to the dielectric materials 310a and/or 310b is significantly high, so that the etching processes of the additional dielectric materials are performed without removal of the dielectric materials 310a and 310b (e.g., the removal of the dielectric materials 310a and 310b is significantly small and thus is negligible).

After the formation of the dielectric layer 310-1, the patterned conductive layer 320-1 is formed thereon, in some embodiments. As shown in FIG. 4, the patterned conductive layer 320-1 is located in the dielectric layer 310-1, where the patterned conductive layer 320-1 is electrically connected to the connecting vias 150 accessibly exposed by the dielectric layer 310-1, for example. In some embodiments, an illustrated top surface of the patterned conductive layer 320-1 is substantially leveled with and substantially coplanar to an illustrated top surface of the dielectric layer 310-1. In some embodiments, the patterned conductive layer 320-1 is formed, but not limit to, by: filling a conductive material in the via holes and trench holes formed in the dielectric layer 310-1 by deposition (e.g., CVD, physical vapor deposition (PVD), or the like) or plating (e.g., with a metallic seed layer conformally formed over the dielectric layer 310-1 prior to filling the conductive material); and planarizing the conductive material to remove excess the conductive material located on the dielectric layer 310-1 and thereby forming the patterned conductive layer 320-1. For example, as shown in FIG. 4, the patterned conductive layer 320-1 includes a plurality of conductive vias 320v in the via openings formed in the dielectric layer 310a and a plurality of conductive trenches 320t in the trench openings formed in the dielectric 310b. The material of the patterned conductive layer 320-1 includes copper, nickel, aluminum, gold, silver, tungsten, an alloy thereof, or a combination thereof, for example. The dual damascene openings may be formed through a trench first process. In some embodiments, the patterned conductive layers 320-1 may be formed by dual-damascene method.

In some embodiments, the dielectric layer 310-2, the patterned conductive layer 320-2, the dielectric layer 310-3, the patterned conductive layer 320-3, the dielectric layer 310-4, the patterned conductive layer 320-4, the dielectric layer 310-5, and the patterned conductive layer 320-5 are sequentially formed over the patterned conductive layer 320-1. For example, the patterned conductive layer 320-2 is electrically connected to the patterned conductive layer 320-1 exposed by the dielectric layer 310-2, the patterned conductive layer 320-3 is electrically connected to the patterned conductive layer 320-2 exposed by the dielectric layer 310-3, the patterned conductive layer 320-4 is electrically connected to the patterned conductive layer 320-3 exposed by the dielectric layer 310-4, and the patterned conductive layer 320-5 is electrically connected to the patterned conductive layer 320-4 exposed by the dielectric layer 310-5. The formation and material of each of the dielectric layers 310-2, 310-3, 310-4, and 310-5 are similar to or substantially identical to the formation and the material of the dielectric layer 310-1, and the formation and material of each of the patterned conductive layers 320-2, 320-3, 320-4, and 320-5 are similar to or substantially identical to the formation and the material of the patterned conductive layer 320-1, and thus are not repeated herein. In the disclosure, the dielectric layer 310-1 and the patterned conductive layer 320-1 are together referred to as a first build up layer of the redistribution circuit structure 300A, the dielectric layer 310-2 and the patterned conductive layer 320-2 are together referred to as a second build up layer of the redistribution circuit structure 300A, the dielectric layer 310-3 and the patterned conductive layer 320-3 are together referred to as a third build up layer of the redistribution circuit structure 300A, the dielectric layer 310-4 and the patterned conductive layer 320-4 are together referred to as a fourth build up layer of the redistribution circuit structure 300A, and the dielectric layer 310-5 and the patterned conductive layer 320-5 are together referred to as a fifth build up layer of the redistribution circuit structure 300A. However, in the disclosure, the number of the build-up layers included in the redistribution circuit structure 300A is are not limited to the drawings, and may be more than five or less than five as long as the redistribution circuit structure 300A can provide a sufficient routing function to the semi-conductor dies 100 included in the first tier T1 (and/or later-formed die tiers).

In some embodiments, the conductive vias 320v are considered as vertical electrical structures extending along a vertical direction (e.g., the direction Z), and the conductive trenches 320v are considered as horizontal electrical struc-tures extending along a horizontal direction (e.g., the direc-tion X and/or Y such in the X-Y plane). The patterned conductive layers 310-1, 320-2, 320-3, 320-4, and 320-5 may be referred to as metallization layer, routing layers, or redistribution layers of the redistribution circuit structure 300A, where the conductive vias 320v may be referred to as metallization vias (or via portions), routing vias (or via portions), or redistribution vias (or via portions), and the conductive trenches 320t may be referred to as metallization lines (or line portions), routing lines (or line portions), or redistribution lines (or line portions). Owing to patterned conductive layers 310-1, 320-2, 320-3, 320-4, and 320-5, the redistribution circuit structure 300A is capable of providing vertically and horizontally electrical connections between components/devices disposed at two opposite sides of the redistribution circuit structure 300A in the direction Z.

After forming the build-up layers of redistribution circuit structure 300A, the passivation layer 330 and the connecting layer 340 are sequentially formed over the conductive layer 320-5, for example. In some embodiments, the connecting layer 340 is electrically connected to the patterned conduc-tive layer 320-5 exposed by the passivation layer 330. The formation and material of the passivation layer 330 are similar to or substantially identical to the formation and material of the dielectric layer 310-1, the formation and material of the connecting layer 340 are similar to or substantially identical to the formation and material of the patterned conductive layer 320-1, and thus are not repeated herein. For example, as shown in FIG. 4, the passivation layer 330 includes a passivation layer 330a having a plu-rality of via openings penetrating therethrough and a passi-vation layer 330b disposed thereon and having a plurality of trench openings penetrating therethrough and spatially com-municated with the via openings formed in the passivation layer 330a, and the connecting layer 340 includes a plurality of conductive vias 340v in the via openings formed in the passivation layer 330a and a plurality of conductive trenches 340t in the trench openings formed in the passivation layer 330b. The passivation layer 330 and the connecting layer 340 may together be referred to as a bonding structure of the redistribution circuit structure 300A.

During forming the build-up layers and the bonding structure of redistribution circuit structure 300A, a plurality of stacked vias SV may be also formed in the redistribution circuit structure 300A, as shown in FIG. 4. In the case, a portion of the patterned conductive layer 320-1, a portion of the patterned conductive layer 320-2, a portion of the patterned conductive layer 320-3, a portion of the patterned conductive layer 320-4, a portion of the patterned conduc-tive layer 320-5, and a portion of the connecting layer 340, which are lined up and stacked on each other in the direction Z, together constitute one stacked via SV. As shown in FIG. 4, a sidewall of each stacked via SV is in a wave-shape form, for example. In some embodiments, the cross-section shapes of the patterned conductive layers 320-1 to 320-5 and the cross-section shapes of the connecting layer 340 included in each stacked via SV includes a T-shape sharing one central line. In the case, the patterned conductive layers 320-1 to 320-5 and the connecting layer 340 included in each stacked via SV are stacked on each other in a concentric manner. In some embodiments, the stacked vias SV penetrate through the redistribution circuit structure 300A. In the case, the stacked vias SV continuously extend from an illustrated bottom surface of the redistribution circuit structure 300A to an illustrated top surface of the redistribution circuit struc-ture 300A in the direction Z. As shown in FIG. 4, a thickness of each of the stacked vias SV is substantially equal to a thickness of the redistribution circuit structure 300A, as well. In the disclosure, the stacked vias SV may be consid-ered as vertical electrical structures of the redistribution circuit structure 300A. The stacked vias SV may be referred to as a vertical stacking connection structures or vertical stacked via structures of the redistribution circuit structure 300A. Owing to the stacked vias SV, the redistribution circuit structure 300A can has better vertically electrical connection between components/devices disposed at two opposite sides of the redistribution circuit structure 300A in the direction Z.

Referring to FIG. 5, in some embodiments, a plurality of through vias are formed in the routing structure on the first insulating encapsulation to electrically connect the plurality of through vias and the first plurality of semiconductor dies, in accordance with a step S1060 of the method in FIG. 12. In some embodiments, a plurality of first through holes (not labeled) are formed in the redistribution circuit structure 300A to at least partially expose the connecting vias 150 of one or more than one of the semiconductor dies 100 included in the first tier T1. For example, the first through holes penetrate through the passivation layer 330 and the dielectric layers 310 of the redistribution circuit structure 300A. In some embodiments, the first through holes are formed by a laser drilling process. For example, in FIG. 5, only two first through holes are shown for illustrative purposes, however the disclosure is not limited thereto. The number of the first through holes may be one or more than one depending on the demand. In some embodiments, if considering the first through holes are opening holes with substantially round-shaped cross-section (from the top view on the X-Y plane), and each of the first through holes includes a slant sidewall (from the cross-sectional view depicted in FIG. 5). For example, each of the first through holes has a top opening (at the illustrated top surface of the redistribution circuit struc-ture 300A) having a top diameter and a bottom opening (at the illustrated bottom surface of the redistribution circuit structure 300A) having a bottom diameter, and the top diameter is greater than the bottom diameter. Alternatively, the first through holes may independently include a vertical sidewall, where the top diameter may be substantially equal to the bottom diameter. The cross-sectional shape of the first through holes on the X-Y plane is, for example, elliptical, oval, tetragonal, octagonal or any suitable polygonal shape.

After the formation of the first through holes, a plurality of through vias 350 (also denoted as 'TV') are formed in the first through holes to be electrically connected to the con-necting vias 150 of the semiconductor dies 100 included in the first tier T1 exposed by the first through holes penetrating the passivation layer 330 and the dielectric layers 310. Each of the through via 350 includes a conductive via 354 and a liner 352 lining a sidewall of the conductive via 354 in a respective one first through hole, in some embodiments. In the case, sidewalls of the first through holes are lined with the liners 352, where the conductive vias 354 are separated from the passivation layer 330 and the dielectric layers 310 of the redistribution circuit structure 300A through the liners 352. A material of the liners 352 may include a barrier material, such as TiN, Ta, TaN, Ti, or the like. A material of the conductive vias 354 may include a conductive material, such as copper, tungsten, aluminum, silver, combinations thereof, or the like. In alternative embodiments, a dielectric liner (not shown) (e.g., silicon nitride, an oxide, a polymer, a combination thereof, etc.) may be further optionally formed between the liners 352 and the passivation layer 330 and the dielectric layers 310 of the redistribution circuit structure 300A. In some embodiments, the conductive vias 354, the liners 352 and the optional dielectric liner are formed by respectively depositing the dielectric material, the barrier material, and the conductive material in the first through holes penetrating through the passivation layer 330 and the dielectric layers 310 of the redistribution circuit structure 300A, removing excess materials on the illustrated top surface of the redistribution circuit structure 300A. Alternatively, the liners 352 may be omitted. As illustrated in FIG. 5, the through vias 350 are disposed in the redistribution circuit structure 300A, and continuously extend from the illustrated top surface of the redistribution circuit structure 300A to the illustrated bottom surface of the redistribution circuit structure 300, for example. Owing to the through vias 350, the vertically electrical connection of the redistribution circuit structure 300A can be greatly improved. The through vias 350 may be electrically isolated and physically separated from the patterned conductive layers 320 and the connecting layers 340. In the disclosure, the through vias 350 may be also considered as vertical electrical structures of the redistribution circuit structure 300A. The through vias 350 may be referred to as a vertical connection structures or vertical via structures of the redistribution circuit structure 300A. Alternatively, the through vias 350 may be electrically connected to the patterned conductive layers 320 and the connecting layers 340 by connecting to at least one of the patterned conductive layers 320 and the connecting layers 340. The disclosure is not limited thereto.

Referring to FIG. 6, in some embodiments, a second plurality of semiconductor dies are provided and bonded on the routing structure, in accordance with a step S1070 of the method in FIG. 12. In some embodiments, a second plurality of semiconductor dies including a semiconductor die 100D, a semiconductor die 100E, and a semiconductor die 100F are provided. In the disclosure, the semiconductor dies 100D, 100E, 100F are also referred to as semiconductor dies 100. The details of the semiconductor dies 100 are previously discussed in FIG. 1, and thus are not repeated for brevity. As shown in FIG. 6, only three semiconductor dies 100 (e.g., the semiconductor dies 100D, 100E, 100F) are presented as the second plurality of semiconductor dies for illustrative purposes, however, it should be noted that the number of the semiconductor dies 100 used as the second plurality of semiconductor dies may be one, two, three, or more than three, the disclosure is not limited thereto.

In some embodiments, the semiconductor dies 100 (e.g., the semiconductor dies 100D, 100E, 100F) are picked and placed over the redistribution circuit structure 300A. For example, as shown in FIG. 6, the semiconductor dies 100D, 100E, 100F are arranged aside to each other along the direction X. In other embodiments, the semiconductor dies 100D, 100E, 100F are arranged aside to each other along the direction Y, and is perpendicular to the stacking direction Z. Alternatively, the semiconductor dies 100D, 100E, 100F are arranged in the form of a matrix, such as a N×N array or a N×M array (N, M>0, N may or may not be equal to M) along the direction X and the direction Y. In some embodiments, the semiconductor dies 100 (e.g., the semiconductor dies 100D, 100E, 100F) are placed on the redistribution circuit structure 300A for bonding by pick-and-place process.

For example, the semiconductor dies 100 (e.g., the semiconductor dies 100D, 100E, 100F) are bonded to the redistribution circuit structure 300A by bonding process including both of a metal-to-metal bonding and a dielectric-to-dielectric bonding. For example, each of the semiconductor dies 100 (e.g., the semiconductor dies 100D, 100E, 100F) is disposed on (e.g., in physical contact with) and electrically connected to the redistribution circuit structure 300A (e.g., the connecting layer 340 and/or the through vias 350). In some embodiments, as shown in FIG. 6 and FIG. 13A, surfaces S150 of the connecting vias 150 in each of the semiconductor dies 100 (e.g., the semiconductor dies 100D, 100E, 100F) and an illustrated top surface of the connecting layer 340 (e.g., the conductive trenches 340t) and/or illustrated top surfaces of the through vias 350 exposed from the passivation layer 330 (e.g., the passivation layer 330b) of the redistribution circuit structure 300A prop against each other and are bonded together through direct metal-to-metal bonding (such as a copper-to-copper bonding). In addition, as shown in FIG. 6 and FIG. 13A, the surface S160 of the protection layer 160 in each of the semiconductor dies 100 (e.g., the semiconductor dies 100D, 100E, 100F) and an illustrated top surface of the passivation layer 330 (e.g., the passivation layer 330b) of the redistribution circuit structure 300A prop against each other and are bonded together through a direct dielectrics-to-dielectrics bonding (such as an oxide-to-oxide bonding, a nitride-to-nitride bonding, or an oxide-to-nitride bonding), for example. In such embodiments, a bonding interface IF1 between the semiconductor dies 100 (e.g., the semiconductor dies 100D, 100E, 100F) and the redistribution circuit structure 300A includes a dielectric-to-dielectric bonding interface (e.g., an oxide-to-oxide bonding interface, a nitride-to-nitride bonding interface, or an oxide-to-nitride bonding interface) and a metal-to-metal interface (e.g., a copper-to-copper bonding interface). In the disclosure, the bonding interface IF1 may be referred to as a hybrid bonding interface. As illustrated in FIG. 6, for example, the semiconductor dies 100 (e.g., the semiconductor dies 100D, 100E, 100F) are electrically connected to the redistribution circuit structure 300A.

It should be noted that bonding methods described above are merely examples and are not intended to be limiting. An offset may present between sidewalls of the connecting vias 150 and a sidewall of the connecting layer 340 (e.g., sidewalls of the conductive trenches 340t) underlying thereto, see FIG. 13A. Since one of the connecting vias 150 and the conductive trenches 340t may have a larger bonding surface than the other one, the direct metal-to-metal bonding may still be achieved even if misalignment occurs, thereby the reliability of electrical connections between the semiconductor dies 100 (e.g., the semiconductor dies 100D, 100E, 100F) and the redistribution circuit structure 300A can be ensured. With such, for certain embodiments, either the protection layer 160 immediately adjacent to the connecting vias 150 is bonded to a portion of each of the conductive trenches 340t (e.g., a dielectric-to-metal bonding), or the passivation layer 330b immediately adjacent to the conductive trenches 340t is bonded to a portion of each of the connecting vias 150 (e.g., a dielectric-to-metal bonding).

However, the disclosure is not limited thereto; alternatively, the semiconductor dies 100 (e.g., the semiconductor dies 100D, 100E, 100F) may be bonded to the redistribution circuit structure 300A by flip-chip bonding, see FIG. 13B. In the alternative embodiments, a plurality of joints 800A are presented between the connecting vias 150 of each of the semiconductor dies 100 (e.g., the semiconductor dies 100D, 100E, 100F) and the conductive trenches 340t of the connecting layer 340 and/or the through vias 350 of the redistribution circuit structure 300A for mechanically connecting and electrically connecting the semiconductor dies 100 (e.g., the semiconductor dies 100D, 100E, 100F) and the redistribution circuit structure 300A. The joints 800A includes micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. When solder is used, the solder may include either eutectic solder or non-eutectic solder. The solder may include lead or be lead-free, and may include Sn—Ag, Sn—Cu, Sn—Ag—Cu, or the like. When solder is used, the joints 800A may be referred to as solder joints or solder regions. In such alternative embodiments, an underfill (not show) may be optionally applied to wrap sidewalls of the joints 800A to ensure the adhesion strength between the semiconductor dies 100 (e.g., the semiconductor dies 100D, 100E, 100F) and the redistribution circuit structure 300A).

As shown in FIG. 6, the redistribution circuit structure 300A is electrically connected to the semiconductor dies 100 (including 100A, 100B, and 100C) underlying thereto and is also electrically connected to the semiconductor dies 100 (e.g., the semiconductor dies 100D, 100E, 100F) overlying thereto. Owing to the redistribution circuit structure 300A, the semiconductor dies 100A, 100B, and 100C underlying the redistribution circuit structure 300A are electrically communicated to one another, the semiconductor dies 100D, 100E, 100F overlying the redistribution circuit structure 300A are electrically communicated to one another, the horizontal electrical connection among the semiconductor dies 100A, 100B, and 100C and the horizontal electrical connection among the semiconductor dies 100D, 100E, and 100F are achieved. Besides, owing to the redistribution circuit structure 300A, the semiconductor dies 100A, 100B, and 100C underlying the redistribution circuit structure 300A are electrically communicated to the semiconductor dies 100D, 100E, 100F overlying the redistribution circuit structure 300A, the vertical electrical connection among the semiconductor dies 100A, 100B, and 100C and the semiconductor dies 100D, 100E, and 100F are achieved.

Figure 7:
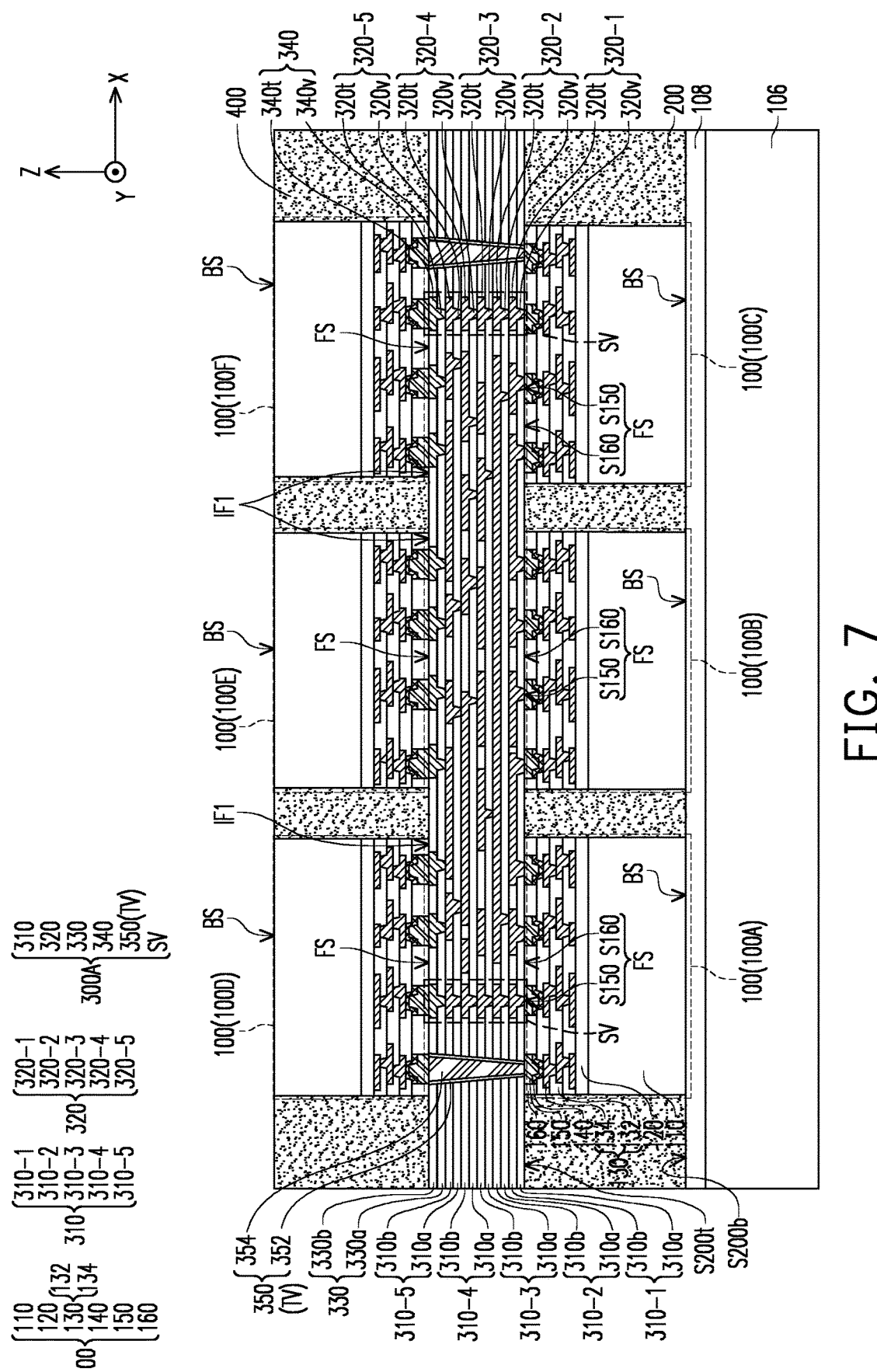

Referring to FIG. 7, in some embodiments, the second plurality of semiconductor dies are encapsulated in a second insulating encapsulation, in accordance with a step S1080 of the method in FIG. 12. In some embodiments, the semiconductor dies 100 (e.g., the semiconductor dies 100D, 100E, 100F) are encapsulated in an insulating encapsulation 400. The insulating encapsulation 400 may be formed by, but not limited to, conformally forming an insulating encapsulation material on the semiconductor dies 100 (e.g., the semiconductor dies 100D, 100E, 100F), where the semiconductor dies 100 (e.g., the semiconductor dies 100D, 100E, 100F) and the redistribution circuit structure 300A exposed by the semiconductor dies 100 (e.g., the semiconductor dies 100D, 100E, 100F) are completely covered by the insulating encapsulation material; and a planarizing process is performed on the insulating encapsulation material to form the insulating encapsulation 400 exposing the semiconductor dies 100 (e.g., the semiconductor dies 100D, 100E, 100F). The formation and material of the insulating encapsulation material is similar to or substantially identical to the formation and material of the insulating encapsulation 200 as described in FIG. 2, the planarizing process has been previous discussed in FIG. 3, and thus are not repeated herein for brevity.

In some embodiments, bottom surfaces BS of the semiconductor dies 100 (e.g., the semiconductor dies 100D, 100E, 100F) are substantially leveled with an illustrated top surface of the insulating encapsulation 400. For example, the bottom surfaces BS of the semiconductor dies 100 (e.g., the semiconductor dies 100D, 100E, 100F) are substantially coplanar to the illustrated top surface of the insulating encapsulation 400. The sidewalls (not labeled) of the semiconductor dies 100 (e.g., the semiconductor dies 100D, 100E, 100F) and the redistribution circuit structure 300A exposed by the semiconductor dies 100 (e.g., the semiconductor dies 100D, 100E, 100F) are covered by the insulating encapsulation 400, in some embodiments. For example, an illustrated bottom surface of the insulating encapsulation 400 is substantially leveled with (e.g., substantially coplanar to) front surface FS of the of the semiconductor dies 100 (e.g., the semiconductor dies 100D, 100E, 100F). Up to here, a second tier of dies included in the semiconductor structure 10A is manufactured, where the insulating encapsulation 400 and the semiconductor dies 100 (including the semiconductor dies 100D, 100E, 100F) laterally encapsulated in the insulating encapsulation 400 are collectively considered as a second tier T2 (depicted in FIG. 8) of the semiconductor structure 10A. The second tier T2 may also referred to as a second tier of (semiconductor) dies, and the semiconductor dies 100 (including the semiconductor dies 100D, 100E, 100F) of the second tier T2 may be referred to as a second plurality of semiconductor dies. In some embodiments, the redistribution circuit structure 300A is disposed between the first tier T1 and the second tier T2 to provide a horizontal electrical communication among the semiconductor dies 100 included in the first tier T1, a horizontal electric communication among the semiconductor dies 100 included in the second T2, and a vertical electrical communication to the semiconductor dies 100 included in the first tier T1 and the second tier T2. Alternatively, the second tier T2 may include a wafer (not shown) including a plurality of semiconductor dies 100 (each including 110, 120, 130, 140, 150, 160) physically interconnected therebetween and multiple through vias 500 disposed in the wafer, instead of discrete and separated semiconductor dies 100 encapsulated in the insulating encapsulation 400; the disclosure is not limited.

Figure 8:
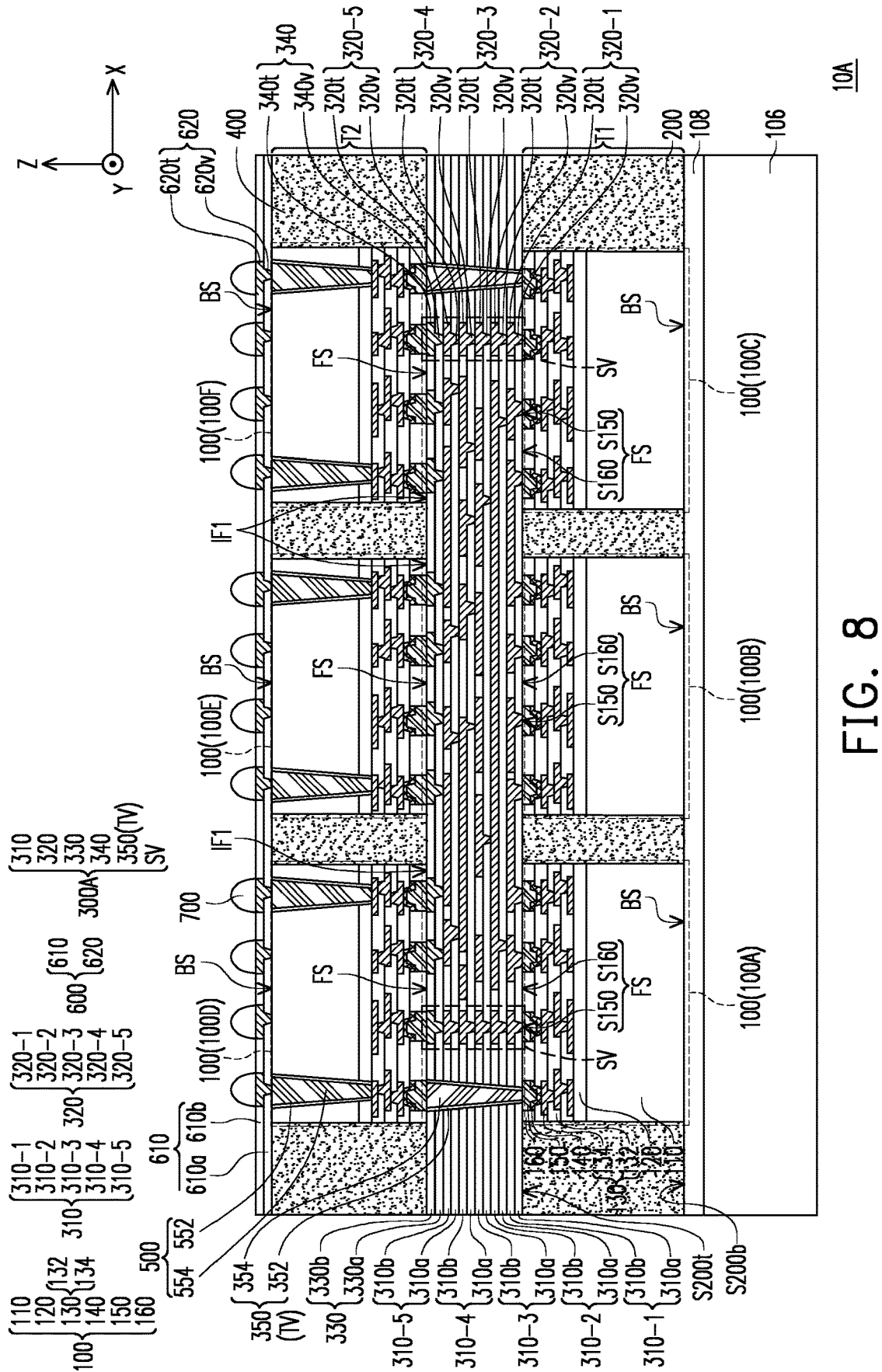

Referring to FIG. 8, in some embodiments, a plurality of vertical conductive structures are formed in the second plurality of semiconductor dies and a plurality of conductive terminals are disposed over the plurality of vertical conductive structures to electrically connect the plurality of vertical conductive structures with the plurality of conductive terminals, in accordance with a step S1090 of the method in FIG. 12. In some embodiments, a plurality of through vias 500 are formed in the semiconductor substrates 110 of the semiconductor dies 100 included in the second tier T2, where the through vias 500 of each of the semiconductor dies 100 included in the second tier T2 are electrically connected to the semiconductor devices of the device layer 120 and the interconnect structure 130. Each of the through via 500 includes a conductive via 554 and a liner 552 lining a sidewall of the conductive via 554. In some embodiments, the through vias 500 are electrically coupled to the redistribution circuit structure 300A through the interconnect structure 130, the connecting pads 140 and the connecting vias 150 of each of the semiconductor dies 100 included in the second tier T2. For simplicity, in FIG. 8, only two through vias 500 are formed in the each of the semiconductor dies 100 included in the second tier T2 for illustrative purposes, however the disclosure is not limited thereto. The number of the through vias 500 formed in each of the semiconductor dies 100 included in the second tier T2 may be more than two, depending on the demand and design requirements.

A material of the liners 552 may include a barrier material, such as TiN, Ta, TaN, Ti, or the like. A material of the conductive vias 554 may include a conductive material, such as copper, tungsten, aluminum, silver, combinations thereof, or the like. In alternative embodiments, a dielectric liner (not shown) (e.g., silicon nitride, an oxide, a polymer, a combination thereof, etc.) may be further optionally formed between the liners 552 and the semiconductor substrates 110 of the semiconductor dies 100 included in the second tier T2. In some embodiments, the conductive vias 554, the liners 552 and the optional dielectric liner are formed by forming a plurality of second through holes in the semiconductor dies 100 included in the second tier T2 (for example, by a laser drilling process), the second through holes penetrate through the semiconductor substrates 110 of the semiconductor dies 100 included in the second tier T2 (with or without further penetrating the device layer 120 of the semiconductor dies 100 included in the second tier T2) to at least partially expose a conductive feature (e.g., the semiconductor device (s) of the device layer 120 and/or the metallization layer 134 in the interconnect structure 130) of the semiconductor dies 100 included in the second tier T2; respectively depositing the dielectric material, the barrier material, and the conductive material in the second through holes; and removing excess materials on the bottom surfaces BS of the semiconductor dies 100 included in the second tier T2. Alternatively, the liners 552 may be omitted. In the top view and the cross-sectional view, the geometric profile of the second through holes may be similar to or identical to the geometric profile of the first through holes as described in FIG. 5, and thus are not repeated herein. As shown in FIG. 8, the through vias 500 are accessibly revealed by the semiconductor substrates 110 of the semiconductor dies 100 included in the second tier T2 and the insulating encapsulation 400, for example.

In some embodiments, the through vias 500 may be considered as part of each of the semiconductor dies 100 included in the second tier T2. In such embodiments, the second tier T2 includes the semiconductor dies 100D, 100E, 100F (each including 110, 120, 130, 140, 150, 160, and 500) and the insulting encapsulation 400. In this aspect, the through vias 500 are formed by using a via-last approach, for example. The through vias 500 may be referred to as through semiconductor vias or through silicon vias (TSVs). Alternatively, the second tier T2 may include a wafer (not shown) including a plurality of semiconductor dies 100 (each including 110, 120, 130, 140, 150, 160, and 500) physically interconnected therebetween, instead of discrete and separated semiconductor dies 100 encapsulated in the insulating encapsulation 400; the disclosure is not limited.

After forming the through vias 500, a passivation layer 610 and a connecting layer 620 are sequentially formed over the second tier T2, where the connecting layer 620 is disposed in the passivation layer 610 and exposed from the passivation layer 610, in some embodiments. For example, the connecting layer 620 is electrically connected to the through vias 500 accessibly revealed by the semiconductor substrates 110 of the semiconductor dies 100 included in the second tier T2 and the insulating encapsulation 400. The formation and material of the passivation layer 610 are similar to or substantially identical to the formation and material of the dielectric layer 310-1, the formation and material of the connecting layer 620 are similar to or substantially identical to the formation and material of the patterned conductive layer 320-1, and thus are not repeated herein. For example, as shown in FIG. 8, the passivation layer 610 includes a passivation layer 610a having a plurality of via openings penetrating therethrough and a passivation layer 610b disposed thereon and having a plurality of trench openings penetrating therethrough and spatially communicated with the via openings formed in the passivation layer 610a, and the connecting layer 620 includes a plurality of conductive vias 620v in the via openings formed in the passivation layer 610a and a plurality of conductive trenches 620t in the trench openings formed in the passivation layer 610b. The passivation layer 610 and the connecting layer 620 may together be referred to as a bonding structure 600.

Continued on FIG. 8, in some embodiments, a plurality of conductive terminals 700 are optionally formed on the bonding structure 600 to be electrically connect to the semiconductor dies 100 included in the first tier T1 and the second tier T2. The conductive terminals 700 are in contact with (e.g., physical connected to) and electrically connected to the connecting layer 620 of the bonding structure 600, as shown in FIG. 8, for example. For example, the conductive terminals 700 includes micro-bumps, metal pillars, ENEPIG formed bumps, C4 bumps (for example, which may have, but not limited to, a size of about 80 μm), a BGA bumps or balls (for example, which may have, but not limited to, a size of about 400 μm), solder balls, or the like. The disclosure is not limited thereto. The numbers of the conductive terminals 700 is not limited to the drawings of the embodiments, and may be selected and designated based on the demand and design requirements. When solder is used, the solder may include either eutectic solder or non-eutectic solder. The solder may include lead or be lead-free, and may include Sn—Ag, Sn—Cu, Sn—Ag—Cu, or the like. The conductive terminals 700 may be referred to as conductive input/output terminals of the semiconductor structure 10A for electrical connection with external components or elements, such as a power source, a capacitor, another semiconductor device, a circuit substrate, an interposer, or the like. The conductive terminals 700 may be omitted. Up to here, the semiconductor structure 10A is manufactured. In the semiconductor structure 10A, owing to the redistribution circuit structure 300A and the through vias 500 and the stacked vias SV embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 10A is improved, thereby enhancing the reliability of the semiconductor structure 10A.

In some embodiments, the conductive terminals 700 are electrically connected to the semiconductor dies 100 included in the second tier T2 through the bonding structure 600. In some embodiments, some of the conductive terminals 700 are electrically connected to the redistribution circuit structure 300A through the bonding structure 600 and the semiconductor dies 100 included in the second tier T2. In some embodiments, some of the conductive terminals 700 are electrically connected to the semiconductor dies 100 included in the first tier T1 through the bonding structure 600, the semiconductor dies 100 included in the second tier T2, and the redistribution circuit structure 300A. In alternative embodiments, a plurality of under-ball metallurgies (UBMs; not shown) may be optionally formed between the conductive terminals 700 and the bonding structure 600 to enhance the adhesion strength between the conductive terminals 700 and the bonding structure 600.

In alternative embodiments, an additional redistribution circuit structure (not shown) is disposed between the second tier T2 and the bonding structure 600 to provide further routing function to the semiconductor dies included in the second tier T2 and the through vias 500, if need. The additional redistribution circuit structure may include one or more dielectric layer and one or more patterned conductive layer arranged in alternation. The formation, material, and configuration of each of the dielectric layer and the patterned conductive layer of the additional redistribution circuit structure may similar to or substantially identical to the formation, material, and configuration of each of the dielectric layer 310-1 and the patterned conductive layer 320-1 of the redistribution circuit structure 300A. The number of the dielectric layer and the number of the patterned conductive layer of the additional redistribution circuit structure are specifically limited and can be selected and designated based on the demand and the design layout.

However, the disclosure is not limited thereto; alternatively, the through vias 350 may be omitted, see the semiconductor structure 10B of FIG. 9. Referring to FIG. 8 and FIG. 9 together, the semiconductor structure 10A depicted in FIG. 8 and the semiconductor structure 10B depicted in FIG. 9 are similar; the difference is that, the semiconductor structure 10B includes a redistribution circuit structure 300B substituting the redistribution circuit structure 300A. For example, the redistribution circuit structure 300B is similar to the redistribution circuit structure 300A, except that the redistribution circuit structure 300B excludes the through vias 350. In the semiconductor structure 10B, owing to the redistribution circuit structure 300B and the stacked vias SV embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 10B is improved, thereby enhancing the reliability of the semiconductor structure 10B. The semiconductor structure 10B depicted in FIG. 9 may be manufactured by the method of FIG. 12 including at least steps S1010, S102, S1030, S1040, S1070, S1080, and S1090. It should be understood that additional processing may occur before, during, and after the illustrated actions of the method of FIG. 12 to complete formation of the semiconductor structure 10B.

Or alternatively, the stacked vias SV may be omitted, see the semiconductor structure 10C of FIG. 10. Referring to FIG. 8 and FIG. 10 together, the semiconductor structure 10A depicted in FIG. 8 and the semiconductor structure 10C depicted in FIG. 10 are similar; the difference is that, the semiconductor structure 10C includes a redistribution circuit structure 300C substituting the redistribution circuit structure 300A. For example, the redistribution circuit structure 300C is similar to the redistribution circuit structure 300A, except that the redistribution circuit structure 300C excludes the stacked vias SV. In the semiconductor structure 10C, owing to the redistribution circuit structure 300C and the through vias 350 embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 10C is improved, thereby enhancing the reliability of the semiconductor structure 10C. The semiconductor structure 10C depicted in FIG. 10 may be manufactured by the method of FIG. 12 including at least steps S1010, S102, S1030, S1050, S1060, S1070, S1080, and S1090. It should be understood that additional processing may occur before, during, and after the illustrated actions of the method of FIG. 12 to complete formation of the semiconductor structure 10C. It is appreciated that the difference between step S1040 and step S1050 of the method is that, in step S1050, there is no stacked vias SV formed.

Or alternatively, the through vias 350 and the stacked vias SV may be omitted, see the semiconductor structure 10D of FIG. 11. Referring to FIG. 8 and FIG. 11 together, the semiconductor structure 10A depicted in FIG. 8 and the semiconductor structure 10D depicted in FIG. 11 are similar; the difference is that, the semiconductor structure 10D includes a redistribution circuit structure 300D substituting the redistribution circuit structure 300A. For example, the redistribution circuit structure 300D is similar to the redistribution circuit structure 300A, except that the redistribution circuit structure 300D excludes the through vias 350 and the stacked vias SV. In the semiconductor structure 10D, owing to the redistribution circuit structure 300D, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured, so that the performance of the semiconductor structure 10D is improved, thereby enhancing the reliability of the semiconductor structure 10D. The semiconductor structure 10D depicted in FIG. 11 may be manufactured by the method of FIG. 12 including at least steps S1010, S102, S1030, S1050, S1070, S1080, and S1090. It should be understood that additional processing may occur before, during, and after the illustrated actions of the method of FIG. 12 to complete formation of the semiconductor structure 10C.

Figure 14:
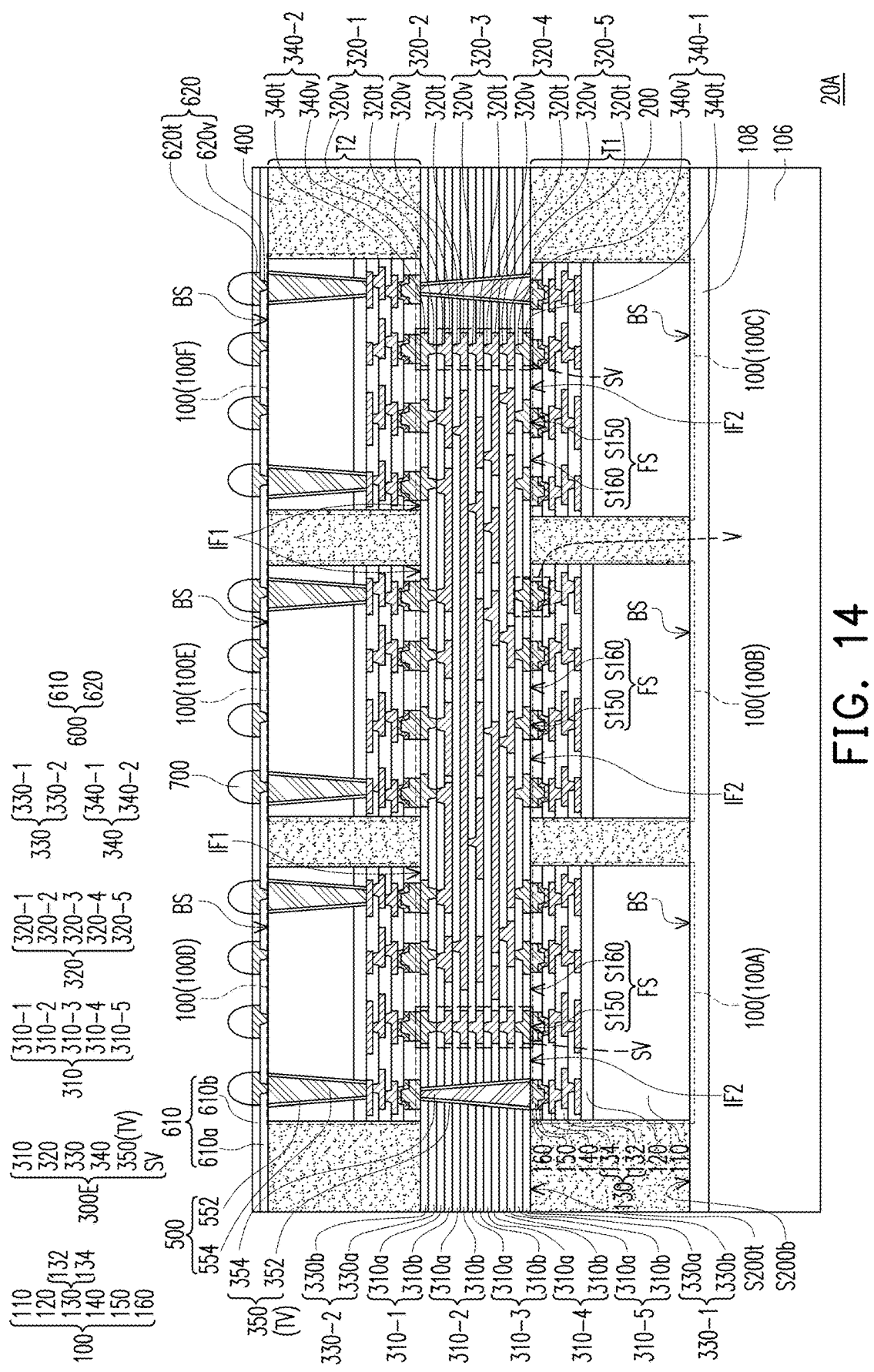
FIG. 14 is a schematic cross-sectional view of a semiconductor structure in accordance with some embodiments of the disclosure.
Figure 15:
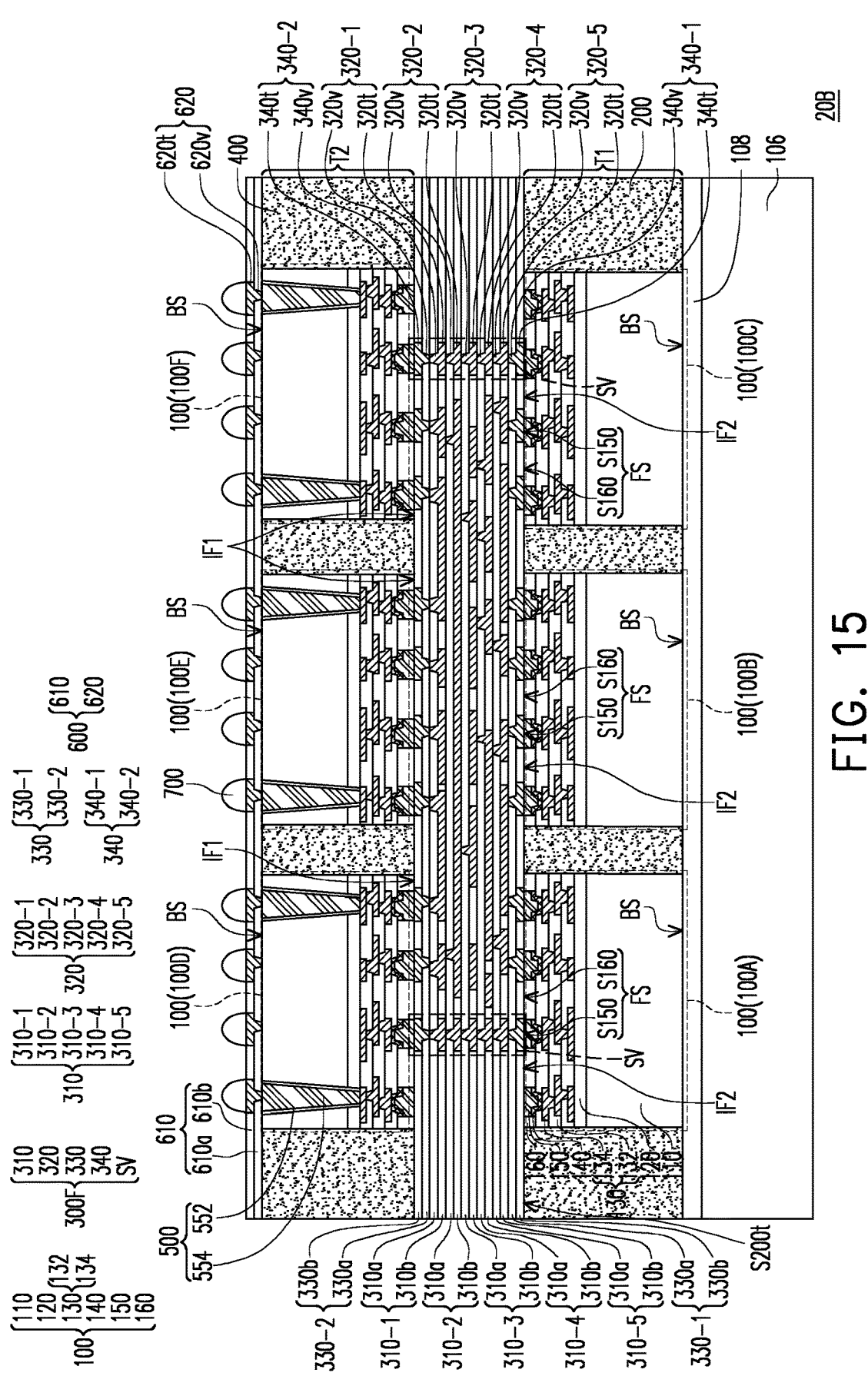
FIG. 15 is a schematic cross-sectional view of a semiconductor structure in accordance with alternative embodiments of the disclosure.
Figure 16:
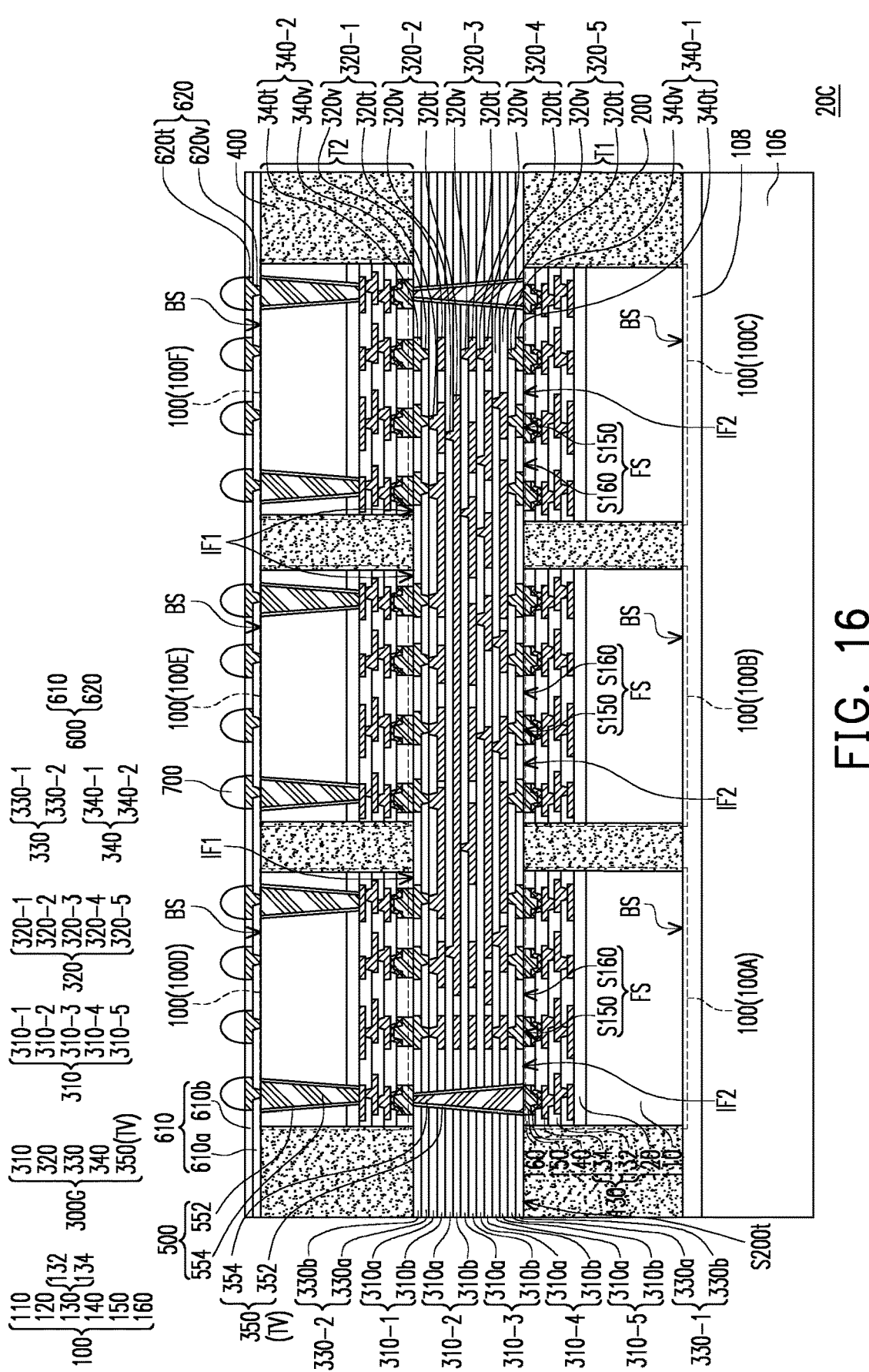
FIG. 16 is a schematic cross-sectional view of a semiconductor structure in accordance with alternative embodiments of the disclosure.
Figure 17:
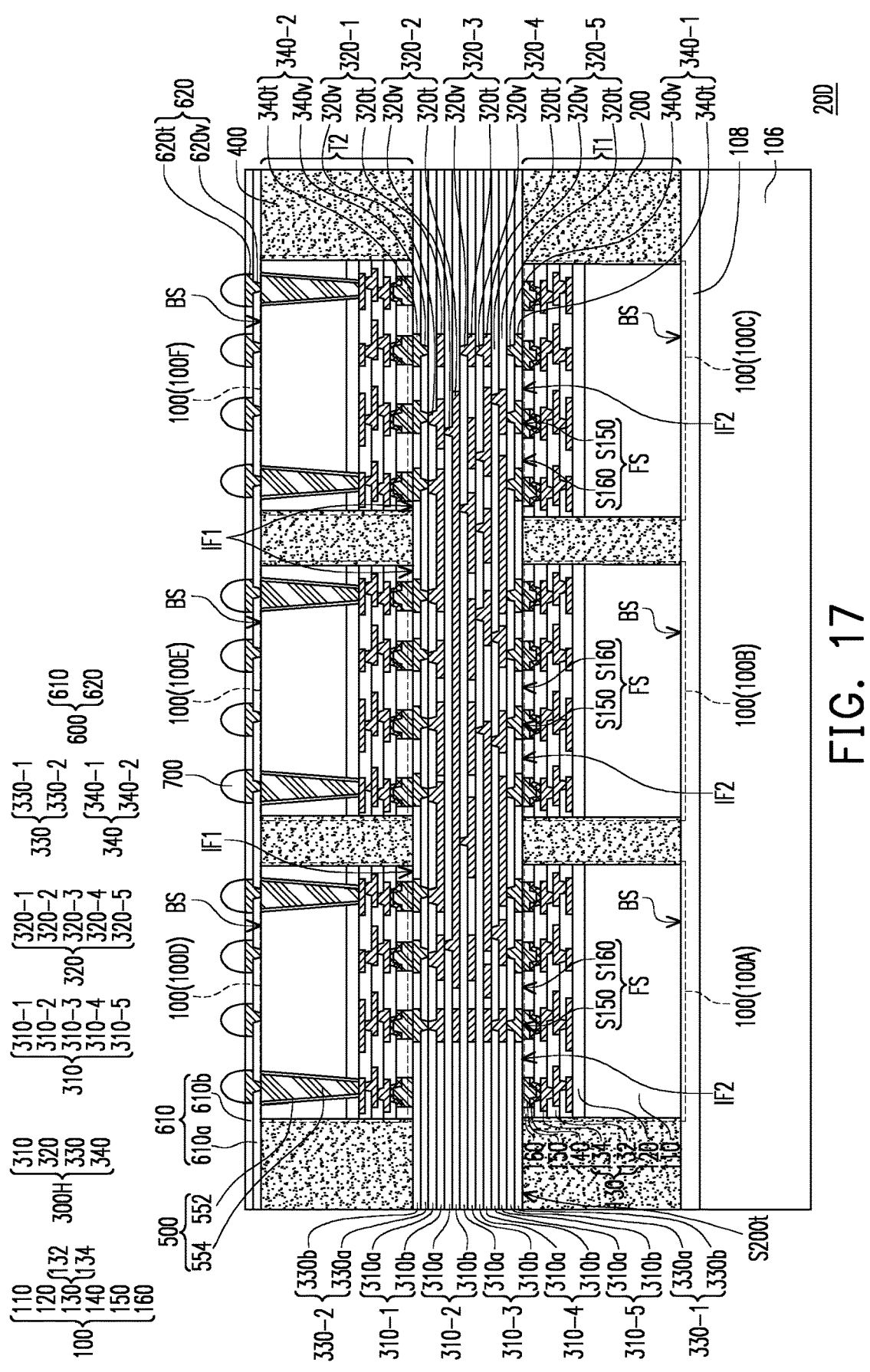
FIG. 17 is a schematic cross-sectional view of a semiconductor structure in accordance with alternative embodiments of the disclosure.
Figure 19B:
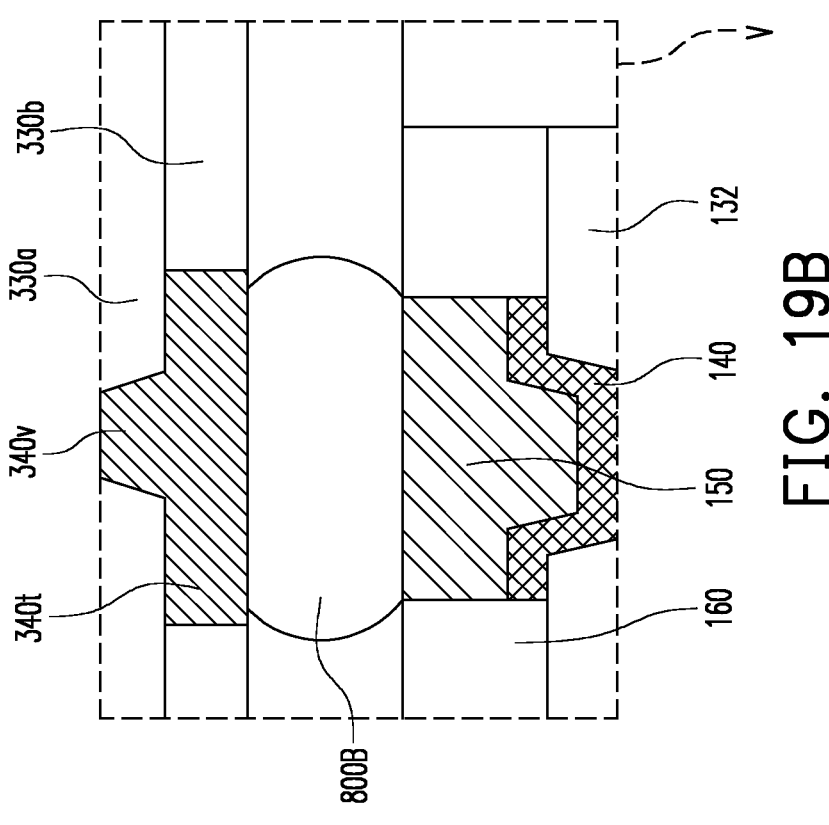
FIG. 19A and FIG. 19B are enlarged and schematic cross-sectional views showing various embodiments of a bonding interface between a semiconductor die and a routing structuring overlapping thereto in accordance with some embodiments of the disclosure.
Figure 19A:
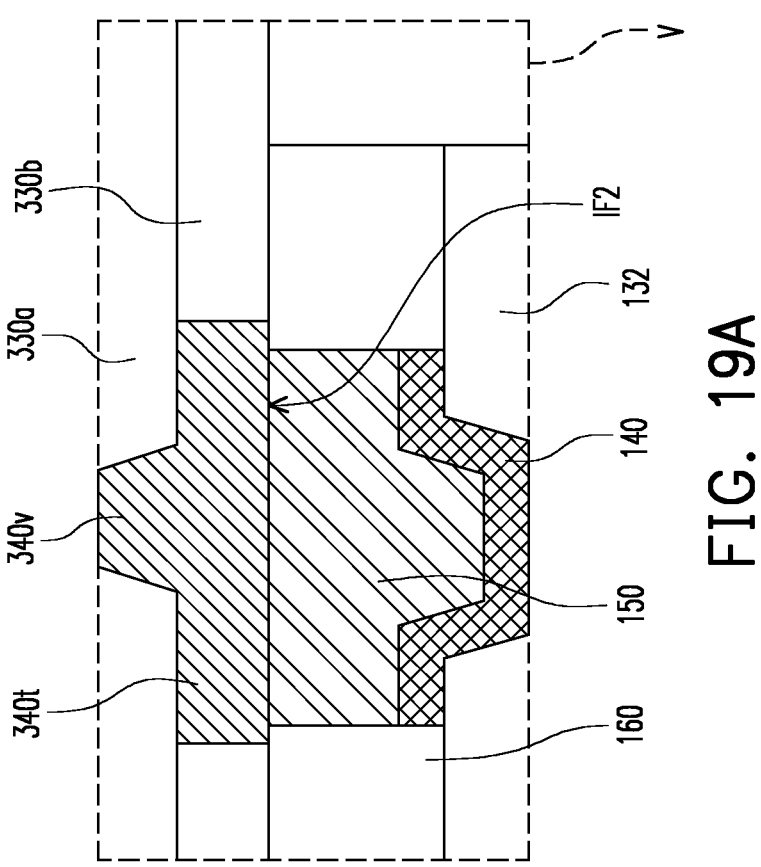

FIG. 14 is a schematic cross-sectional view of a semiconductor structure 20A in accordance with some embodiments of the disclosure. FIG. 15 is a schematic cross-sectional view of a semiconductor structure 20B in accordance with alternative embodiments of the disclosure. FIG. 16 is a schematic cross-sectional view of a semiconductor structure 20C in accordance with alternative embodiments of the disclosure. FIG. 17 is a schematic cross-sectional view of a semiconductor structure 20D in accordance with alternative embodiments of the disclosure. FIG. 18 is a flow chart illustrating a method for manufacturing a semiconductor structure (such as 20A, 20B, 20C, or 20D) in accordance with some embodiments of the disclosure. FIG. 19A and FIG. 19B are enlarged and schematic cross-sectional views showing various embodiments of a bonding interface between a semiconductor die and a routing structuring overlapping thereto in accordance with some embodiments of the disclosure, where the enlarged and schematic cross-sectional views of FIG. 19A and FIG. 19B are outlined in a dashed box V as shown in FIG. 14. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIG. 14, in some embodiments, the semiconductor structure 20A includes a first tier T1 (including a plurality of semiconductor dies 100 (e.g., 100A, 100B, 100C) and an insulating encapsulation 200 laterally encapsulated the semiconductor dies 100 (e.g., 100A, 100B, 100C)), a redistribution circuit structure 300E (including at least one dielectric layer 310 (e.g., 310-1, 310-2, 310-3, 310-4, and 310-5), at least one patterned conductive layer 320 (e.g., 320-1, 320-2, 320-3, 320-4, ad 320-5), at least one passivation layer 330 (e.g., 330-1 and 330-2), at least one connecting layer 340 (e.g., 340-1 and 340-2), a plurality of stacked vias SV, and a plurality of through vis 350) disposed on the first tier T1, a second tier T2 (including a plurality of semiconductor dies 100 (e.g., 1100D, 100E, 100F), an insulating encapsulation 400 laterally encapsulated the semiconductor dies 100 (e.g., 1100D, 100E, 100F), a plurality of through vias 500 embedded in the semiconductor dies 100 (e.g., 1100D, 100E, 100F)), a bonding structure 600, and a plurality of conductive terminals 700. The details of each of the semiconductor dies 100 (e.g., 100A, 100B, 100C, 1100D, 100E, 100F), the insulating encapsulation 200, the dielectric layers 310 (e.g., 310-1, 310-2, 310-3, 310-4, and 310-5), the patterned conductive layers 320 (e.g., 320-1, 320-2, 320-3, 320-4, ad 320-5), the stacked vias SV, the through vis 350, the insulating encapsulation 400, the through vias 500, the bonding structure 600, and the conductive terminals 700 are previously discussed in FIG. 1 through FIG. 8, the formation and material of each of the passivation layers 330-1 and 330-2 and the connecting layers 340-1 and 340-2 are similar to or substantially identical to the formation and material of each of the passivation layer 330 and the connecting layer 340 previously discussed in FIG. 8, and thus are not repeated herein for brevity. In some embodiments, the semiconductor dies 100 (e.g., 100A, 100B, 100C) included in the first tier T1 are bonded to the redistribution circuit structure 300E through the connecting layer 340-1 and the passivation layer 330-1, and the semiconductor dies 100 (e.g., 100D, 100D, 100F) included in the second tier T2 are bonded to the redistribution circuit structure 300E through the connecting layer 340-2 and the passivation layer 330-2. For example, each of the through vias 350 has a top opening (at the illustrated top surface of the redistribution circuit structure 300E) having a top diameter and a bottom opening (at the illustrated bottom surface of the redistribution circuit structure 300E) having a bottom diameter, and the top diameter is less than the bottom diameter.

In some embodiments, the redistribution circuit structure 300E is disposed between the first tier T1 and the second tier T2, the bonding structure 600 is disposed on and electrically connected to the redistribution circuit structure 300E, and the conductive terminals 700 are disposed on and electrically connected to the bonding structure 600, where the bonding structure 600 is disposed between the redistribution circuit structure 300E and the conductive terminals 700, and the second tier T2 is disposed between the redistribution circuit structure 300E and the bonding structure 600. For example, in the redistribution circuit structure 300E, the dielectric layers 310 and the patterned conductive layers 320 are alternatively stacked to each other along the direction Z and sandwiched between the connecting layer 340-1 and the connecting layer 340-2 and between the passivation layer 330-1 and the passivation layer 330-2, the through vias 500 and the stacked vias SV independently penetrate through the dielectric layers 310 and the passivation layers 330. The patterned conductive layers 320 and the connecting layers 340 may be electrically coupled to each other, and the through vias 350 and the stacked vias SV are continuously extend from an illustrated top surface of the redistribution circuit structure 300E to an illustrated bottom surface of the redistribution circuit structure 300E.

In some embodiments, as shown in FIG. 14, surfaces S150 of the connecting vias 150 in each of the semiconductor dies 100 (e.g., the semiconductor dies 100D, 100E, 100F) and an illustrated top surface of the connecting layer 340-2 (e.g., the conductive trenches 340t) and/or illustrated top surfaces of the through vias 350 exposed from the passivation layer 330-2 (e.g., the passivation layer 330b) of the redistribution circuit structure 300E prop against each other and are bonded together through direct metal-to-metal bonding (such as a copper-to-copper bonding). In addition, as shown in FIG. 14, the surface S160 of the protection layer 160 in each of the semiconductor dies 100 (e.g., the semiconductor dies 100D, 100E, 100F) and an illustrated top surface of the passivation layer 330-2 (e.g., the passivation layer 330b) of the redistribution circuit structure 300E prop against each other and are bonded together through a direct dielectrics-to-dielectrics bonding (such as an oxide-to-oxide bonding, a nitride-to-nitride bonding, or an oxide-to-nitride bonding), for example. It should be noted that bonding methods described above are merely examples and are not intended to be limiting. An offset may present between sidewalls of the connecting vias 150 (in T2) and a sidewall of the connecting layer 340-2 (e.g., sidewalls of the conductive trenches 340t) underlying thereto. Since one of the connecting vias 150 and the conductive trenches 340t may have a larger bonding surface than the other one, the direct metal-to-metal bonding may still be achieved even if misalignment occurs, thereby the reliability of electrical connections between the semiconductor dies 100 (e.g., the semiconductor dies 100D, 100E, 100F) and the redistribution circuit structure 300E can be ensured. With such, for certain embodiments, either the protection layer 160 immediately adjacent to the connecting vias 150 is bonded to a portion of each of the conductive trenches 340t (e.g., a dielectric-to-metal bonding), or the passivation layer 330b immediately adjacent to the conductive trenches 340t is bonded to a portion of each of the connecting vias 150 (e.g., a dielectric-to-metal bonding), similar to the configuration shown and discussed in FIG. 13A.

In the case, a bonding interface IF1 between the semiconductor dies 100 (e.g., the semiconductor dies 100D, 100E, 100F) included in the second tier T2 and the redistribution circuit structure 300E includes a dielectric-to-dielectric bonding interface (e.g., an oxide-to-oxide bonding interface, a nitride-to-nitride bonding interface, or an oxide-to-nitride bonding interface) and a metal-to-metal interface (e.g., a copper-to-copper bonding interface). In the disclosure, the bonding interface IF1 may be referred to as a hybrid bonding interface. As illustrated in FIG. 14, for example, the semiconductor dies 100 (e.g., the semiconductor dies 100D, 100E, 100F) are electrically connected to the redistribution circuit structure 300E through the connecting layer 340-2. However, the disclosure is not limited thereto; alternatively, the semiconductor dies 100 (e.g., the semiconductor dies 100D, 100E, 100F) included in the second tier T2 may be bonded to the redistribution circuit structure 300E by flip-chip bonding (for example, using joints 800A), similar to the configuration shown and discussed in FIG. 13B.

In some embodiments, as shown in FIG. 14 and FIG. 19, surfaces S150 of the connecting vias 150 in each of the semiconductor dies 100 (e.g., the semiconductor dies 100A, 100B, 100C) and an illustrated bottom surface of the connecting layer 340-1 (e.g., the conductive trenches 340*t*) and/or illustrated bottom surfaces of the through vias 350 exposed from the passivation layer 330-1 (e.g., the passivation layer 330*b*) of the redistribution circuit structure 300E prop against each other and are bonded together through direct metal-to-metal bonding (such as a copper-to-copper bonding). In addition, as shown in FIG. 14 and FIG. 19A, the surface S160 of the protection layer 160 in each of the semiconductor dies 100 (e.g., the semiconductor dies 100A, 100B, 100C) and an illustrated bottom surface of the passivation layer 330-1 (e.g., the passivation layer 330*b*) of the redistribution circuit structure 300E prop against each other and are bonded together through a direct dielectrics-to-dielectrics bonding (such as an oxide-to-oxide bonding, a nitride-to-nitride bonding, or an oxide-to-nitride bonding), for example. It should be noted that bonding methods described above are merely examples and are not intended to be limiting. An offset may present between sidewalls of the connecting vias 150 (in T1) and a sidewall of the connecting layer 340-1 (e.g., sidewalls of the conductive trenches 340*t*) overlying thereto. Since one of the connecting vias 150 and the conductive trenches 340*t* may have a larger bonding surface than the other one, the direct metal-to-metal bonding may still be achieved even if misalignment occurs, thereby the reliability of electrical connections between the semiconductor dies 100 (e.g., the semiconductor dies 100A, 100B, 100C) and the redistribution circuit structure 300E can be ensured. With such, for certain embodiments, either the protection layer 160 immediately adjacent to the connecting vias 150 is bonded to a portion of each of the conductive trenches 340*t* (e.g., a dielectric-to-metal bonding), or the passivation layer 330*b* immediately adjacent to the conductive trenches 340*t* is bonded to a portion of each of the connecting vias 150 (e.g., a dielectric-to-metal bonding), as shown in FIG. 19A. In the case, a bonding interface IF2 between the semiconductor dies 100 (e.g., the semiconductor dies 100A, 100B, 100C) included in the first tier T1 and the redistribution circuit structure 300E includes a dielectric-to-dielectric bonding interface (e.g., an oxide-to-oxide bonding interface, a nitride-to-nitride bonding interface, or an oxide-to-nitride bonding interface) and a metal-to-metal interface (e.g., a copper-to-copper bonding interface). In the disclosure, the bonding interface IF2 may be referred to as a hybrid bonding interface. As illustrated in FIG. 14, for example, the semiconductor dies 100 (e.g., the semiconductor dies 100A, 100B, 100C) are electrically connected to the redistribution circuit structure 300E through the connecting layer 340-1.

However, the disclosure is not limited thereto; alternatively, the semiconductor dies 100 (e.g., the semiconductor dies 100A, 100B, 100C) may be bonded to the redistribution circuit structure 300E by flip-chip bonding, see FIG. 19B. In the alternative embodiments, a plurality of joints 800B are presented between the connecting vias 150 of each of the semiconductor dies 100 (e.g., the semiconductor dies 100A, 100B, 100C) and the conductive trenches 340*t* of the connecting layer 340-1 and/or the through vias 350 of the redistribution circuit structure 300E for mechanically connecting and electrically connecting the semiconductor dies 100 (e.g., the semiconductor dies 100A, 100B, 100C) and the redistribution circuit structure 300E. The joints 800B includes micro-bumps, metal pillars, ENEPIG formed bumps, C4 bumps (for example, which may have, but not limited to, a size of about 80 μm), a BGA bumps or balls (for example, which may have, but not limited to, a size of about 400 μm), solder balls, or the like. The disclosure is not limited thereto. When solder is used, the solder may include either eutectic solder or non-eutectic solder. The solder may include lead or be lead-free, and may include Sn—Ag, Sn—Cu, Sn—Ag—Cu, or the like. When solder is used, the joints 800B may be referred to as solder joints or solder regions. In such alternative embodiments, an underfill (not show) may be optionally applied to wrap sidewalls of the joints 800B to ensure the adhesion strength between the semiconductor dies 100 (e.g., the semiconductor dies 100A, 100B, 100C) and the redistribution circuit structure 300E).

In the semiconductor structure 20A, owing to the redistribution circuit structure 300E and the through vias 500 and the stacked vias SV embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 20A is improved, thereby enhancing the reliability of the semiconductor structure 20A.

The semiconductor structure 20A depicted in FIG. 14 may be manufactured by a method of FIG. 18 including at least steps S2010, S2030, S2040, S2050, S2060, S2070, S2080, and S2090. It should be understood that additional processing may occur before, during, and after the illustrated actions of the method of FIG. 18 to complete formation of the semiconductor structure 20A. For example, the semiconductor structure 20A may be formed by, but not limited to: forming a routing structure (e.g., 300E) with a plurality of vertical stacked via structures (e.g., SV) over a first carrier (step S2010); forming a plurality of through vias (e.g., 350) in the routing structure (e.g., 300E) (step S2030); providing and bonding a first plurality of semiconductor dies (e.g., 100A, 100B, 100C) over the routing structure (300E) (step S2040); encapsulating the first plurality of semiconductor dies (e.g., 100A, 100B, 100C) in an insulating material (e.g., 200*m*) (step S2050); planarizing the insulating material to form a first insulating encapsulation (e.g., 200) laterally encapsulating the first plurality of semiconductor die (e.g., 100A, 100B, 100C) (step S2060); flipping and bonding the structure to a second carrier and debonding the first carrier from the structure; providing and bonding a second plurality of semiconductor dies (e.g., 100D, 100E, 100F) on the routing structure (300E) (step S2070); encapsulating the second plurality of semiconductor dies (e.g., 100D, 100E, 100E) in a second insulating encapsulation (400) (step S2080); and forming a plurality of vertical conductive structures (e.g., 500) in the second plurality of semiconductor dies (e.g., 100D, 100E, 100F) and disposing a plurality of conductive terminals (700) over the plurality of vertical conductive structures (e.g., 500) to electrically connect the plurality of vertical conductive structures (e.g., 500) with the plurality of conductive terminals (700) (step S2090).

However, the disclosure is not limited thereto; alternatively, the through vias 350 may be omitted, see the semiconductor structure 20B of FIG. 15. Referring to FIG. 14 and FIG. 15 together, the semiconductor structure 20A depicted in FIG. 14 and the semiconductor structure 20B depicted in FIG. 15 are similar; the difference is that, the semiconductor structure 20B includes a redistribution circuit structure 300F substituting the redistribution circuit structure 300E. For example, the redistribution circuit structure 300F is similar to the redistribution circuit structure 300E, except that the redistribution circuit structure 300F excludes the through vias 350. In the semiconductor structure 20B, owing to the redistribution circuit structure 300F and the stacked vias SV embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 20B is improved, thereby enhancing the reliability of the semiconductor structure 20B. The semiconductor structure 20B depicted in FIG. 15 may be manufactured by the method of FIG. 18 including at least steps S2010, S2040, S2050, S2060, S2070, S2080, and S2090. It should be understood that additional processing may occur before, during, and after the illustrated actions of the method of FIG. 18 to complete formation of the semiconductor structure 20B.

Or alternatively, the stacked vias SV may be omitted, see the semiconductor structure 20C of FIG. 16. Referring to FIG. 14 and FIG. 16 together, the semiconductor structure 20A depicted in FIG. 14 and the semiconductor structure 20C depicted in FIG. 16 are similar; the difference is that, the semiconductor structure 20C includes a redistribution circuit structure 300G substituting the redistribution circuit structure 300E. For example, the redistribution circuit structure 300G is similar to the redistribution circuit structure 300E, except that the redistribution circuit structure 300G excludes the stacked vias SV. In the semiconductor structure 20C, owing to the redistribution circuit structure 300G and the through vias 350 embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 20C is improved, thereby enhancing the reliability of the semiconductor structure 20C. The semiconductor structure 20C depicted in FIG. 16 may be manufactured by the method of FIG. 18 including at least steps S2020, S2030, S2040, S2050, S2060, S2070, S2080, and S2090. It should be understood that additional processing may occur before, during, and after the illustrated actions of the method of FIG. 18 to complete formation of the semiconductor structure 20C.

Or alternatively, the through vias 350 and the stacked vias SV may be omitted, see the semiconductor structure 20D of FIG. 17. Referring to FIG. 14 and FIG. 17 together, the semiconductor structure 20A depicted in FIG. 14 and the semiconductor structure 20D depicted in FIG. 17 are similar; the difference is that, the semiconductor structure 20D includes a redistribution circuit structure 300H substituting the redistribution circuit structure 300E. For example, the redistribution circuit structure 300H is similar to the redistribution circuit structure 300E, except that the redistribution circuit structure 300H excludes the through vias 350 and the stacked vias SV. In the semiconductor structure 20D, owing to the redistribution circuit structure 300H, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured, so that the performance of the semiconductor structure 20D is improved, thereby enhancing the reliability of the semiconductor structure 20D. The semiconductor structure 20D depicted in FIG. 17 may be manufactured by the method of FIG. 18 including at least steps S2020, S2030, S2040, S2050, S2060, S2070, S2080, and S2090. It should be understood that additional processing may occur before, during, and after the illustrated actions of the method of FIG. 18 to complete formation of the semiconductor structure 20D.

It is appreciated that step S2010 of FIG. 18 is similar to step S1040 of FIG. 12, step S2020 of FIG. 18 is similar to step S1050 of FIG. 12, step S2030 of FIG. 18 is similar to step S1060 of FIG. 12, step S2040 of FIG. 18 is similar to step S1010 of FIG. 12, step S2050 of FIG. 18 is similar to step S1020 of FIG. 12, step S2060 of FIG. 18 is similar to step S1030 of FIG. 12, step S2070 of FIG. 18 is similar to step S1070 of FIG. 12, step S2080 of FIG. 18 is similar to step S1080 of FIG. 12, and step S2090 of FIG. 18 is similar to step S1090 of FIG. 12, and thus the details are not repeated herein for simplicity.

Figure 20:
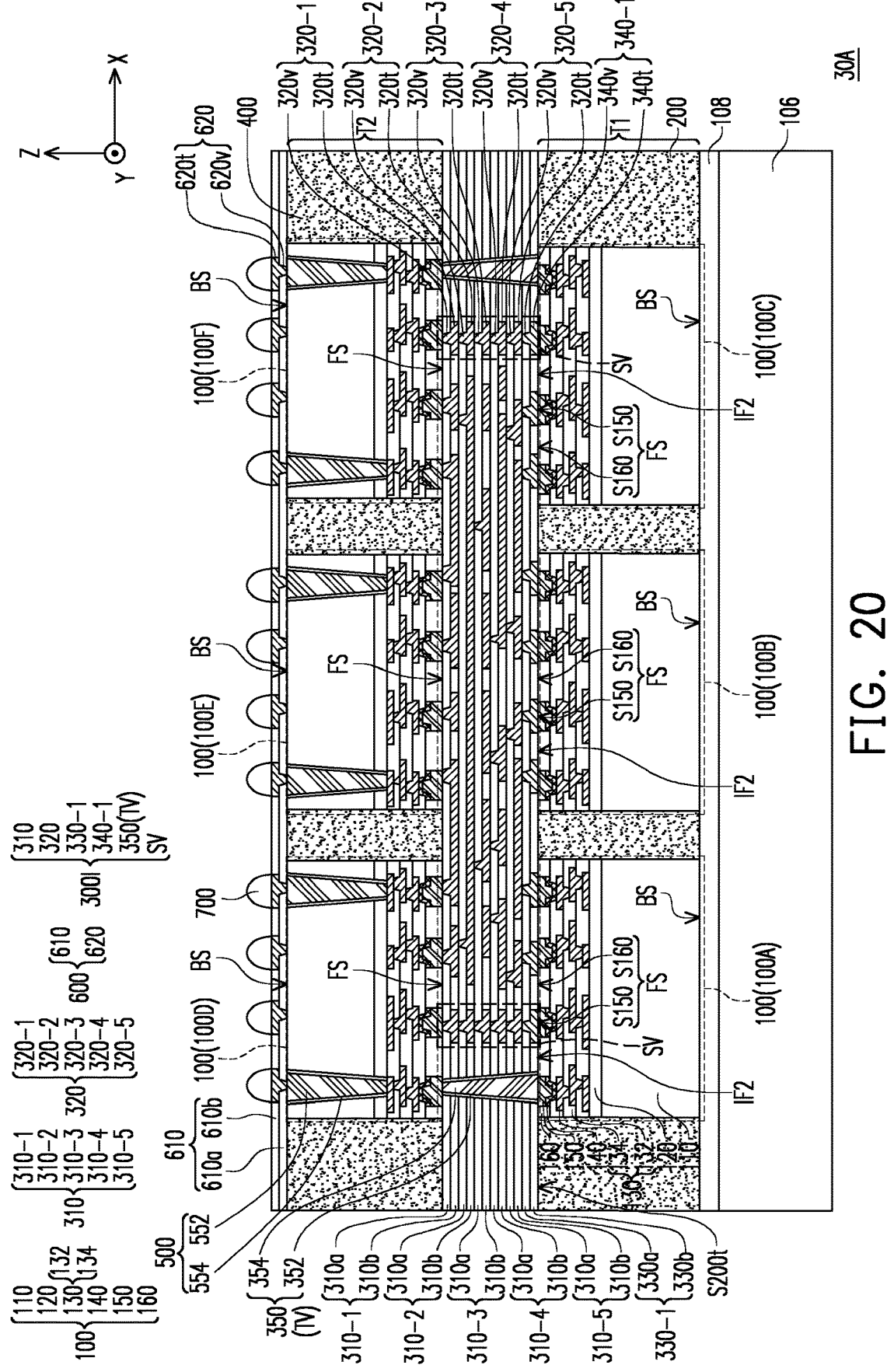
FIG. 20 is a schematic cross-sectional view of a semiconductor structure in accordance with some embodiments of the disclosure.
Figure 21:
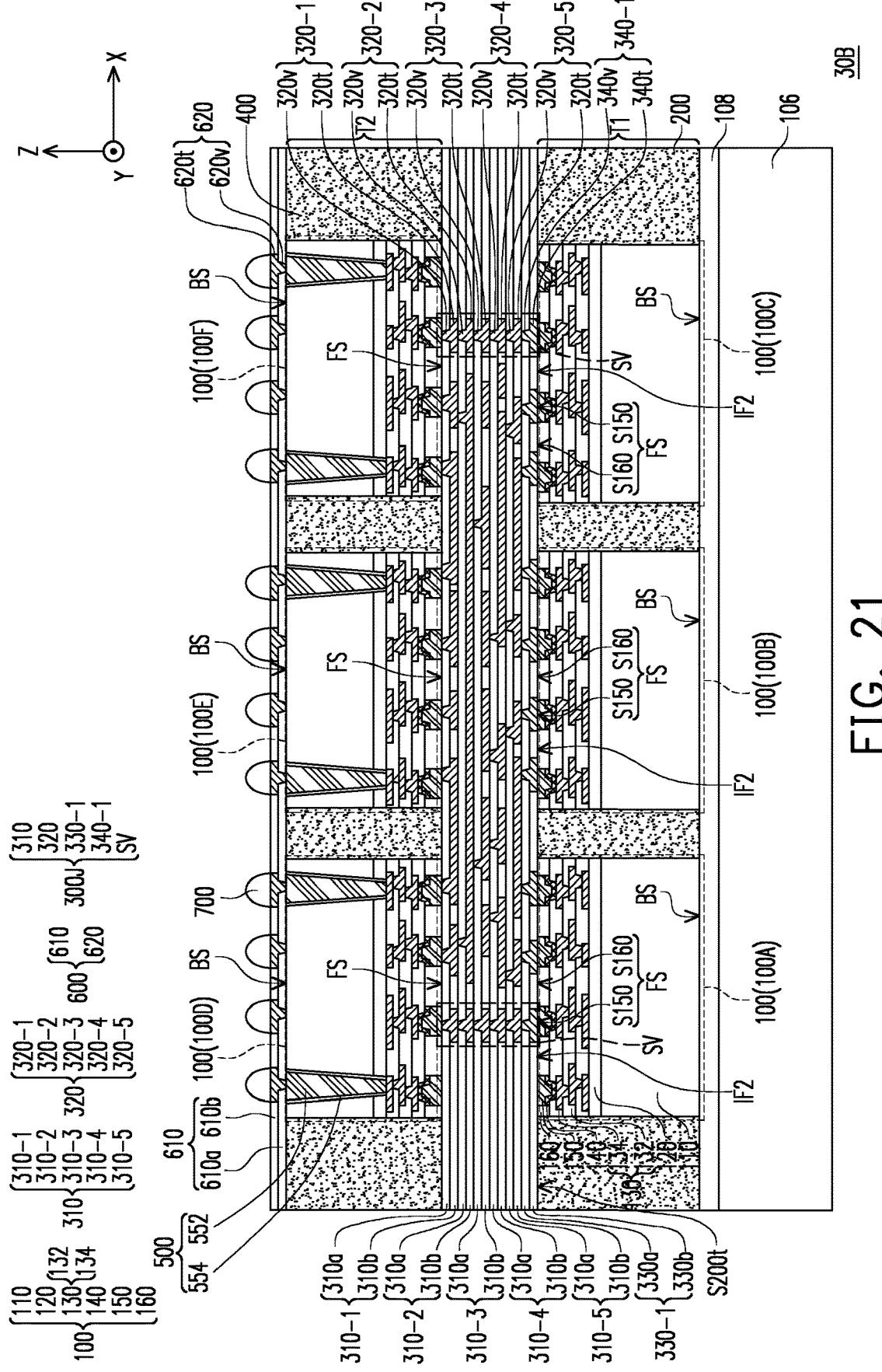
FIG. 21 is a schematic cross-sectional view of a semiconductor structure in accordance with alternative embodiments of the disclosure.
Figure 22:
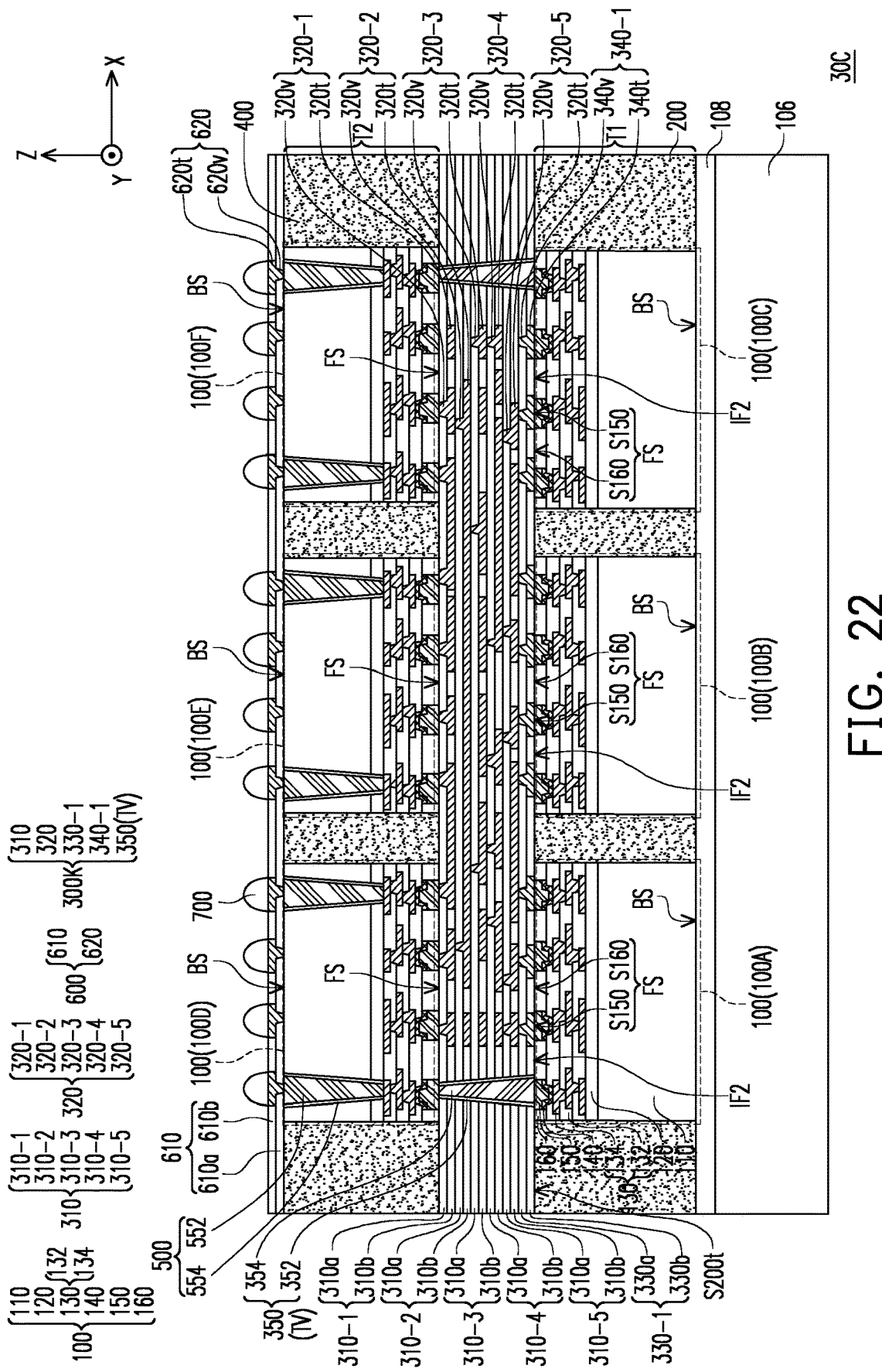
FIG. 22 is a schematic cross-sectional view of a semiconductor structure in accordance with alternative embodiments of the disclosure.
Figure 23:
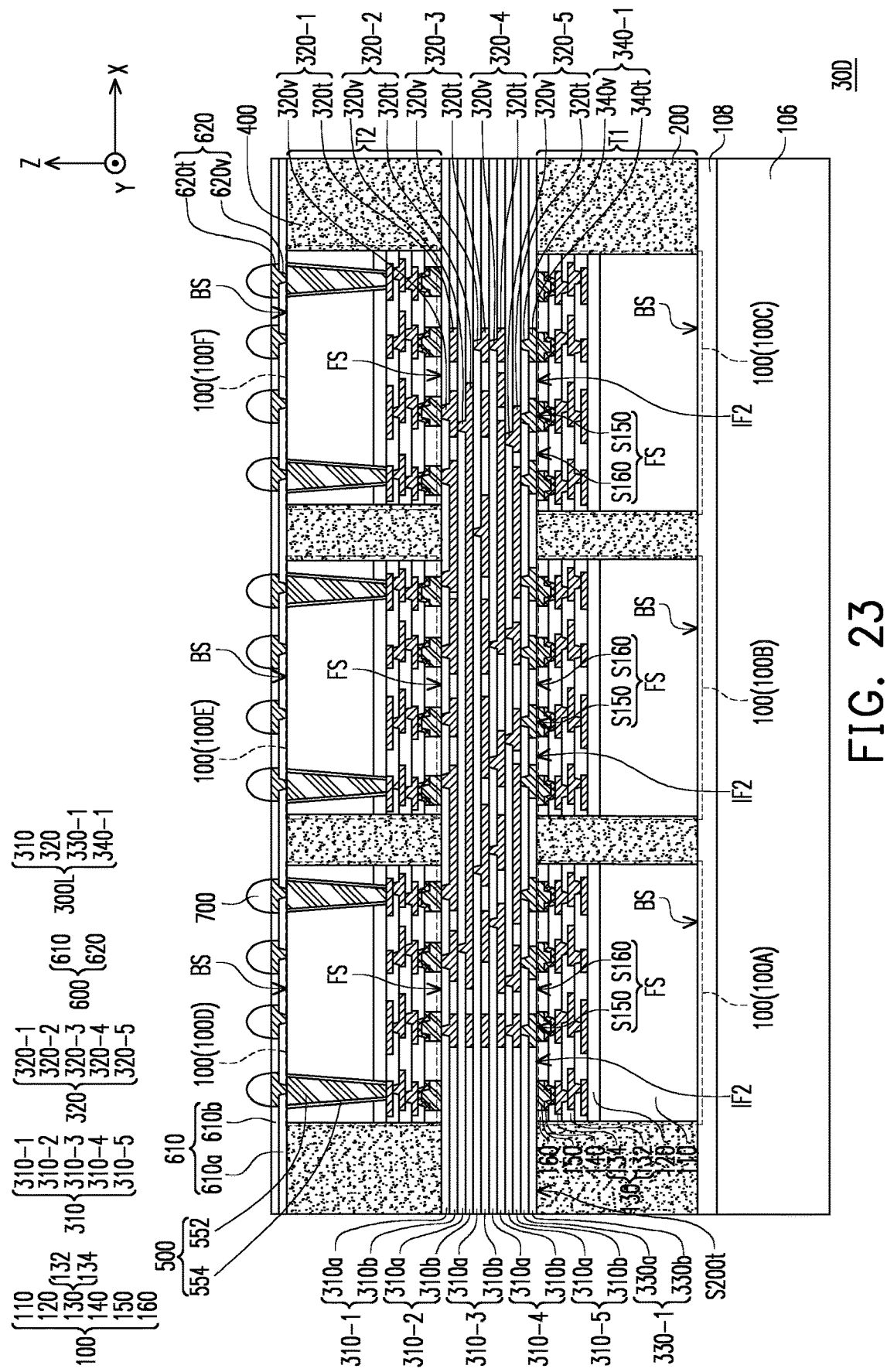
FIG. 23 is a schematic cross-sectional view of a semiconductor structure in accordance with alternative embodiments of the disclosure.

FIG. 20 is a schematic cross-sectional view of a semiconductor structure 30A in accordance with some embodiments of the disclosure. FIG. 21 is a schematic cross-sectional view of a semiconductor structure 30B in accordance with alternative embodiments of the disclosure. FIG. 22 is a schematic cross-sectional view of a semiconductor structure 30C in accordance with alternative embodiments of the disclosure. FIG. 23 is a schematic cross-sectional view of a semiconductor structure 30D in accordance with alternative embodiments of the disclosure. FIG. 24 is a flow chart illustrating a method for manufacturing a semiconductor structure in accordance with some embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIG. 20, in some embodiments, the semiconductor structure 30A includes a first tier T1 (including a plurality of semiconductor dies 100 (e.g., 100A, 100B, 100C) and an insulating encapsulation 200 laterally encapsulated the semiconductor dies 100 (e.g., 100A, 100B, 100C)), a redistribution circuit structure 300I (including at least one dielectric layer 310 (e.g., 310-1, 310-2, 310-3, 310-4, and 310-5), at least one patterned conductive layer 320 (e.g., 320-1, 320-2, 320-3, 320-4, ad 320-5), at least one passivation layer 330 (e.g., 330-1), at least one connecting layer 340 (e.g., 340-1), a plurality of stacked vias SV, and a plurality of through vis 350) disposed on the first tier T1, a second tier T2 (including a plurality of semiconductor dies 100 (e.g., 1100D, 100E, 100F), an insulating encapsulation 400 laterally encapsulated the semiconductor dies 100 (e.g., 1100D, 100E, 100F), a plurality of through vias 500 embedded in the semiconductor dies 100 (e.g., 1100D, 100E, 100F)), a bonding structure 600, and a plurality of conductive terminals 700. The details of each of the semiconductor dies 100 (e.g., 100A, 100B, 100C, 1100D, 100E, 100F), the insulating encapsulation 200, the dielectric layers 310 (e.g., 310-1, 310-2, 310-3, 310-4, and 310-5), the patterned conductive layers 320 (e.g., 320-1, 320-2, 320-3, 320-4, ad 320-5), the stacked vias SV, the through vis 350, the insulating encapsulation 400, the through vias 500, the bonding structure 600, and the conductive terminals 700 are previously discussed in FIG. 1 through FIG. 8, the formation and material of each of the passivation layer 330-1 and the connecting layer 340-1 are similar to or substantially identical to the formation and material of each of the passivation layer 330 and the connecting layer 340 previously discussed in FIG. 8, and thus are not repeated herein for brevity. In some embodiments, the semiconductor dies 100 (e.g., 100A, 100B, 100C) included in the first tier T1 are bonded to the redistribution circuit structure 300I through the connecting layer 340-1 and the passivation layer 330-1, and the semiconductor dies 100 (e.g., 100D, 100D, 100F) included in the second tier T2 are connected to the redistribution circuit structure 300I.

In some embodiments, the redistribution circuit structure 300I is disposed between the first tier T1 and the second tier T2, the bonding structure 600 is disposed on and electrically connected to the redistribution circuit structure 300I, and the conductive terminals 700 are disposed on and electrically connected to the bonding structure 600, where the bonding structure 600 is disposed between the redistribution circuit structure 300I and the conductive terminals 700, and the second tier T2 is disposed between the redistribution circuit structure 300I and the bonding structure 600. For example, in the redistribution circuit structure 300I, the dielectric layers 310 and the patterned conductive layers 320 are alternatively stacked to each other along the direction Z, the passivation layer 330-1 and the connecting layer 340 are disposed on the dielectric layer 310-5 and the patterned conductive layer 320-5, and the through vias 500 and the stacked vias SV independently penetrate through the dielectric layers 310 and the passivation layer 330. The patterned conductive layers 320 and the connecting layer 340 may be electrically coupled to each other, and the through vias 350 and the stacked vias SV are continuously extend from an illustrated top surface of the redistribution circuit structure 300I to an illustrated bottom surface of the redistribution circuit structure 300I. As shown in FIG. 20, the semiconductor dies 100 (e.g., the semiconductor dies 100D, 100E, 100F) included in the second tiers are disposed on (e.g., in physical contact with) and electrically connected to the patterned conductive layer 320-1, for example. For example, each of the through vias 350 has a top opening (at the illustrated top surface of the redistribution circuit structure 300I) having a top diameter and a bottom opening (at the illustrated bottom surface of the redistribution circuit structure 300I) having a bottom diameter, and the top diameter is less than the bottom diameter.

In some embodiments, as shown in FIG. 20, surfaces S150 of the connecting vias 150 in each of the semiconductor dies 100 (e.g., the semiconductor dies 100A, 100B, 100C) and an illustrated bottom surface of the connecting layer 340-1 (e.g., the conductive trenches 340t) and/or illustrated bottom surfaces of the through vias 350 exposed from the passivation layer 330-1 (e.g., the passivation layer 330b) of the redistribution circuit structure 300I prop against each other and are bonded together through direct metal-to-metal bonding (such as a copper-to-copper bonding). In addition, as shown in FIG. 20, the surface S160 of the protection layer 160 in each of the semiconductor dies 100 (e.g., the semiconductor dies 100A, 100B, 100C) and an illustrated bottom surface of the passivation layer 330-1 (e.g., the passivation layer 330b) of the redistribution circuit structure 300I prop against each other and are bonded together through a direct dielectrics-to-dielectrics bonding (such as an oxide-to-oxide bonding, a nitride-to-nitride bonding, or an oxide-to-nitride bonding), for example. It should be noted that bonding methods described above are merely examples and are not intended to be limiting. An offset may present between sidewalls of the connecting vias 150 (in T1) and a sidewall of the connecting layer 340-1 (e.g., sidewalls of the conductive trenches 340t) overlying thereto. Since one of the connecting vias 150 and the conductive trenches 340t may have a larger bonding surface than the other one, the direct metal-to-metal bonding may still be achieved even if misalignment occurs, thereby the reliability of electrical connections between the semiconductor dies 100 (e.g., the semiconductor dies 100A, 100B, 100C) and the redistribution circuit structure 300I can be ensured. With such, for certain embodiments, either the protection layer 160 immediately adjacent to the connecting vias 150 is bonded to a portion of each of the conductive trenches 340t (e.g., a dielectric-to-metal bonding), or the passivation layer 330b immediately adjacent to the conductive trenches 340t is bonded to a portion of each of the connecting vias 150 (e.g., a dielectric-to-metal bonding), similar to the configuration shown and discussed in FIG. 19A.

In the case, a bonding interface IF2 between the semiconductor dies 100 (e.g., the semiconductor dies 100A, 100B, 100C) included in the first tier T1 and the redistribution circuit structure 300I includes a dielectric-to-dielectric bonding interface (e.g., an oxide-to-oxide bonding interface, a nitride-to-nitride bonding interface, or an oxide-to-nitride bonding interface) and a metal-to-metal interface (e.g., a copper-to-copper bonding interface). In the disclosure, the bonding interface IF2 may be referred to as a hybrid bonding interface. As illustrated in FIG. 20, for example, the semiconductor dies 100 (e.g., the semiconductor dies 100A, 100B, 100C) are electrically connected to the redistribution circuit structure 300I through the connecting layer 340-1. However, the disclosure is not limited thereto; alternatively, the semiconductor dies 100 (e.g., the semiconductor dies 100A, 100B, 100C) included in the second tier T1 may be bonded to the redistribution circuit structure 300I by flip-chip bonding (for example, using joints 800B), similar to the configuration shown and discussed in FIG. 19B.

In the semiconductor structure 30A, owing to the redistribution circuit structure 300I and the through vias 500 and the stacked vias SV embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 30A is improved, thereby enhancing the reliability of the semiconductor structure 30A.

The semiconductor structure 30A depicted in FIG. 20 may be manufactured by a method of FIG. 24 including at least steps S3010, S3020, S3030, S3050, S3060, S3070, S3080, and S3090. It should be understood that additional processing may occur before, during, and after the illustrated actions of the method of FIG. 24 to complete formation of the semiconductor structure 30A. For example, the semiconductor structure 30A may be formed by, but not limited to: providing a second plurality of semiconductor dies (e.g., 100D, 100E, and 100E) over a first carrier (step S3010); encapsulating the second plurality of semiconductor dies (e.g., 100D, 100E, and 100E) in a second insulating encapsulation (e.g., 400) (step S3020); flipping and bonding the structure to a second carrier and debonding the first carrier from the structure; performing a planarization process to accessibly reveal the second plurality of semiconductor dies (e.g., 150 of 100D, 100E, and 100E); forming a routing structure (e.g., 300I) with a plurality of vertical stacked via structures (e.g., SV) on the second insulating encapsulation (e.g., 400) to electrically connect the routing structure (e.g., 300I) and the second plurality of semiconductor dies (e.g., 100D, 100E, and 100E) (S3030); forming a plurality of through vias (e.g., 350) in the routing structure (e.g., 300I) on the second insulating encapsulation (e.g., 400) to electrically connect the plurality of through vias (e.g., 350) and the second plurality of semiconductor dies (e.g., 150 of 100D, 100E, and 100E) (step S3050); providing a first plurality of semiconductor dies (e.g., 100A, 100B, and 100C) on the routing structure (e.g., 300I) (step 3060); bonding the first plurality of semiconductor dies (e.g., 100A, 100B, and 100C) to the routing structure (e.g., 300I); encapsulating the first plurality of semiconductor dies (e.g., 100A, 100B, and 100C) in an insulating material (e.g., 200m) (step 3070); planarizing the insulating material (e.g., 200m) to form a first insulating encapsulation (e.g., 200) laterally encapsulating the first plurality of semiconductor die (e.g., 100A, 100B, and 100C) (step 3080); flipping and bonding the structure to a third carrier and debonding the second carrier from the structure; and forming a plurality of vertical conductive structures (e.g. 500) in the second plurality of semiconductor dies (e.g., 100D, 100E, and 100E) and disposing a plurality of conductive terminals (e.g., 700) over the plurality of vertical conductive structures (e.g., 500) to electrically connect the plurality of vertical conductive structures (e.g. 500) with the plurality of conductive terminals (e.g., 700) (step 3090).

However, the disclosure is not limited thereto; alternatively, the through vias 350 may be omitted, see the semiconductor structure 30B of FIG. 21. Referring to FIG. 20 and FIG. 21 together, the semiconductor structure 30A depicted in FIG. 20 and the semiconductor structure 30B depicted in FIG. 21 are similar; the difference is that, the semiconductor structure 30B includes a redistribution circuit structure 300J substituting the redistribution circuit structure 300I. For example, the redistribution circuit structure 300J is similar to the redistribution circuit structure 300I, except that the redistribution circuit structure 300J excludes the through vias 350. In the semiconductor structure 30B, owing to the redistribution circuit structure 300J and the stacked vias SV embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 30B is improved, thereby enhancing the reliability of the semiconductor structure 30B. The semiconductor structure 30B depicted in FIG. 21 may be manufactured by the method of FIG. 24 including at least steps S3010, S3020, S3030, S3060, S3070, S3080, and S3090. It should be understood that additional processing may occur before, during, and after the illustrated actions of the method of FIG. 24 to complete formation of the semiconductor structure 30B.

Or alternatively, the stacked vias SV may be omitted, see the semiconductor structure 30C of FIG. 22. Referring to FIG. 20 and FIG. 22 together, the semiconductor structure 30A depicted in FIG. 20 and the semiconductor structure 30C depicted in FIG. 22 are similar; the difference is that, the semiconductor structure 30C includes a redistribution circuit structure 300K substituting the redistribution circuit structure 300I. For example, the redistribution circuit structure 300K is similar to the redistribution circuit structure 300I, except that the redistribution circuit structure 300K excludes the stacked vias SV. In the semiconductor structure 30C, owing to the redistribution circuit structure 300K and the through vias 350 embedded therein, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured and improved, so that the performance of the semiconductor structure 30C is improved, thereby enhancing the reliability of the semiconductor structure 30C. The semiconductor structure 30C depicted in FIG. 22 may be manufactured by the method of FIG. 24 including at least steps S3010, S3020, S3040, S3050 S3060, S3070, S3080, and S3090. It should be understood that additional processing may occur before, during, and after the illustrated actions of the method of FIG. 24 to complete formation of the semiconductor structure 30C.

Or alternatively, the through vias 350 and the stacked vias SV may be omitted, see the semiconductor structure 30D of FIG. 23. Referring to FIG. 20 and FIG. 23 together, the semiconductor structure 30A depicted in FIG. 20 and the semiconductor structure 30D depicted in FIG. 23 are similar; the difference is that, the semiconductor structure 30D includes a redistribution circuit structure 300L substituting the redistribution circuit structure 300I. For example, the redistribution circuit structure 300L is similar to the redistribution circuit structure 300I, except that the redistribution circuit structure 300L excludes the through vias 350 and the stacked vias SV. In the semiconductor structure 30D, owing to the redistribution circuit structure 300L, a horizontal electrical communication among the semiconductor dies 100 included in the first tier T1, a horizontal electrical communication among the semiconductor dies 100 included in the second tier T2, and a vertical electrical communication between the semiconductor dies 100 included in the first tier T1 and the semiconductor dies 100 included in the second tier T2 are ensured, so that the performance of the semiconductor structure 30D is improved, thereby enhancing the reliability of the semiconductor structure 30D. The semiconductor structure 30D depicted in FIG. 23 may be manufactured by the method of FIG. 24 including at least steps s S3010, S3020, S3040, S3060, S3070, S3080, and S3090. It should be understood that additional processing may occur before, during, and after the illustrated actions of the method of FIG. 24 to complete formation of the semiconductor structure 30D.

It is appreciated that step S3010 of FIG. 24 is similar to step S1070 of FIG. 12, step S3020 of FIG. 24 is similar to step S1080 of FIG. 12, step S3030 of FIG. 24 is similar to step S1040 of FIG. 12, step S3040 of FIG. 24 is similar to step S1050 of FIG. 12, step S3050 of FIG. 24 is similar to step S1060 of FIG. 12, step S3060 of FIG. 24 is similar to step S1010 of FIG. 12, step S3070 of FIG. 24 is similar to step S1020 of FIG. 12, step S3080 of FIG. 24 is similar to step S1030 of FIG. 12, and step S3090 of FIG. 24 is similar to step S1090 of FIG. 12, and thus the details are not repeated herein for simplicity.

In the disclosure, the vertical conductive structures may include the conductive vias 320v of the patterned conductive layers 320, the conductive vias 340v of the connecting layers 340, the through vias 350, and the stacked vias SV. On the other hand, in the disclosure, the horizontal conductive structures may include the conductive trenches 320*t* of the patterned conductive layers 320 and the conductive trenches 340*t* of the connecting layers 340.

Figure 25:
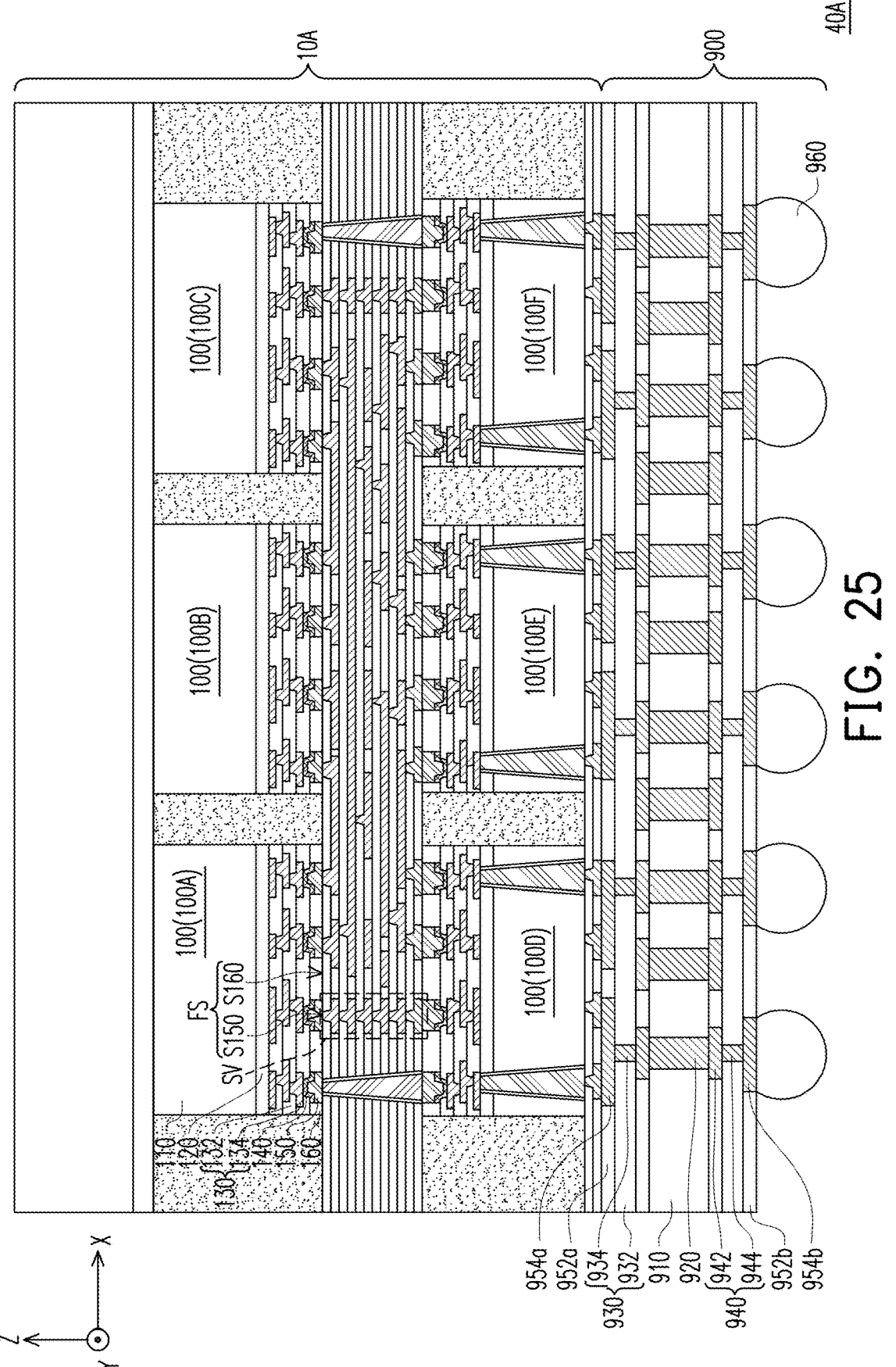
FIG. 25 is a schematic cross-sectional view showing an application of a semiconductor structure in accordance with some embodiments of the disclosure.
Figure 26:
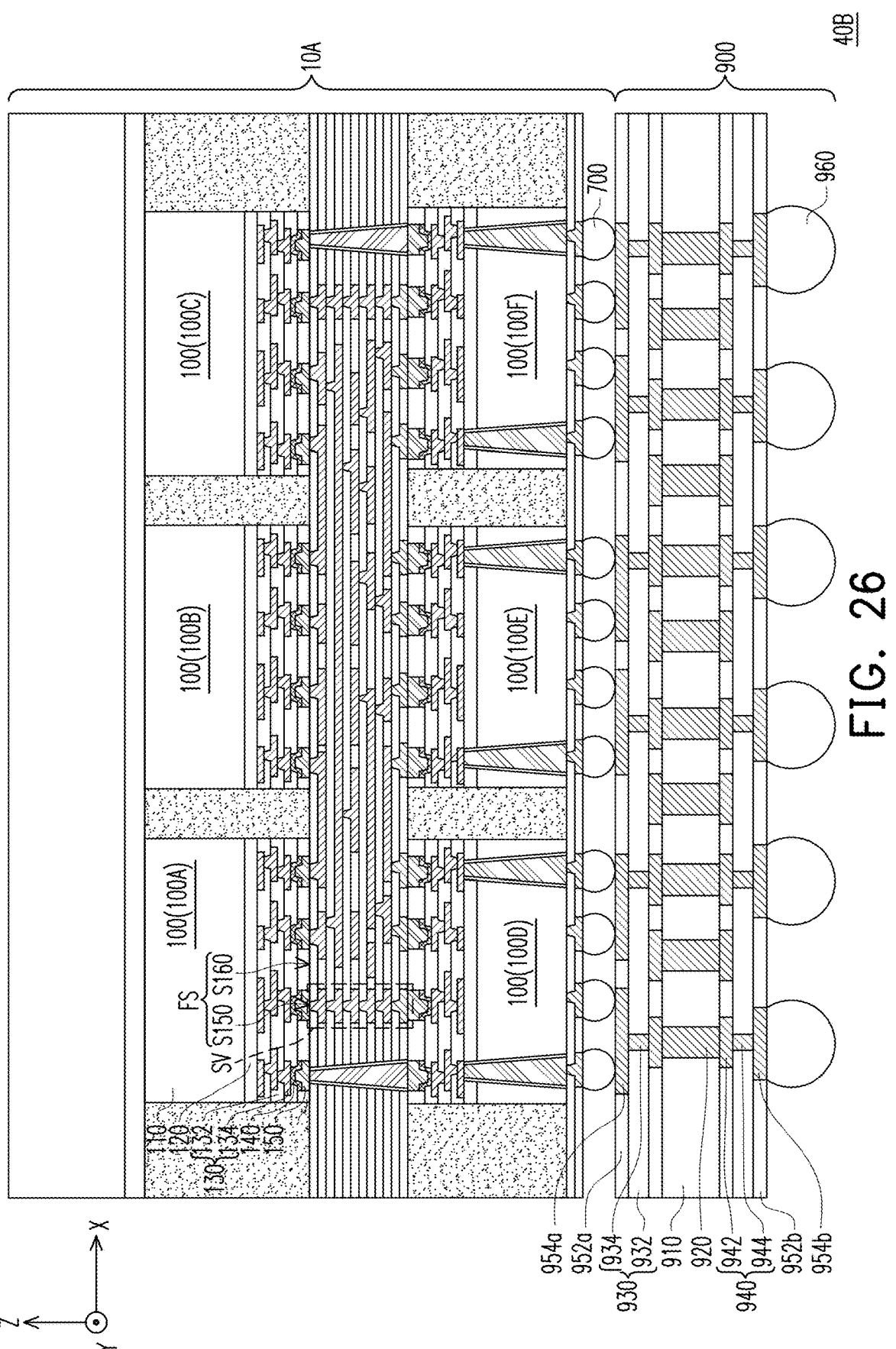
FIG. 26 is a schematic cross-sectional view showing an application of a semiconductor structure in accordance with alternative embodiments of the disclosure.

FIG. 25 is a schematic cross-sectional view showing an application of a semiconductor structure in accordance with some embodiments of the disclosure. FIG. 26 is a schematic cross-sectional view showing an application of a semiconductor structure in accordance with alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIG. 25 and FIG. 26, in some embodiments, a circuit element 900 is provided. The circuit element 900 may be or include an active die, a passive die, or a silicon die, such as a deep-trench capacitor die, a SRAM die, a cache die, a silicon interposer die, a logic die, a DRAM die. For example, the circuit element 900 is or includes silicon interposer die. In some embodiments, the carrier element 900 includes a core portion 910, a plurality of vias 920, a redistribution circuit structure 930, a redistribution circuit structure 940, a solder mask layer 952*a*, a solder mask layer 952*b*, a plurality of bonding pads 954*a*, and a plurality of bonding pads 954*b*. In some embodiments, the circuit element 900 may further includes a plurality of conductive terminals 960.

In some embodiments, the core portion 910 may include a dielectric layer made of PI, PBO, BCB, a nitride such as silicon nitride, an oxide such as silicon oxide, PSG, BSG, boron-doped BPSG, a combination thereof or the like. In the embodiments of which the core portion 910 is the dielectric layer, the vias 920 is through insulator vias penetrating the core portion. In some embodiments, the material of the vias 920, for example, may include copper, copper alloy, or the like, the disclosure is not limited thereto. However, the disclosure is not limited thereto; in some alternative embodiments, the core portion 910 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In the embodiments of which the core portion 910 is the silicon substrate, the vias 920 is through silicon vias penetrating the core portion 910.

In some embodiments, the redistribution circuit structure 930 and the redistribution circuit structure 940 respectively disposed on two opposite sides of the core portion 910, as shown in FIG. 25 and FIG. 26. In some embodiments, the redistribution circuit structure 930 and/or the redistribution circuit structure 940 are electrically connected to the vias 920 penetrating the core portion 910. As shown in FIG. 25 and FIG. 26, the core portion 910 embedded with the vias 920 is located between the redistribution circuit structure 930 and the redistribution circuit structure 940, in some embodiments. Through the vias 920, the redistribution circuit structure 930 and the redistribution circuit structure 940 are electrically connected to each other. In some embodiments, the redistribution circuit structure 930 includes sequentially forming one or more dielectric layers 932 and one or more metallization layers 934 in alternation, where one metallization layer 934 is sandwiched between two dielectric layers 932. As shown in FIG. 25 and FIG. 26, portions of a top surface of a topmost layer of the metallization layers 934 are respectively exposed by openings formed in a topmost layer of the dielectric layers 932 for connecting with other conductive features, and portions of a bottom surface of a bottommost layer of the metallization layers 934 are respectively exposed by openings formed in a bottommost layer of the dielectric layers 932 for connecting with the vias 920. The numbers of the metallization layers and the dielectric layers included in the redistribution circuit structure 930 is not limited thereto, and may be designated and selected based on the demand.

In some embodiments, the redistribution circuit structure 940 includes sequentially forming one or more dielectric layers 942 and one or more metallization layers 944 in alternation, where one metallization layer 944 is sandwiched between two dielectric layers 942. As shown in FIG. 25 and FIG. 26, portions of a top surface of a topmost layer of the metallization layers 944 are respectively exposed by openings formed in a topmost layer of the dielectric layers 942 for connecting with the vias 920, and portions of a bottom surface of a bottommost layer of the metallization layers 944 are respectively exposed by openings formed in a bottommost layer of the dielectric layers 942 for connecting with other conductive features. The numbers of the metallization layers and the dielectric layers included in the redistribution circuit structure 940 is not limited thereto, and may be designated and selected based on the demand. In certain embodiments, the materials of the dielectric layers 932 and the dielectric layers 942 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 932 and the dielectric layers 942 formed by suitable fabrication techniques such as spin-on coating, CVD, PECVD, or the like. The disclosure is not limited thereto. In one embodiment, the materials of the dielectric layers 932 and the dielectric layers 942 may be the same. In an alternative embodiment, the materials of the dielectric layers 932 and the dielectric layers 942 may be different. In certain embodiments, the material of the metallization layers 934 and the metallization layers 944 may be made of conductive materials formed by electroplating or deposition, such as aluminum, titanium, copper, nickel, tungsten, and/or alloys thereof, which may be patterned using a photolithography and etching process. In some embodiments, the metallization layers 934 and the metallization layers 944 may be patterned copper layers or other suitable patterned metal layers. In one embodiment, the materials of the metallization layers 934 and the metallization layers 944 may be the same. In an alternative embodiment, the materials of the metallization layers 934 and the metallization layers 944 may be different.

In some embodiments, the bonding pads 954*a* are disposed on a surface of the redistribution circuit structure 930 and physically connected to the portions of the top surface of the topmost layer of the metallization layers 934 exposed by the openings formed in the topmost layer of the dielectric layers 932, where the bonding pads 954*a* are physically separated from each other through the solder mask layer 952*a* formed on the surface of the redistribution circuit structure 930 with the bonding pads 954*a* disposed thereon. Through the redistribution circuit structure 930, the bonding pads 954*a* are electrically connected to the vias 920 embedded in the core portion 910. In some embodiments, the bonding pads 954*b* are disposed on a surface of the redistribution circuit structure 940 and physically connected to the portions of the bottom surface of the bottommost layer of the metallization layers 944 exposed by the openings formed in the bottommost layer of the dielectric layers 942, where the bonding pads 954b are physically separated from each other through the solder mask layer 952b formed on the surface of the redistribution circuit structure 940 with the bonding pads 954b disposed thereon. In other words, the bonding pads 954a are electrically connected to the redistribution circuit structure 930 and the bonding pads 954b are electrically connected to the redistribution circuit structure 940. Through the redistribution circuit structure 940, the bonding pads 954b are electrically connected to the vias 920 embedded in the core portion 910. In some embodiments, the bonding pads 954a and the bonding pads 954b may include under bump metallurgies (UBMs), however the disclosure is not limited thereto. As shown in FIG. 25 and FIG. 26, the bonding pads 954a and the bonding pads 954b are electrically connected to each other though the vias 920, the redistribution circuit structure 930, and redistribution circuit structure 940, for example.

In an alternative embodiment, the redistribution circuit structure 930 and the redistribution circuit structure 940, one or both, may be omitted from the circuit element 900, the disclosure is not limited thereto. That is, for example, the circuit element 900 may include a core portion 910, a plurality of vias 920, a plurality of bonding pads 954a, a plurality of bonding pads 954b, a solder mask layer 952a, and a solder mask layer 952b.

In some embodiments, the conductive terminals 960 are respectively formed on the bonding pads 954b. As shown in FIG. 25 and FIG. 26, for example, the conductive terminals 960 are physically connected to the bonding pads 954b. In other words, the conductive terminals 960 are electrically connected to the circuit element 900 through the bonding pads 954b. Through the bonding pads 954b, some of the conductive terminals 960 are electrically connected to the package 100. In some embodiments, the conductive terminals 960 includes micro-bumps, metal pillars, ENEPIG formed bumps, C4 bumps (for example, which may have, but not limited to, a size of about 80 µm), a BGA bumps or balls (for example, which may have, but not limited to, a size of about 400 µm), solder balls, or the like. The disclosure is not limited thereto. When solder is used, the solder may include either eutectic solder or non-eutectic solder. The solder may include lead or be lead-free, and may include Sn—Ag, Sn—Cu, Sn—Ag—Cu, or the like. When solder is used, the conductive terminals 960 may be referred to as solder joints or solder regions.

Continued on FIG. 25 and FIG. 26, in some embodiments, the semiconductor structure 10A depicted in FIG. 8 is provided and bonded to the circuit element 900 to form a structure having a stacked structure. The details of the semiconductor structure 10A is described in FIG. 1 to FIG. 8 and FIG. 13A and FIG. 13B in conjunction with the method of FIG. 12, and thus are not repeated herein. In some embodiments, the semiconductor structure 10A is physically connected to the bonding pads 954a of the circuit element 900 by a bonding process including a metal-to-metal bonding and a dielectric-to-dielectric bonding (see a semiconductor structure 40A depicted in FIG. 25) or by a flip chip bonding process (see a semiconductor structure 40B depicted in FIG. 26). In FIG. 25, through bonding the bonding structure 600 (e.g., the passivation layer 610 and the connecting layer 620) to the solder mask layer 925a and the bonding pads 954a, the semiconductor structure 10A is connected to and electrically coupled to the circuit element 900, for example. In this cause, the conductive terminals 700 are omitted from the semiconductor structure 40A. On the other hand, in FIG. 26, the semiconductor structure 10A is connected to and electrically coupled to the circuit element

900 by bonding the conductive terminals 700 to the bonding pads 954a, directly. In alternatively, the semiconductor structure 10A depicted in FIG. 25 and FIG. 26 may be substituted by one of the semiconductor structures 10B-10D, 20A-20D, 30A-30D, 40A-40D, and/or modifications thereof, the disclosure is not limited thereto.

The disclosure is not limited thereto. In some embodiments, the semiconductor structure 10A-10D, 20A-20D, 30A-30D, 40A-40D, and/or modifications thereof may be individually packaged or integrated in different package types or modules, such as an integrated Fan-Out (InFO) package, an InFO package having a Package-on-Package (PoP) structure, a chip-on-wafer-on-substrate (CoWoS) package, a flip chip package of an InFO package, or the like. The disclosure is not limited thereto.

Figure 27:
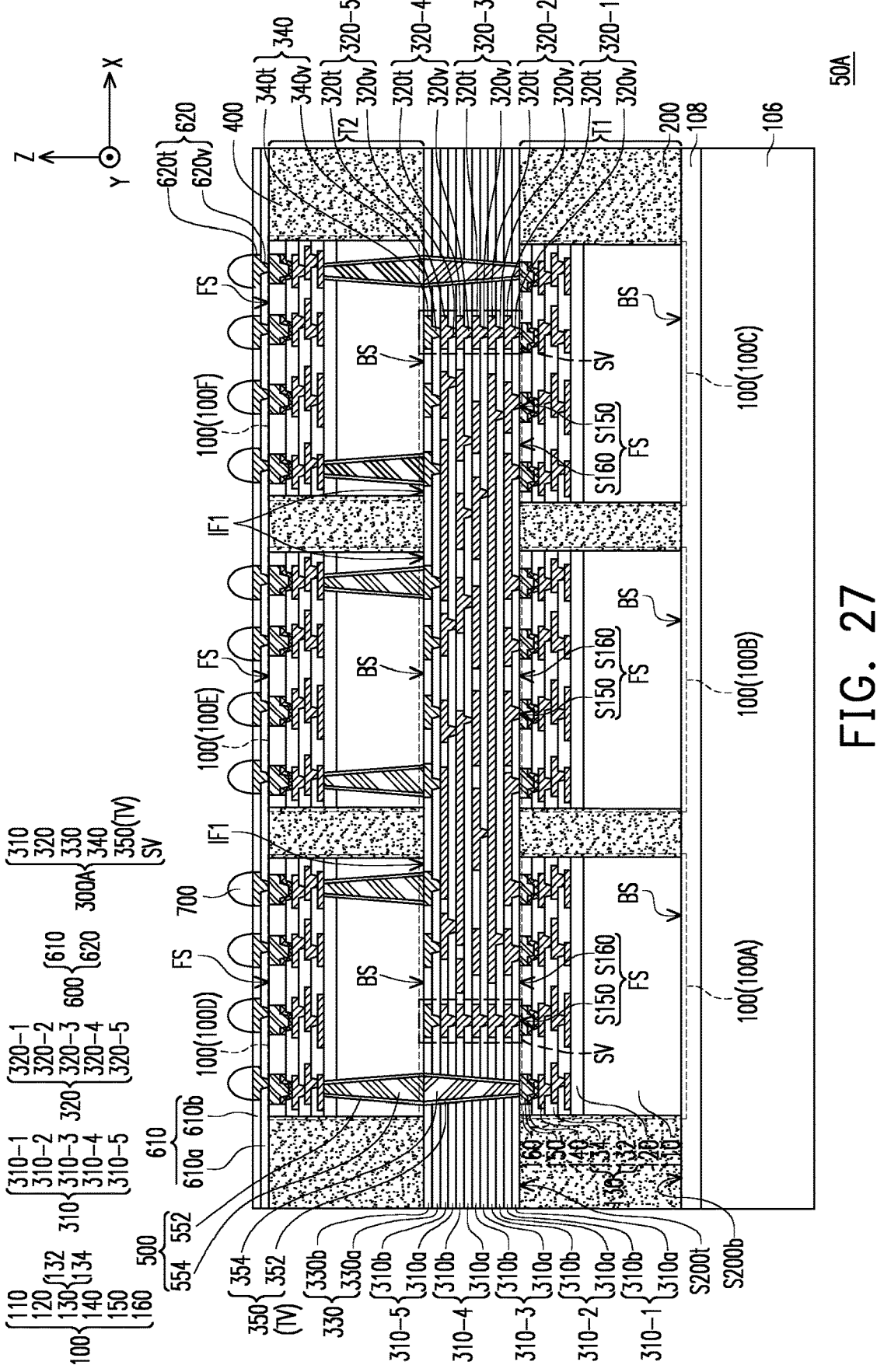
FIG. 27 is a schematic cross-sectional view of a semiconductor structure in accordance with alternative embodiments of the disclosure.

The embodiments of the semiconductor structures 10B-10D, 20A-20D, 30A-30D, 40A-40D, and/or modifications thereof as discussed above, the semiconductor dies 100 (including the semiconductor dies 100D, 100E, and 100F) of the second tier T2 are bonded to the semiconductor dies 100 (including the semiconductor dies 100A, 100B, and 100C) of the first tier T1 via a "face-to-face" configuration. However, the disclosure is not limited thereto; alternatively, the semiconductor dies 100 (including the semiconductor dies 100D, 100E, and 100F) of the second tier T2 may be bonded to the semiconductor dies 100 (including the semiconductor dies 100A, 100B, and 100C) of the first tier T1 via a "back-to-face" configuration, see FIG. 27. FIG. 27 is a schematic cross-sectional view of a semiconductor structure 50A in accordance with alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIG. 8 and FIG. 27 together, the semiconductor structure 10A depicted in FIG. 8 and the semiconductor structure 50A depicted in FIG. 27 are similar; the difference is that, the through vias 500 are pre-fabricated in and considered as part of the semiconductor dies 100D, 100E, and 100F, and the semiconductor dies 100D, 100E, and 100F are faced upwards and picked and placed over the redistribution circuit structure 300A (in the process step of FIG. 6). In such embodiment, the bottom surfaces BS of the semiconductor dies 100 included in the second tier T2, which accessibly reveal surfaces of the through vias 500, are disposed on (e.g., in physical contact with) the redistribution circuit structure 300A. In some embodiments, the semiconductor dies 100D, 100E, and 100F are bonded to the redistribution circuit structure 300A by SoIC bonding (similar to FIG. 13A), where a bonding interface IF1 between the semiconductor dies 100 (e.g., the semiconductor dies 100D, 100E, 100F) of the second tier T2 and the redistribution circuit structure 300A includes a dielectric-to-dielectric bonding interface (e.g., an oxide-to-oxide bonding interface, a nitride-to-nitride bonding interface, or an oxide-to-nitride bonding interface) and a metal-to-metal interface (e.g., a copper-to-copper bonding interface). In the disclosure, the bonding interface IF1 may be referred to as a hybrid bonding interface. As illustrated in FIG. 27, for example, the semiconductor dies 100 (e.g., the semiconductor dies 100D, 100E, 100F) of the second tier T2 are electrically connected to the redistribution circuit structure 300A through the through vias 500. In the case, the semiconductor dies 100 (e.g., the semiconductor dies 100D, 100E, 100F) of the second tier T2 are electrically connected to the bonding structure 600 through the connecting vias 150 accessibly revealed by the front surfaces FS of the semiconductor dies 100 included in the second tier T2, so to electrically couple to the conductive terminals 700. As shown in FIG. 27, the bottom surfaces BS of the semiconductor dies 100 included in the second tier T2 face towards the semiconductor dies 100 included in the first tier T1, where the front surfaces FS of the semiconductor dies 100 included in the second tier T2 face away from the semiconductor dies 100 included in the first tier T1. In some alternative embodiments, the semiconductor dies 100D, 100E, and 100F are bonded to the redistribution circuit structure 300A by FC bonding, similar to FIG. 13B.

Although there are only two through vias 500 are shown in each of the semiconductor dies 100 included in the second tier T2, the number of the through vias 500 formed in each of the semiconductor dies 100 included in the second tier T2 may be more than two, depending on the demand and design requirements. The number of the through vias 500 may be more than two. For example, in the cross-sectional view of the semiconductor structure 50A depicted FIG. 27, the through vias 500 of each of the semiconductor dies 100 included in the second tier T2 are physically connected and electrically coupled to the through vias 350 or the connecting layer 340, respectively. On the other hand, in another cross-sectional view (not shown) of the semiconductor structure 50A, other through vias 500 of each of the semiconductor dies 100 included in the second tier T2 are physically connected and electrically coupled to the through vias 350, the stacked vias SV or the connecting layer 340, respectively. That is, in the disclosure, each of the semiconductor dies 100 included in the second tier T2 may include a through via(s) 500 electrically coupled to one of the through vias 350, a through via(s) 500 electrically coupled to one of the stacked vias SV, a through via(s) 500 electrically coupled to the connecting layer 340, or combinations thereof, as needed.

In the disclosure, such bonding configuration (e.g., the "back-to-face" configuration depicted in FIG. 27) can also be adopted to the semiconductor structures 10B-10D, 20A-20D, 30A-30D, 40A-40D, and/or modifications thereof as discussed above. The disclosure is not specifically limited thereto.

In accordance with some embodiments, a semiconductor structure includes a first tier, a redistribution circuit structure, and a second tier. The first tier includes at least one first die. The redistribution circuit structure is disposed on the first tier and electrically coupled to the at least one first die, where the redistribution circuit structure has a multi-layer structure and includes a vertical connection structure continuously extending from a first side of the redistribution circuit structure to a second side of the redistribution circuit structure, and the first side is opposite to the second side along a stacking direction of the first tier and the redistribution circuit structure. The second tier includes a plurality of second dies, and is disposed on and electrically coupled to the redistribution circuit structure. The redistribution circuit structure is disposed between the first tier and the second tier, where the at least one first die is electrically connected to and electrically communicated with the plurality of second dies through the redistribution circuit structure, and the plurality of second dies are electrically connected to and electrically communicated with each other through the redistribution circuit structure.

In accordance with some embodiments, a semiconductor structure includes a redistribution circuit structure, a plurality of first dies, a first insulating encapsulation, a plurality of second dies, a second insulating encapsulation, and a bonding structure. The redistribution circuit structure includes a plurality of dielectric layers, a plurality of horizontal connection structures, and a plurality of vertical connection structures. The plurality of horizontal connection structures are arranged alternatively with the plurality of dielectric layers, where the plurality of horizontal connection structures are electrically coupled to each other. The plurality of vertical connection structures penetrate through the plurality dielectric layers and are next to the plurality of horizontal connection structures. The plurality of first dies are disposed over a first side of the redistribution circuit structure and each include a plurality of first connecting vias, where the plurality of first dies are electrically coupled to the redistribution circuit structure through the plurality of first connecting vias. The first insulating encapsulation laterally encapsulates the plurality of first dies. The plurality of second dies are disposed over a second side the redistribution circuit structure and each include a plurality of second connecting vias and a plurality of through vias, where the plurality of second dies are electrically coupled to the redistribution circuit structure through the plurality of second connecting vias, and the first side is opposite to the second side. The second insulating encapsulation laterally encapsulates the plurality of second dies. The bonding structure is disposed on the second insulating encapsulation and electrically coupled to the plurality of second dies through the plurality of through vias, where the second insulating encapsulation is disposed between the redistribution circuit structure and the bonding structure, and the redistribution circuit structure is disposed between the first insulating encapsulation and the second insulating encapsulation.

In accordance with some embodiments, a method of manufacturing a semiconductor structure includes the following steps: providing a first tier, a first tier comprising at least one first die; forming a redistribution circuit structure, the redistribution circuit structure being over the first tier and electrically coupled to the at least one first die, wherein the redistribution circuit structure has a multi-layer structure and comprises a vertical connection structure continuously extending from a first side of the redistribution circuit structure to a second side of the redistribution circuit structure, the first side is opposite to the second side along a stacking direction of the first tier and the redistribution circuit structure; and providing a second tier comprising a plurality of second dies, the second tier being over and electrically coupled to the redistribution circuit structure, the redistribution circuit structure being disposed between the first tier and the second tier, wherein the at least one first die is electrically connected to and electrically communicated with the plurality of second dies through the redistribution circuit structure, and the plurality of second dies are electrically connected to and electrically communicated with each other through the redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
a first tier, comprising at least one first die;
a redistribution circuit structure, disposed on the first tier and electrically coupled to the at least one first die, wherein the redistribution circuit structure has a multi-layer structure and comprises a vertical connection structure continuously extending from a first side of the redistribution circuit structure to a second side of the redistribution circuit structure, and the first side is opposite to the second side along a stacking direction of the first tier and the redistribution circuit structure, wherein in a cross section of the semiconductor structure along the stacking direction, the vertical connection structure has a single central line penetrating therethrough; and
a second tier, comprising a plurality of second dies, disposed on and electrically coupled to the redistribution circuit structure, wherein the redistribution circuit structure is disposed between the first tier and the second tier, wherein the at least one first die is electrically connected to and electrically communicated with the plurality of second dies through the redistribution circuit structure, and the plurality of second dies are electrically connected to and electrically communicated with each other through the redistribution circuit structure.

2. The semiconductor structure of claim 1, further comprising:
a bonding structure, disposed on the second tier and electrically connected to the plurality of second dies, wherein the second tier is disposed between and electrically couples the redistribution circuit structure and the bonding structure; and
a plurality of conductive terminals, disposed on and electrically connected to the bonding structure, wherein the bonding structure is disposed between the plurality of conductive terminals and the second tier, and the plurality of conductive terminals are electrically coupled to the plurality of second dies through the bonding structure.

3. The semiconductor structure of claim 2, wherein the at least one first die comprises a plurality of first dies, wherein the plurality of first dies are electrically connected to and electrically communicated with each other through the redistribution circuit structure, the plurality of first dies are electrically connected to and electrically communicated with the plurality of second dies through the redistribution circuit structure, and the plurality of second dies are electrically connected to and electrically communicated with each other through the redistribution circuit structure.

4. The semiconductor structure of claim 1, further comprising:
a bonding structure, disposed on the first tier and electrically connected to the at least one first die, wherein the first tier is disposed between and electrically couples the redistribution circuit structure and the bonding structure; and
a plurality of conductive terminals, disposed on and electrically connected to the bonding structure, wherein the bonding structure is disposed between the plurality of conductive terminals and the first tier, and the plurality of conductive terminals are electrically coupled to at least one first die through the bonding structure.

5. The semiconductor structure of claim 4, wherein the at least one first die comprises a plurality of first dies, wherein the plurality of first dies are electrically connected to and electrically communicated with each other through the redistribution circuit structure, the plurality of first dies are electrically connected to and electrically communicated with the plurality of second dies through the redistribution circuit structure, and the plurality of second dies are electrically connected to and electrically communicated with each other through the redistribution circuit structure.

6. The semiconductor structure of claim 1, wherein the plurality of second dies each have an active surface and a rear surface opposite to the active surface along the stacking direction,
wherein the active surfaces of the plurality of the second dies are facing towards the at least one first die, and the active surfaces of the plurality of the second dies are closer to the at least one first die than the rear surfaces are.

7. The semiconductor structure of claim 1, wherein the plurality of second dies each have an active surface and a rear surface opposite to the active surface along the stacking direction,
wherein the rear surfaces of the plurality of the second dies are facing towards the at least one first die, and the rear surfaces of the plurality of the second dies are closer to the at least one first die than the active surfaces are.

8. The semiconductor structure of claim 1, wherein the vertical connection structure penetrates through the multi-layer structure and in contact with the first tier and the second tier, and
in the cross section along the stacking direction, a shape of the vertical connection structure comprises a columnar shape with a planar sidewall.

9. The semiconductor structure of claim 1, wherein the vertical connection structure penetrates through the multi-layer structure and in contact with the first tier and the second tier, and
in the cross section along the stacking direction, a shape of the vertical connection structure comprises a columnar shape with a wave-shaped sidewall.

10. A semiconductor structure, comprising:
a redistribution circuit structure, comprising:
a plurality of dielectric layers;
a plurality of horizontal connection structures, arranged alternatively with the plurality of dielectric layers, wherein the plurality of horizontal connection structures are electrically coupled to each other; and
a plurality of vertical connection structures, penetrating through the plurality dielectric layers and next to the plurality of horizontal connection structures;
a plurality of first dies, disposed over a first side of the redistribution circuit structure and each comprising a plurality of first connecting vias, wherein the plurality of first dies are electrically coupled to the redistribution circuit structure through the plurality of first connecting vias;
a first insulating encapsulation, laterally encapsulating the plurality of first dies;
a plurality of second dies, disposed over a second side the redistribution circuit structure and each comprising a plurality of second connecting vias and a plurality of through vias, wherein the plurality of second dies are electrically coupled to the redistribution circuit structure through the plurality of second connecting vias, and the first side is opposite to the second side;
a second insulating encapsulation, laterally encapsulating the plurality of second dies; and a bonding structure, disposed on the second insulating encapsulation and electrically coupled to the plurality of second dies through the plurality of through vias, wherein the second insulating encapsulation is disposed between the redistribution circuit structure and the bonding structure, and the redistribution circuit structure is disposed between the first insulating encapsulation and the second insulating encapsulation.

11. The semiconductor structure of claim 10, the plurality of first dies are bond to and electrically coupled to the redistribution circuit structure by a plurality of joints interposed therebetween.

12. The semiconductor structure of claim 10, the plurality of second dies are bond to and electrically coupled to the redistribution circuit structure by a plurality of joints interposed therebetween.

13. The semiconductor structure of claim 10, wherein each vertical connection structure of a first group of the plurality of the vertical connection structures penetrates a respective one of the plurality of dielectric layer and electrically connects two adjacent horizontal connection structure respectively overlying and underlying the respective one of the plurality of dielectric layer.

14. The semiconductor structure of claim 10, wherein each vertical connection structure of a second group of the plurality of the vertical connection structures penetrates the redistribution circuit structure, and wherein in a cross section along a stacking direction of the first insulating encapsulation and the second insulating encapsulation, a shape of each vertical connection structure of the second group of the plurality of the vertical connection structures comprises a columnar shape with a planar sidewall, or a shape of each vertical connection structure of the third group of the plurality of the vertical connection structures comprises a columnar shape with a wave-shaped sidewall.

15. The semiconductor structure of claim 10, wherein each vertical connection structure of a second group of the plurality of the vertical connection structures penetrates the redistribution circuit structure, and in a cross section along a stacking direction of the first insulating encapsulation and the second insulating encapsulation, a shape of each vertical connection structure of the second group of the plurality of the vertical connection structures comprises a columnar shape with a planar sidewall, and wherein each vertical connection structure of a third group of the plurality of the vertical connection structures penetrates the redistribution circuit structure, and in a cross section along a stacking direction of the first insulating encapsulation and the second insulating encapsulation, a shape of each vertical connection structure of the third group of the plurality of the vertical connection structures comprises a columnar shape with a wave-shaped sidewall.

16. The semiconductor structure of claim 10, wherein the plurality of first dies each have a first front surface exposing the plurality of first connecting vias and a first bottom surface opposite to the first front surface along a stacking direction of the first insulating encapsulation and the second insulating encapsulation, and the plurality of second dies each have a second front surface exposing the plurality of second connecting vias and a second bottom surface opposite to the second front surface along the stacking direction, wherein:

the second front surfaces of the plurality of the second dies are facing towards the plurality of the first dies, and the second front surfaces of the plurality of the second dies are closer to the first front surfaces of the plurality of the first dies than the second bottom surfaces are, or the second bottom surfaces of the plurality of the second dies are facing towards the plurality of the first dies, and the second bottom surfaces of the plurality of the second dies are closer to the first front surfaces of the plurality of the first dies than the second front surfaces are.

17. A method of manufacturing a semiconductor structure, comprising:

providing a first tier, a first tier comprising at least one first die;

forming a redistribution circuit structure, the redistribution circuit structure being over the first tier and electrically coupled to the at least one first die, wherein the redistribution circuit structure has a multi-layer structure and comprises a vertical connection structure continuously extending from a first side of the redistribution circuit structure to a second side of the redistribution circuit structure, the first side is opposite to the second side along a stacking direction of the first tier and the redistribution circuit structure, wherein in a cross section of the semiconductor structure along the stacking direction, the vertical connection structure has a single central line penetrating therethrough; and providing a second tier comprising a plurality of second dies, the second tier being over and electrically coupled to the redistribution circuit structure, the redistribution circuit structure being disposed between the first tier and the second tier, wherein the at least one first die is electrically connected to and electrically communicated with the plurality of second dies through the redistribution circuit structure, and the plurality of second dies are electrically connected to and electrically communicated with each other through the redistribution circuit structure.

18. The method of claim 17, wherein providing the first tier is prior to forming the redistribution circuit structure and providing the second tier, and forming the redistribution circuit structure is prior to the second tier, wherein:

forming the redistribution circuit structure comprises:

forming the multi-layer structure over the first tier; and forming the vertical connection structure in the multi-layer structure, wherein in the cross section along the stacking direction, a shape of the vertical connection structure comprises a columnar shape with a planar sidewall or a columnar shape with a wave-shaped sidewall, providing the second tier comprises:

providing the plurality of second dies over the redistribution circuit structure;

bonding the plurality of second dies to the redistribution circuit structure through a flip-chip bonding process or a bonding process of a metal-to-metal bonding and a dielectric-to-dielectric bonding; and laterally encapsulating the plurality of second dies in an insulating encapsulation.

19. The method of claim 17, wherein providing the second tier is prior to forming the redistribution circuit structure and providing the first tier, and forming the redistribution circuit structure is prior to providing the first tier, wherein:

forming the redistribution circuit structure comprises:

forming the multi-layer structure over the second tier; and forming the vertical connection structure in the multi-layer structure, wherein in the cross section along the stacking direction, a shape of the vertical connection structure comprises a columnar shape with a planar sidewall or a columnar shape with a wave-shaped sidewall, providing the first tier comprises:

providing the at least one first die over the redistribution circuit structure;

bonding the at least one first die to the redistribution circuit structure through a flip-chip bonding process or a bonding process of a metal-to-metal bonding and a dielectric-to-dielectric bonding; and laterally encapsulating the at least one first die in an insulating encapsulation.

20. The method of claim 17, wherein forming the redistribution circuit structure is prior to providing the first tier and providing the second tier, wherein:

forming the redistribution circuit structure comprises:

forming the multi-layer structure; and forming the vertical connection structure in the multi-layer structure, wherein in the cross section along the stacking direction, a shape of the vertical connection structure comprises a columnar shape with a planar sidewall or a columnar shape with a wave-shaped sidewall, providing the first tier comprises:

providing the at least one first die over a first surface of the redistribution circuit structure;

bonding the at least one first die to the redistribution circuit structure through a flip-chip bonding process or a bonding process of a metal-to-metal bonding and a dielectric-to-dielectric bonding; and laterally encapsulating the at least one first die in an insulating encapsulation, and providing the second tier comprises:

providing the plurality of second dies over a second surface of the redistribution circuit structure, the second surface being opposite to the first surface along the stacking direction;

bonding the plurality of second dies to the redistribution circuit structure through a flip-chip bonding process or a bonding process of a metal-to-metal bonding and a dielectric-to-dielectric bonding; and laterally encapsulating the plurality of second dies in an insulating encapsulation.

* * * * *